United States Patent [19]
Nitta et al.

[11] Patent Number: 5,521,754
[45] Date of Patent: May 28, 1996

[54] OPTICAL APPARATUS AND A METHOD USING THE APPARATUS, WHICH UTILIZES THE OCCURRENCE OF A CHANGE IN A BOTH-END VOLTAGE OF AN AMPLIFYING REGION

[75] Inventors: Jun Nitta, Sagamihara; Kenji Nakamura, Atsugi, both of Japan

[73] Assignee: Canon Kabushiki Kaisha, Tokyo, Japan

[21] Appl. No.: 514,445

[22] Filed: Aug. 11, 1995

Related U.S. Application Data

[63] Continuation of Ser. No. 34,745, Mar. 19, 1993, abandoned.

[30] Foreign Application Priority Data

Mar. 23, 1992 [JP] Japan .................................. 4-095785
Apr. 21, 1992 [JP] Japan .................................. 4-128151

[51] Int. Cl.⁶ .................................................. H01S 3/18
[52] U.S. Cl. ............................................. 359/344; 372/43
[58] Field of Search ................................. 359/344; 372/43, 372/45; 385/16; 257/86

[56] References Cited

U.S. PATENT DOCUMENTS

| | | | |
|---|---|---|---|
| 4,794,346 | 12/1988 | Miller | 359/344 |
| 4,812,776 | 3/1989 | Sasaki | 359/344 |
| 5,196,958 | 3/1993 | Verbeek et al. | 359/344 |

FOREIGN PATENT DOCUMENTS

| | | |
|---|---|---|
| 0356302 | 8/1989 | European Pat. Off. . |
| 0377948 | 7/1990 | European Pat. Off. . |
| 0414333 | 2/1991 | European Pat. Off. . |
| 0417989 | 3/1991 | European Pat. Off. . |
| 0466144 | 1/1992 | European Pat. Off. . |
| 56-6492 | 1/1981 | Japan . |
| 60-86885 | 5/1985 | Japan . |
| 3-58034 | 3/1991 | Japan . |
| 4-80985 | 3/1992 | Japan . |

OTHER PUBLICATIONS

R. M. Fortenberry, A. J. Lowery and R. S. Tucker; "Up to 16 dB Improvement in Detected Voltage Using Two–Section Semiconductor Optical Amplifier Detector"; vol. 28, Feb. 27, 1992; pp. 474–476.

Y. Nakaon, Y. Hasyashi, N. Chen, Y. Sakaguchi, and K. Tada; "Fabrication and Characteristics of an Integrated DFB Laser/Amplifier Having Reactive–Ion–Etched Titled End Facets"; vol. 29, No. 12, Part 2, Dec. 29, 1990; Tokyo, Japan; pp. L2430–L2433.

M. Gustavsson, A. Karlsson, and L. Thylen; "Traveling Wave Semiconductor Laser Amplifier Detectors"; vol. 8, No. 4; Apr. 1990; pp. 610–617.

T. Odagawa, T. Sanada, and S. Yamakoshi. All Optical Flip–Flop Operation of Bistable Laser Diode, Extended Abstracts of the 20th (1988 International) Conference on Solid State Devices and Materials, Tokyo, 1988, pp. 331–334.

Katsuaki Magari, Hitshi Kawaguchi, Kunishige Oe, Yoshinori Nakano, and Mitsuo Fukuda. Optical Signal Selection with a Constant Gain and a Gain Bandwidth by a Multielectrode Distributed Feedback Laser Amplifier, 320 Applied Physics Letters, 51 (1987) 14 Dec., No. 24, New York, NY, USA, pp. 1974–1976.

(List continued on next page.)

*Primary Examiner*—Mark Hellner
*Attorney, Agent, or Firm*—Fitzpatrick, Cella, Harper & Scinto

[57] ABSTRACT

In an optical apparatus, such as a semiconductor optical amplifier device and an optical filtering apparatus, there are provided an optical amplifier device, a detector and a controller. The optical amplifier device has such a structure that exhibits a both-end voltage change at an optical amplification time of an input light. The detector detects the both-end voltage change, and the controller performs a predetermined control of a portion other than the optical amplifier device, such as another optical amplifier portion and a tunable band pass filler portion.

59 Claims, 42 Drawing Sheets

OTHER PUBLICATIONS

Katsumi Emura, Makoto Shibutani, Iljunn Cha, Mitsuhiro Kitamura, and Shuntaro Yamazaki. Coherent Optical Tapping Using Semiconductor Optical Amplifier, 8342 IEEE Photonics Technology Letters, 2(1990)Aug., No. 8, New York, US, pp. 565–567.

Numai, "Progress in Semiconductor Tunable Wavelength Filters", Electronics Information Communication Academy Journal, vol. J73, No. 5, pp. 347 through 353, May 1990.

Numai, "Progress in Semiconductor Tunable Wavelength Filters," NEC Opto–Electronics Research Laboratories, vol. J73–C–I, No. 5, pp. 347–353.

| WAVELENGTH | LESS THAN 835nm | 835-845 | 845-850 | 850-860 | MORE THAN 860nm |
|---|---|---|---|---|---|
| VD1 | + | − | 0 | 0 | 0 |
| VD2 | + | + | + | − | 0 |

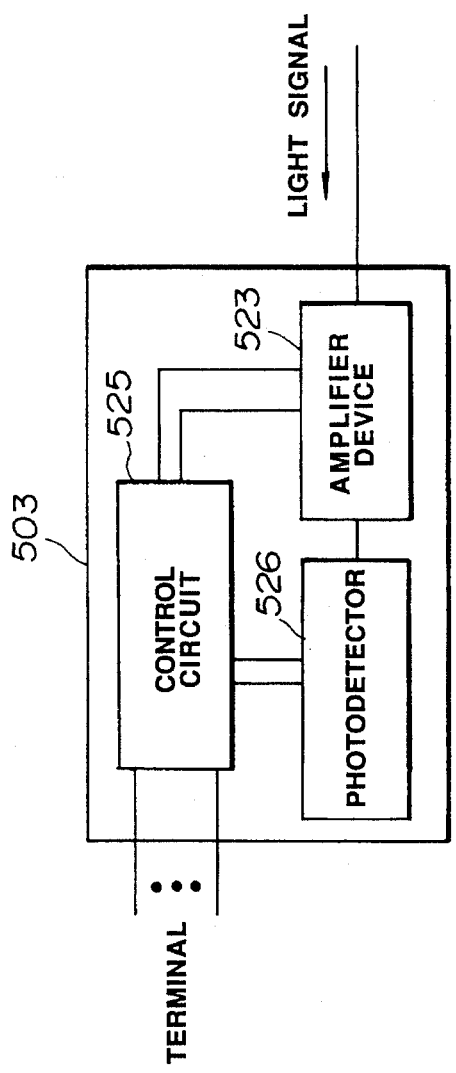
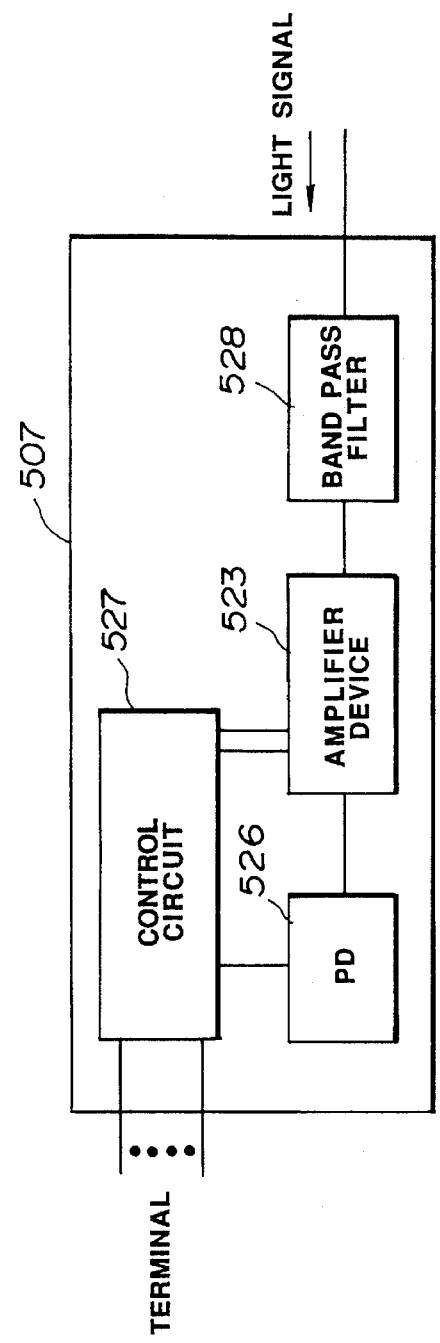

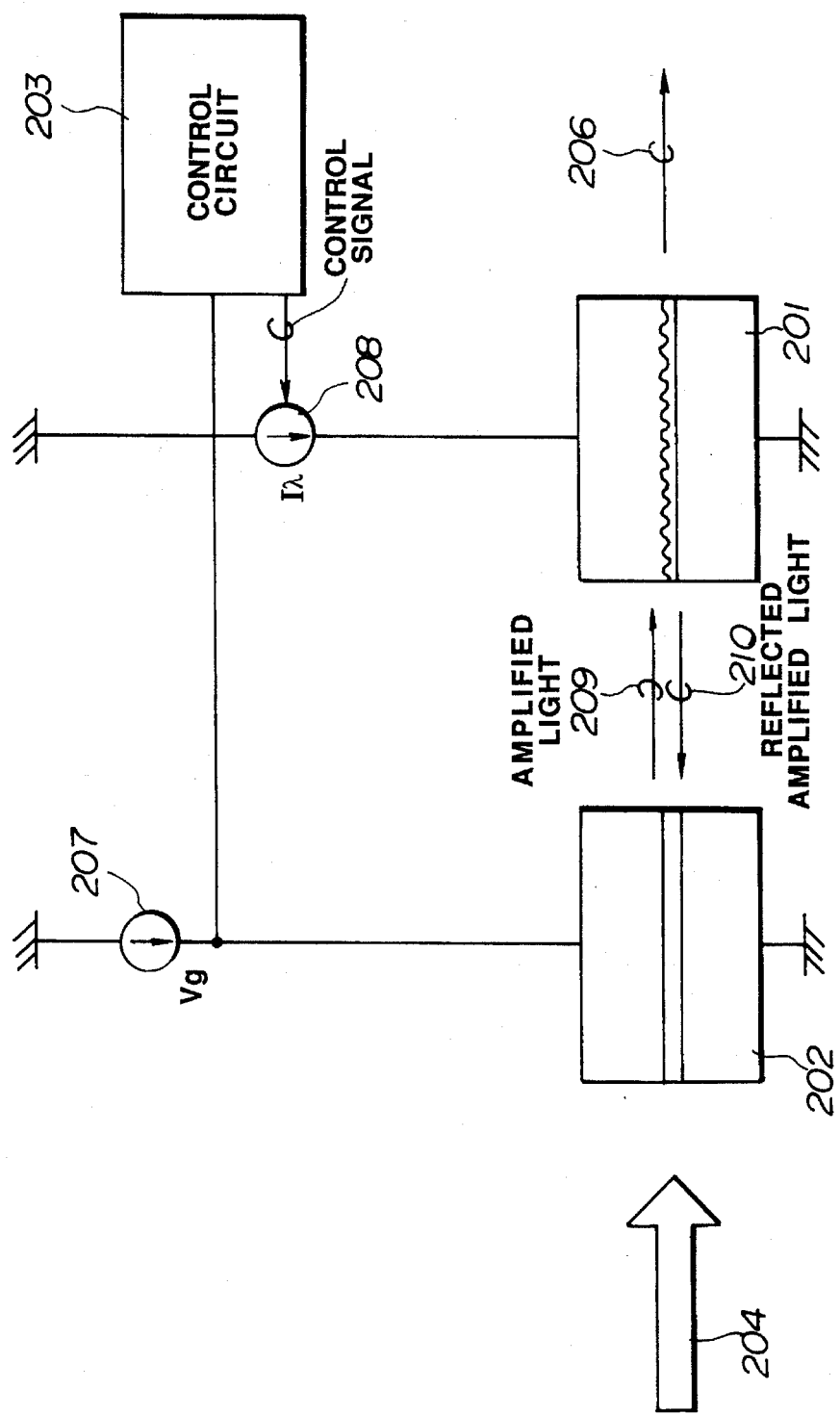

OPTICAL APPARATUS AND A METHOD USING THE APPARATUS, WHICH UTILIZES THE OCCURRENCE OF A CHANGE IN A BOTH-END VOLTAGE OF AN AMPLIFYING REGION

This application is a continuation of application Ser. No. 08/034,745 filed Mar. 19, 1993 now abandoned.

BACKGROUND OF THE INVENTION

1. Field of the Invention

The present invention relates to optical apparatuses and methods of using the apparatuses. Particularly, the present invention relates to an optical semiconductor amplifier device, which is capable of detecting whether light at a specific wavelength is amplified or not by monitoring the change in both-end voltage of a semiconductor laser structure, and a method of using this optical amplifier device. The present invention also relates to an optical semiconductor amplifier device, which utilizes the change in a voltage applied to a semiconductor laser structure caused by an incoming signal light in a constant current operative state, and a method of using this amplifier device. The present invention further relates to an optical semiconductor amplifier device which includes a plurality of optical amplifying regions and in which at least one of the amplifying regions is a region for detecting the change in a voltage applied thereto at the time of optical amplification, and a method of using this amplifier device. Yet another aspect of the present invention relates to a tunable filtering device which is capable of changing a filtering wavelength based on a detection result of the change in a voltage applied to a semiconductor laser structure and a method of using this tunable filtering device.

2. Related Background Art

Conventionally, when a light is amplified by an optical semiconductor amplifier device, in order to detect in which wavelength range the wavelength of the light lies, a part of an incoming light prior to the incidence onto the optical semiconductor amplifier device, or a part of an amplified light, is split and the split light is input into a detector portion which includes a wavelength detecting means for detecting the split light's wavelength.

Further, in order to perform an automatic power control (APC) amplification of the optical semiconductor amplifier device, there has been conventionally presented a system in which the change a voltage occurring in the optical amplifier device at the time of amplification of a signal light is utilized.

FIG. 1 shows such a system. In FIG. 1, reference numeral 601 designates an incoming light reference numeral 602 designates an optical semiconductor amplifier device, reference numeral 603 designates an emerging light, reference numeral 604 designates a control circuit. reference numeral 605 designates a current source and reference numeral 606 designates a bias T. The incoming signal light 601 is a digital signal, and a sinusoidal wave signal whose period is sufficiently lower than the transmission rate of the digital signal is overlapped or superposed on the digital signal. Due to this superposition, the change in the applied voltage occurring when the light signal 601 is amplified by the optical amplifier device 602 is supplied to the control circuit 604 by the bias T 606, and a control signal is supplied to the current source 605 so that the amount of the voltage change, synchronized with the frequency of the superposed sinusoidal wave, is maintained at a constant value. Thus, the APC amplification operation is achieved by changing the bias current injected into the optical amplifier device 602 from the current source 605.

In the above-discussed prior art detecting apparatus of the amplified wavelength, optical or light loss accompanies the splitting of a part of the signal light, and an optical component for light splitting is inevitably needed.

Further, the above-mentioned prior art, APC amplification operation entails the following disadvantages:

When the incoming signal light travels through the optical semiconductor amplifier device, the light signal is amplified due to the stimulated emission due to population inversion created by the current injection, to be emitted as the emerging light 603. The amplification operation is the phenomenon that accompanies the carrier recombination in an active layer or region of the optical semiconductor amplifier device. Therefore, at the time of an amplification operation, the carrier density in the active layer becomes small, compared with a non-amplification time, and the voltage produced between both opposite junction ends or the both-end voltage of the device is decreased. The amount of the voltage change grows larger as the incoming light increases and as the amplification factor increases. In the prior art structure wherein the current injection is conducted solely through two opposed electrodes and the voltage change is also detected thereby, the following drawbacks occur:

First, since the incoming light 601 is amplified and increased as this light travels through the optical amplifier device 602, the voltage change is gradually increased along a light propagation direction, and hence the amount of the voltage change is detected only in a form of its averaged value.

Second, a current flows in the light propagation direction since a voltage gradient appears in this direction, and hence the amplification factor of the entire device is lowered.

Third, since a portion for detecting the voltage change is common to a portion for adjusting the amplification factor, the above control is difficult to achieve.

Further, in a wavelength division multiplexing (WDM) optical communication system, a portion that has a wavelength selection function for selecting a light at one wavelength from lights of a plurality of wavelengths is required to be disposed in a receiver of the communication system. FIG. 2 shows an example of a WDM optical communication system. In FIG. 2, a uni-directional N to M transmission of the WDM optical communication is shown. In FIG. 2, reference numerals 700-1 through 700-N designate optical transmitters, reference numeral 701 designates a light combining device, reference numeral 702 designates an optical fiber transmission line, reference numeral 703 designates an optical branching device and reference numerals 704-1 through 704-M designate optical receivers.

In the structure of such WDM communication, when the transmission is conducted from the transmitter 700-1 to the receivers 704-J and 704-K, the receivers 704-J and 704-K are required to be capable of receiving the same wavelength. In order to achieve this operation, the wavelength selection function portion of the receivers 704-1 through 704-M is composed of, for example, an optical demultiplexer and photodetectors for respectively receiving demultiplexed lights, and the output of one photodetector is used according to the need (see FIG. 3). In the alternative, there is arranged a tunable band pass filter that is capable of changing its transmission wavelength range according to a signal from outside, and a part of the output of this band pass filter is split. The split light signal is input into an apparatus having a wavelength-detection function, and the tunable band pass filter is controlled by the output of this wavelength detecting apparatus (see FIG. 4).

Further, in another method, an incoming signal light is branched into a plurality of portions, and the split light portions are respectively received by wavelength-fixed type band pass filters and photodetectors to achieve the same performance.

FIG. 3 shows an example of wavelength selection means which includes the above-mentioned optical demultiplexer. In FIG. 3, reference numeral 801 designates an optical demultiplexer, reference numerals 802-1 through 802-N designate photodetectors, and reference numeral 803 designates a control apparatus for selecting one of the outputs of the photodetectors 802-1 to 802-N and supplying an electric signal 805 to a terminal equipment. Reference numeral 804 designates a light signal to be input into the optical receiver 704-I.

FIG. 4 shows an optical receiver 704-I that includes the above-mentioned tunable band pass filter, and FIG. 5 shows a wavelength selection portion 901 that is contained in the receiver 704 of FIG. 4. In FIG. 4, reference numeral 901 designates a wavelength selection (WS) portion as shown in FIG. 5. In FIG. 4, reference numeral 902 designates a photodetector, reference numeral 903 designates a controller, reference numeral 904 designates a light signal, reference numeral 906 designates a control signal for determining the transmission wavelength of the WS portion 901 and reference numeral 905 designates an electric signal to be supplied to the terminal equipment. Turning to FIG. 5, reference numeral 1001 designates a tunable band pass filter whose transmission wavelength range is changeable by a signal from outside. Reference numeral 1002 designates a light branching device, and reference numeral 1004 designates a photodetector. Reference numeral 1003 designates a controller for supplying a control signal to the tunable band pass filter 1001 based on the output signal from the photodetector 1004 and the control signal 906 from outside. In this structure, since it is impossible to directly know the wavelength, a method is needed in which the transmission wavelength range of the tunable band pass filter 1001 is scanned over a predetermined range and the wavelengths corresponding to the wavelength multiplexed signals are identified. In this case, the order of the signals having respective wavelengths are given beforehand. In such a method, it is necessary, for example, to always transmit the wavelength multiplexed signals of all wavelengths even at the time of non-signal. Under those circumstances, the outputs of the photodetector 1004 corresponding to the respective wavelengths are obtained by scanning the transmission wavelength of the band pass filter 1001 from a shorter wavelength side to a longer wavelength side. If information of how many wavelengths are multiplexed in the signals is given, one light signal of the wavelength multiplexed light signals can be taken out.

In those prior art apparatuses, the light output from the band pass filter is branched and the wavelength of its split light is detected in order to select light of a predetermined wavelength from signals of a plurality of wavelengths by controlling the transmission wavelength of the band pass filter based on the detection result. Also, there are arranged a plurality of wavelength-fixed band pass filters whose transmission wavelengths are set beforehand and photodetectors that are disposed behind the respective band pass filters, thereby achieving the wavelength selection function by electric selection.

However, the following drawbacks exist:

First, in the former case, the light signal intensity input into the photodetector is decreased since the light is split behind the band pass filter.

Second, in the latter case, the numbers of band pass filters and photodetectors necessarily amount to the number of wavelength multiplicity, and the number of components constructing the receiver increases as the wavelength multiplicity increases.

Further, in the case of the wavelength selecting means containing the optical demultiplexer of FIG. 3, the number of the needed photodetectors amounts to the number of wavelength multiplicity, and thus the same drawback as the above-mentioned latter case occurs.

SUMMARY OF THE INVENTION

It is a first object of the present invention to provide an optical apparatus which includes an optical amplifying device having such a structure that exhibits a both-end voltage change at an optical amplification time, a detector for detecting the both-end voltage change and a controller for performing a predetermined control of a portion other than the optical amplifying device, based on the both-end voltage change detected by the detector.

It is a second object of the present invention to provide a semiconductor optical amplifier device which includes a semiconductor laser structure, and a plurality of amplifying regions formed in the semiconductor laser structure and arranged in a light propagation direction and in which the amplifying regions are electrically separated from each other, wherein at least one of the amplifying region has a first gain spectrum over a first wavelength range and the other amplifying region is capable of having a second gain spectrum over a second wavelength range that at least partly overlaps the first wavelength range.

It is a third object of the present invention to provide a tunable filtering apparatus which includes a tunable band pass filter that is capable of changing its transmission wavelength based on an external control, an optical amplifier device that has such a structure that exhibits a both-end voltage change at an optical amplification time and a controller for changing the transmission wavelength of the tunable band pass filter based on the both-end voltage change.

It is a fourth object of the present invention to provide optical communication systems and apparatuses to be used in the optical communication systems which include at least one of the optical apparatuses recited in the first to third objects.

According to one aspect of the invention, a semiconductor optical amplifier device comprises a semiconductor laser structure, and a plurality of amplifying regions formed in the semiconductor laser structure and arranged in a light propagation direction, the amplifying regions being electrically separated from each other, wherein at least one of the amplifying regions comprises a first active layer which has a first gain spectrum over a first wavelength range, and wherein another of the amplifying regions comprises a second active layer having a second gain spectrum over a second wavelength range containing the first wavelength range.

According to another aspect, Applicants' invention relates to an optical switch device comprising a semiconductor optical amplifier device comprising a semiconductor laser structure and three amplifying regions formed in the semiconductor laser structure, which are arranged in a light propagation direction the amplifying regions being electrically separated from each other, wherein one of the amplifying regions comprises a first active layer, which has a first gain spectrum over a first wavelength range, and the other two amplifying regions respectively comprises second active layers, which are respectively capable of having second gain spectra over second wavelength ranges, which contain the first wavelength range, and wherein the amplifying region that comprises the first active layer is disposed in a central portion of the amplifier device, and control means for controlling a current injected into the amplifying region that comprises the second active layer and that is disposed at a light output side of the amplifier device, wherein the amount of injected current is based on a both-end voltage change which is dependent on wavelength of an input light incident on the amplifier device and occurs in the amplifying region that comprises the first active layer.

According to another aspect, Applicants' invention relates to an optical switch device comprising a semiconductor optical amplifier comprising a semiconductor laser structure and four amplifying regions formed in the semiconductor laser structure, which are arranged in a light propagation direction, the amplifying regions being electrically separated from each other, wherein two of the amplifying regions respectively comprise first active layers, which have different energy bands and first gain spectra over first wavelength ranges, and the other two amplifying regions respectively comprise second active layers, which are capable of having second gain spectra over second wavelength ranges containing the first wavelength ranges, and wherein one of the amplifying regions including the second active layers is disposed at a light output side of the amplifier device, and control means for control in a current injected into the amplifying region that comprises the second active layer and that is disposed at the light output side of the amplifier device, wherein the amount of injected current is based on both-end voltage changes which are dependent on wavelength of an input light incident on the amplifier device and occur in the amplifying regions that comprise the first active layers.

According to another aspect, Applicants' invention relates to a semiconductor optical amplifier device comprising a semiconductor laser structure, a plurality of amplifier regions formed in the semiconductor laser structure and arranged in a light propagation direction, the amplifying regions being electrically separated from each other, detecting means for detecting a both-end voltage change which occurs in at least one of the amplifying regions at an optical amplification time, and control means for controlling a current injected into at least one other amplifying region, based on the both-end voltage change detected by the detecting means.

Another aspect of Applicants' invention relates to an optical transmitter comprising light emitting means for converting an electric signal to an optical signal, control means for driving the light emitting means based on a signal from a terminal equipment to cause the light emitting means to output the optical signal, and a semiconductor optical amplifier device for amplifying the optical signal from the light emitting means, wherein amplifier device includes those features discussed in the previous paragraph.

Another aspect of Applicants' invention relates to an optical receiver comprising a semiconductor optical amplifier device for amplifying an optical signal, wherein the amplifier device includes those features discussed in the previous two paragraphs. The optical receiver further comprises light detecting means for converting the amplified optical signal to an electric signal, and control means for reproducing the electric signal from the light detecting means to supply a reproduced signal to a terminal equipment.

Another aspect of Applicants' invention relates to an optical amplifying apparatus comprising a semiconductor optical amplifier device for amplifying an optical signal, the amplifier device including those features recited in the previous three paragraphs. The apparatus further comprises a round-tip fiber for performing input and output coupling to the amplifier device.

Another aspect of Applicants' invention relates to a uni-directional optical communication system comprising a transmission line, and an optical transmitter including those features discussed above, wherein the light emitting means is used for converting an electric signal to an optical signal for transmission to the transmission line.

Another aspect of Applicants' invention relates to a uni-directional optical system comprising a transmission line, and an optical receiver, having those features discussed above, wherein the semiconductor optical amplifier device is used for amplifying an optical signal from the transmission line.

Another aspect of Applicants' invention relates to a uni-directional optical communication system comprising a transmission line and an optical amplifying apparatus, as discussed above, wherein a lensed fiber is used for performing input and output coupling between the transmission line and the amplifier device.

Another aspect of Applicants' invention relates to an optical transceiver comprising light emitting means for emitting an optical signal based on an electric signal a first semiconductor optical amplifier device for amplifying the optical signal from the light emitting means, wherein the first amplifier device has those features discussed above. The transceiver further comprises light, detecting means for converting an optical signal to an electric signal, and a second semiconductor optical amplifier device for amplifying the optical signal for inputting into the light detecting means, the second amplifier device also having those features discussed above. The optical transceiver further comprises light branching-combining means disposed between the first and second optical amplifier devices, and driving control means for driving the light emitting means based on a signal from a terminal equipment to cause the light emitting means to output the optical signal and for reproducing the electric signal from the light detecting means to supply a reproduced signal to the terminal equipment.

Another aspect of Applicants' invention relates to a bi-directional optical communication system comprising a transmission line, and an optical amplifying apparatus having those features discussed above. The communication system further comprises a lensed fiber for performing input and output coupling between the transmission line and the amplifier device.

Another aspect of Applicants' invention relates to a bi-directional optical communication system comprising a transmission line, and an optical transceiver for transmitting and receiving an optical signal to and from the transmission line, the transceiver having those features discussed above.

Another aspect of Applicants' invention relates to a uni-directional wavelength division multiplexing optical communication system comprising a transmission line, and a plurality of optical transmitters, each transmitter having those features of the optical transmitter discussed above.

In another aspect, Applicants' invention relates to a uni-directional wavelength division multiplexing optical communication system including those features of the uni-directional optical communication system, with a transmission line and an optical receiver, mentioned above.

In another aspect, Applicants' invention relates to a uni-directional wavelength division multiplexing optical communication system having those features as the uni-directional optical communication system comprising a transmission line and an optical amplifying apparatus discussed above.

In another aspect, Applicants' invention relates to a loop type optical local area network having those features of the uni-directional wavelength division multiplexing optical communication system discussed immediately above.

In another aspect, Applicants' invention relates to a passive bus type optical local area network having those features of the loop-type optical local area network and the uni-directional wavelength division multiplexing optical communication system discussed immediately above.

In another aspect, Applicants' invention relates to a passive bus type optical local area network comprising a transmission line, and an optical transceiver for transmitting and receiving an optical signal to and from the transmission line, the transceiver having those features as the optical transceiver discussed above.

In another aspect, Applicants' invention relates to a loss-compensation type light branching-combining apparatus comprising a light branching-combining device having a plurality of input-output ports, and a semiconductor optical amplifier device, connected to at least one of the input-output ports of the branching-combining device, wherein the amplifier device has those features discussed above.

In another aspect, an optical amplifying apparatus comprises a semiconductor optical amplifier device comprising a semi conductor laser structure, and three amplifying regions formed in the semiconductor laser structure and arranged in a light propagation direction, the amplifying regions being electrically separated from each other, detecting means for detecting both-end voltage changes, which occur in two of the amplifying regions respectively disposed at both opposite end portions of the amplifier device at an optical amplification time, and control means for controlling a current injected into the other amplifying region, based on the both-end voltage changes detected by the detecting means. The amplifying apparatus further comprises light transmission means for carrying an optical signal, coupling means for coupling the light transmission means to the amplifier device, and controlling means for supplying a signal for changing a coupling efficiency of the coupling means to the optical amplifier, based on the both-end voltage changes input from the amplifier device.

In another aspect, Applicants' invention relates to a semiconductor optical amplifier device comprising a semiconductor laser structure, and a plurality of amplifying regions formed in the semiconductor laser structure and arranged in a light propagation direction, the amplifying regions being electrically separated from each other, at least one of the amplifying regions having a first gain spectrum over a first wavelength range and the other amplifying region being capable of having a second gain spectrum over a second wavelength range which at least partly overlaps the first wavelength range.

In another aspect, Applicants' invention relates to a tunable filtering apparatus comprising a tunable bandpass filter, the bandpass filter being capable of changing its transmission wavelength based on an external control, an optical amplifier device, the amplifier device exhibiting a both-end voltage change at an optical amplification time, and control means for changing the transmission wavelength of the tunable bandpass filter based on the both-end voltage change.

In another aspect, Applicants' invention relates to an optical receiver comprising a tunable bandpass filter, the bandpass filter being capable of changing its transmission wavelength based on an external control, an optical amplifier device, the amplifier device exhibiting a both-end voltage change at an optical amplification time, first control means for changing the transmission wavelength of the tunable bandpass filter based on the both-end voltage change, light detecting means for converting an optical signal from the amplifier device to an electric signal, and second control means for reproducing the electric signal from the light detecting means to supply a reproduced signal to a terminal equipment and supplying to the first control means a control signal for controlling the transmission wavelength.

In another aspect, Applicants' invention relates to an optical communication system comprising a transmission line, and an optical receiver for receiving an optical signal from the transmission line, the receiver having those features recited immediately above.

In another aspect, Applicants' invention relates to a wavelength-division multiplexing optical communication system having the features of the optical communication system discussed immediately above.

In yet another aspect, Applicants' invention relates to an optical apparatus comprising optical amplifying means, the amplifying means exhibiting a both-end voltage change at an optical amplification time, detecting means for detecting the both-end voltage change, and a control means for performing a predetermined control of a portion other than the optical amplifying means, based on the both-end voltage change detected by the detecting means.

These advantages and others will be more readily understood in connection with the following detailed description of the preferred embodiments in conjunction with the drawings.

BRIEF DESCRIPTION OF THE DRAWINGS

FIG. 36 is a block diagram of an optical receiver used in a bi-directional optical communication system.

FIG. 37 is a block diagram of an optical receiver used in a bi-directional N to N wavelength division multiplexing optical communication system.

FIG. 46 is a schematic view showing a fifteenth embodiment of the present invention.

DESCRIPTION OF THE PREFERRED EMBODIMENT

First Embodiment

Figure 5:
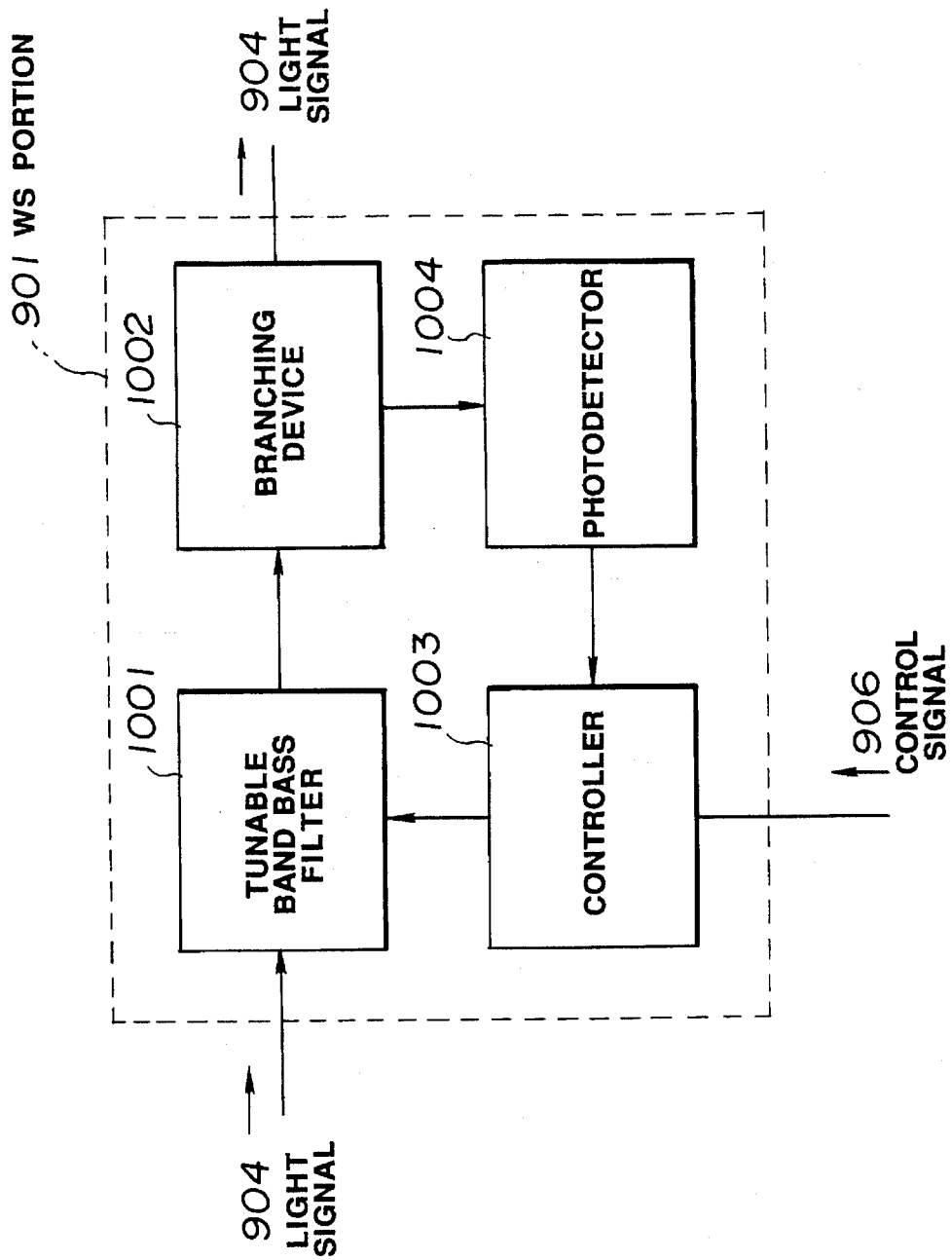
FIG. 5 is a view showing an example of the WS portion of FIG. 4 which includes a tunable band pass filter.
Figure 6:
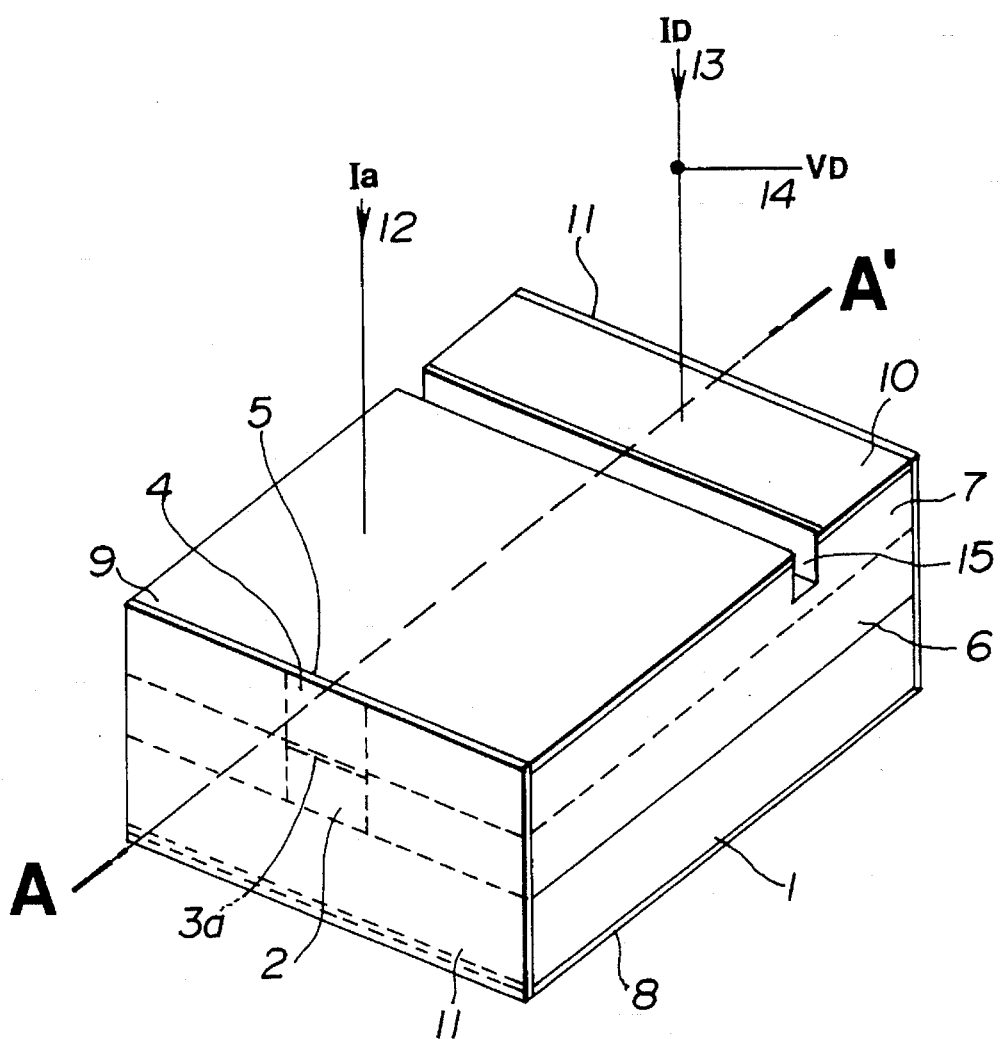
FIG. 6 is a perspective view showing a first embodiment of the present invention.
Figure 7:
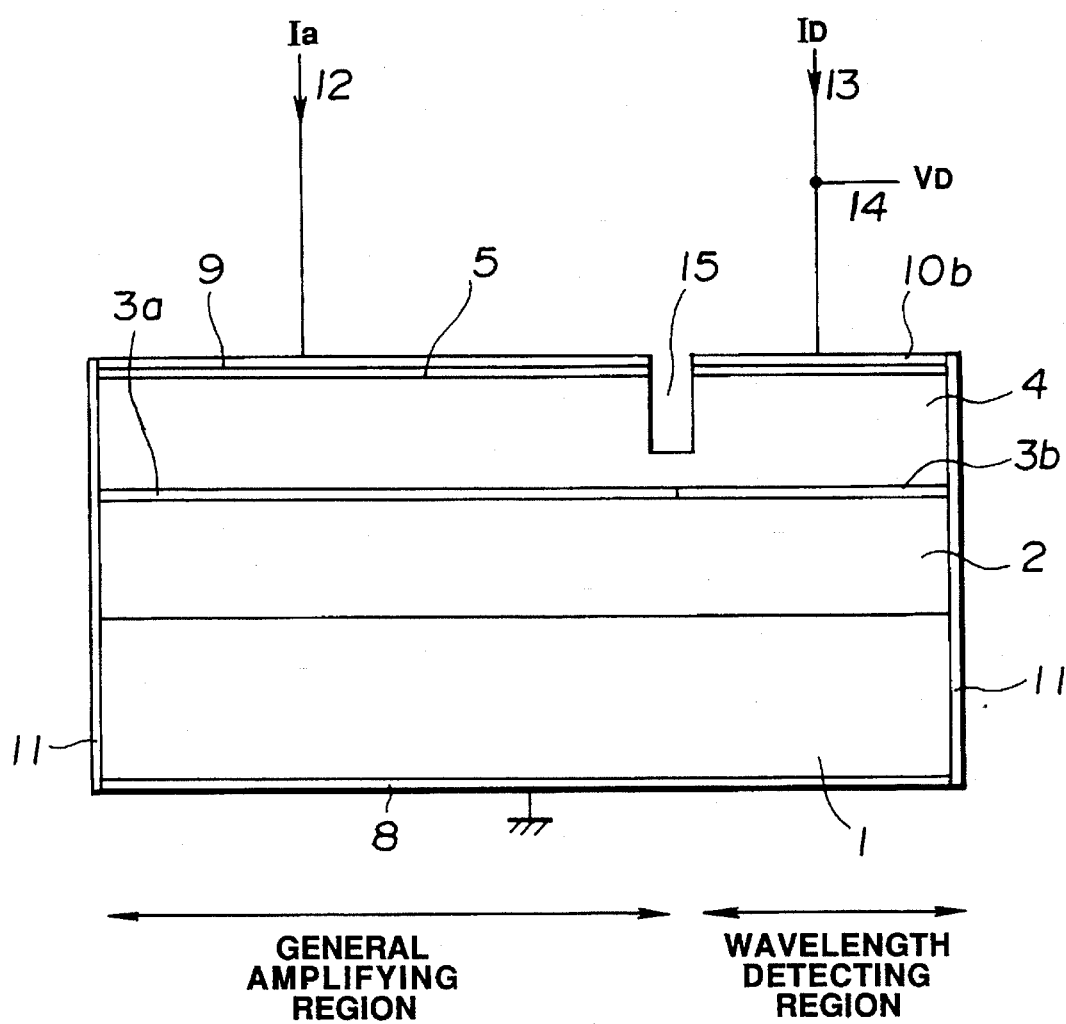
FIG. 7 is an A-A' cross-sectional view of FIG. 6.

FIGS. 5 and 7 show the structure of a first embodiment. FIG. 7 is an A-A' cross-sectional view of FIG. 6. In FIGS. 6 and 7, reference numeral 1 designates a semiconductor substrate of n-type GaAs, and reference numeral 2 designates a first cladding layer of n-type $Al_{0.4}Ga_{0.6}As$. Reference numeral 3a designates a first active layer of undoped $Al_{0.01}Ga_{0.99}As$, and reference numeral 3b (shown solely in FIG. 7) designates a second active layer having a single quantum well structure composed of a well (its thickness is 6 nm) and barrier layers of $Al_{0.3}Ga_{0.7}As$ sandwiching the well. Reference numeral 4 designates a second cladding layer of p-type $Al_{0.4}Ga_{0.6}As$, and reference numeral 5 designates a cap layer of p-type GaAs. Reference numeral 6 designates a first burying layer of p-type $Al_{0.5}Ga_{0.5}As$, and reference numeral 7 designates a second burying layer of n-type $Al_{0.5}Ga_{0.5}As$. Reference numeral 8 designates a first electrode of an alloy of Au and Ge deposited on the substrate 1. Reference numeral 9 designates a second electrode of an alloy of Au and Cr formed above the first active layer 3a.

Reference numeral 10b designates a third electrode of an alloy of Au and Cr formed above the second active layer 3b. Reference numeral 11 designates an antireflection layer formed on the opposite end surfaces (e.g., $ZrO_2$). Reference numeral 12 designates an injection current $I_a$ injected into the first active layer 3a across the first and second electrodes 8 and 9, and reference numeral 13 designates an injection current $I_D$ injected into the second active layer 3b across the first and third electrodes 8 and 10. Reference numeral 14 designates a voltage $V_D$ produced between the third electrode 10b and the first electrode 8 and reference numeral 15 designates a separation groove for electrically separating the first active layer 3a from the second active layer 3b.

In the first embodiment, the first active layer 3a performs optical amplification in a wide wavelength band range, and the second active layer 3b performs optical amplification in a relatively narrow specified wavelength range. The former active region is referred to as a general amplifying region, while the latter active region is referred to as a wavelength detecting region.

The operation of the first embodiment will now be described.

Light is amplified as the light travels in the optical amplifier device of this embodiment. Prior to the initiation of the amplification operation, however, amounts of injection currents injected into the respective regions should be set to obtain a desired characteristic of the device. First, in the general amplifying region, the amount $I_a$ of the injection current is chosen so that the amplification wavelength range includes wavelength detecting region. In the wavelength detecting region, the gain spectral width would be widened if the injection current density thereinto is too much. Therefore, the current $I_D$ is injected into the wavelength detecting region so that the gain spectral width is, for example, 10 nm. Under such conditions, when a light is input into the device through its end surface at the general amplifying region side, the light is amplified as traveling in the general amplifying region, and the light is further amplified in the following wavelength detecting region to be output through the opposite end surface of the device.

Figure 8:
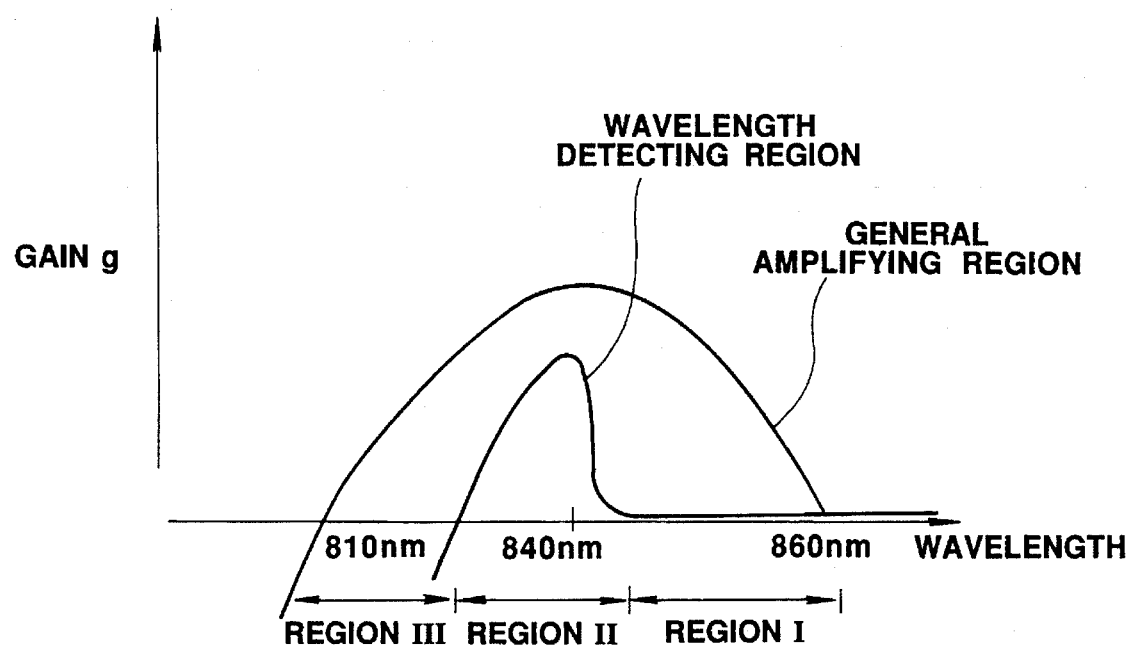
FIG. 8 is a graph showing gain spectra for explaining the operation of a semiconductor optical amplifier device of the first embodiment.

When a constant current operation is effected in the wavelength detecting region, the detection voltage $V_D$ 14 exhibits the following three behaviors depending on the wavelength of the amplified light:

In the case of a wavelength region I shown in FIG. 8 (i.e., the region between band gap wavelengths of the first active layer 3a and the second active layer 3b), the light amplified in the general amplifying region passes through the wavelength detecting region with little interaction, and the light is output from the device. As a result, the voltage $V_D$ 14 remains unchanged.

In the case of a wavelength region II shown in FIG. 8, the light is amplified in the wavelength detecting region as well and being output from the device. Therefore, carriers therein are consumed, and the light functions to decrease the detection voltage $V_D$ because of the constant current operation.

In the case of a wavelength region III shown in FIG. 8, light is absorbed to increase carriers in the wavelength detecting region, and hence the light acts to increase the voltage $V_D$ 14.

Thus, in the first embodiment, a wavelength range to which the wavelength of the amplified light belongs can be known from the voltage change in the wavelength detecting region.

In the above explanation, the light is input at the general amplifying region side, but the same operation is achieved even if the light is input from the opposite side. However, since the voltage change due to carrier consumption in the wavelength detecting region increases as the intensity of light increases, the voltage change can be detected more readily when the light is input from the general amplifying region side.

Figure 9:
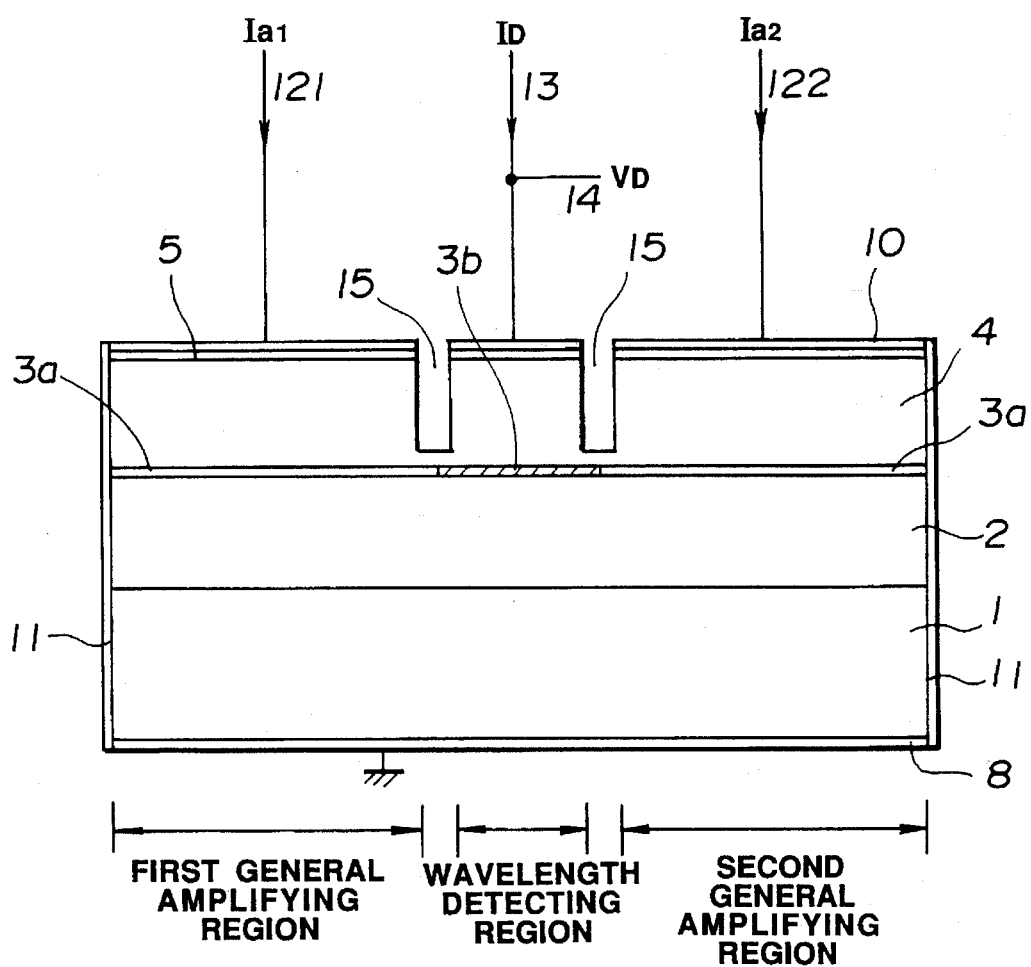
FIG. 9 is a cross-sectional view showing a modification of the first embodiment.

FIG. 9 shows a modification of the first embodiment in which the voltage change is detectable even when a bi-directional light input operation is conducted. In FIG. 9, the same portions as those in FIGS. 6 and 7 are designated by the same reference numerals. In the structure of FIG. 9, the wavelength detecting region is located at a central portion of the optical semiconductor amplifier device, and input light reaches the wavelength detecting region after being amplified by the first or second general amplifying regions into which an injection current $I_{a1}$ 121 or $I_{a2}$ 122 is injected, regardless of the input side of the light. Therefore, the amount of change in the detection voltage can be increased, from whichever side the light enters. The operation principle is the same as the embodiment of FIG. 6.

Further, the structure of the active layer forming the general amplifying region can be common to that forming the wavelength selecting region. In this case, injection current densities of the respective regions are made different from each other so that the same operation can be achieved. Examples of gain spectra of the respective regions ace illustrated in FIG. 10. In this case, there exists no wavelength region I, as illustrated in FIG. 8, and only wavelength regions II (the detection voltage in the wavelength detecting region is lowered) and III (the detection voltage in the wavelength detecting region is increased) exist.

Second Embodiment

Figure 11:
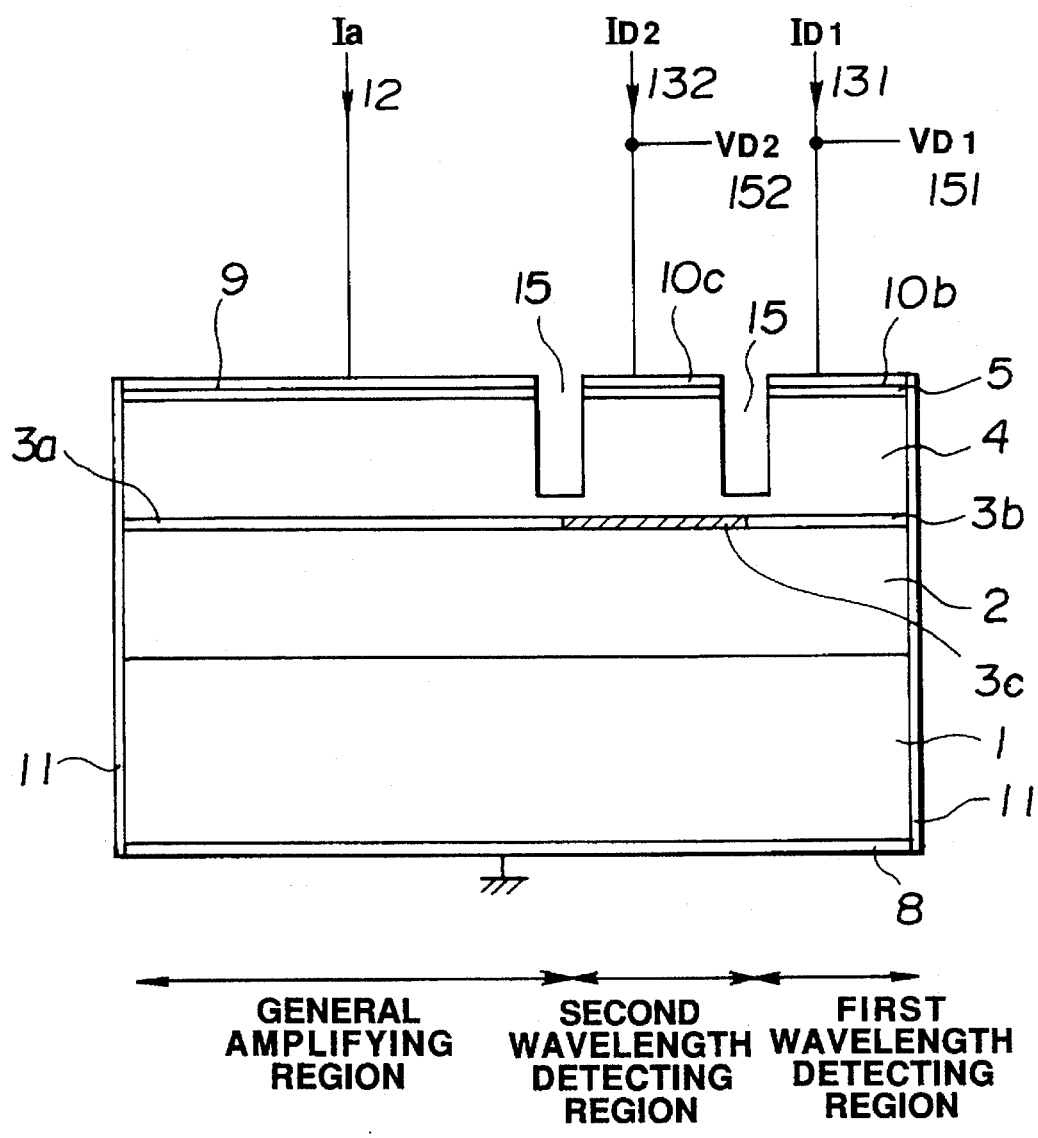
FIG. 11 is a cross-sectional view showing a second embodiment of the present invention.

FIG. 11 shows a second embodiment of the semiconductor optical amplifier device. FIG. 11 corresponds to FIGS. 7 and 9 of the first embodiment. In FIG. 11, the same portions as those in FIGS. 7 and 9 are designated by the same reference numerals. In FIG. 11, reference numeral 3c designates a third active layer that is made up of a GaAs well whose thickness is 5 nm. Reference numerals 10b and 10c respectively designate third and fourth electrodes composed of, for example, alloy of Au and Cr. Reference numerals 131 and 132 respectively designate injection currents $I_{D1}$ and $I_{D2}$ injected into the second and third active layers 3b and 3c, and reference numerals 151 and 152 respectively designate a voltage $V_{D1}$ between first and third electrodes 8 and 10b and a voltage $V_{D2}$ between first and fourth electrodes 8 and 10c. The amplifying area or region including the second active layer 3b will be referred to as a first wavelength detecting region, while the amplifying area including the third active layer 3c will be referred to as a second wavelength detecting region.

Figures 12, 13:
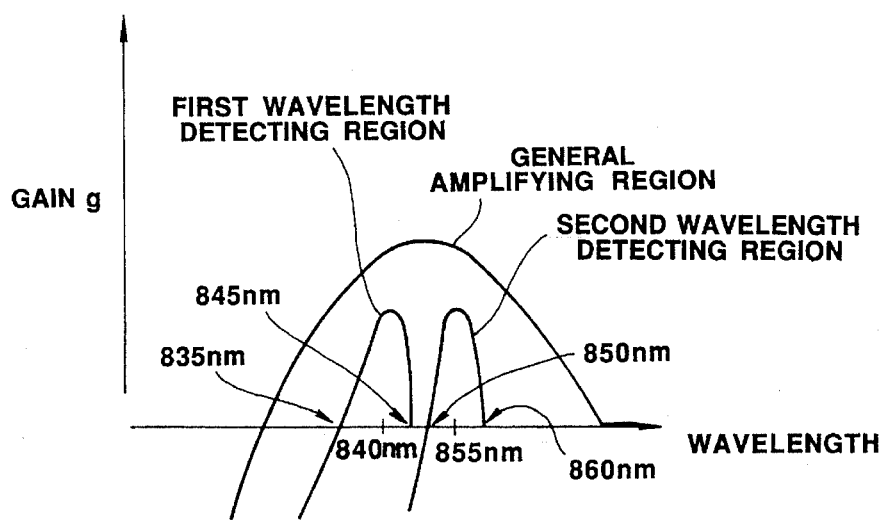
FIG. 12 is a graph showing gain spectra for explaining the operation of a semiconductor optical amplifier device of the second embodiment.
FIG. 13 is a list showing a wavelength dependency of detection voltage of the second embodiment.

The operation principle of the second embodiment is substantially the same as that of the first embodiment. In the second embodiment, the first and second wavelength detecting regions are made up so that they react to different wavelengths. The amounts $I_{D1}$ and $I_{D2}$ of injection currents 131 and 132 injected into the respective wavelength detecting regions are adjusted so that gain spectra of the respective regions are shaped as illustrated in FIG. 12. Center wavelengths of the gain spectra in the first and second wavelength detecting regions are respectively set to 840 nm and 855 nm, and the widths of the gain spectra wherein the gain is positive are respectively set to 10 nm. Further, the general amplifying region of the active layer 3a is fabricated so that its gain spectrum of a positive value extends over a wavelength range including the positive gain ranges of the first and second wavelength detecting regions. Thus, appropriate currents are injected into the respective regions to obtain those gain spectral characteristics, and the optical amplification operation is desirably performed. Depending on the wavelength range of the amplified light, the manner of voltage change alters in the first and second wavelength detecting regions.

FIG. 13 is a table explaining the manner of changes of those voltages $V_{D1}$ and $V_{D2}$ that is dependent on the wavelength of the amplified light. In FIG. 13, a positive symbol (+) indicates a voltage change in an increasing direction, while a negative symbol (−) indicates a voltage change in a decreasing direction. A symbol zero (0) indicates a range wherein almost no voltage change exists. Thus, the wavelength range to which the amplified light belongs can be readily known by detecting the amounts of voltage changes in the both-end voltages $V_{D1}$ 151 and $V_{D2}$ 152 of the first and second wavelength detecting regions.

The second embodiment can be modified as shown in FIG. 9, i.e., the first and second wavelength detecting regions are disposed at a central portion of the optical semiconductor amplifier device, so that a large voltage change can be obtained in whichever direction the light may enter.

In the second embodiment, two wavelength detecting regions are arranged, but more than two wavelength detecting regions having different gain spectra may be formed. In such a case, the wavelength range of the amplified light can be detected more finely.

In the above-discussed embodiments, the wavelength range of the amplified light can be effectively detected if the amplified light has only one wavelength. However, when lights having a plurality of wavelengths are simultaneously amplified in the amplifier device as in the case of optical amplification of wavelength division multiplexed signals, there is a possibility that the voltage changes due to plural signal lights in one wavelength detecting region may cancel each other, depending on the relationship between the wavelength width of gain spectrum in this wavelength detecting range and the wavelength interval of the WDM signals.

In this case, such problem can be solved by narrowing the wavelength width of gain spectrum in the wavelength detecting region. In order to narrow this wavelength width of a positive gain, however, the amount of the injection current injected into the wavelength detecting region has to be reduced, and hence the gain coefficient is entirely lowered. As a result, the amount of change in the detection both-end voltage may become insufficient. However, the wavelength selectivity (i.e., narrowness of wavelength width of the gain spectrum having a positive value) can be improved while maintaining a large voltage change in the both-end voltage, by using an active region, such as a quantum wire, whose state density function is dense in a much narrower wavelength range.

In the above-discussed embodiments, materials of GaAs series are basically used to fabricate the device, but materials of InP series and the like can also be used to make up the same device.

Further, in the above embodiments, the waveguide of a buried-type structure is used For confinement, but any waveguide structure, such as ridge structure, stripe structure, separate confinement hereto-structure (SCH) and GRIN-SCH structure, which has been used in the prior art semiconductor lasers, can be employed.

Figure 10:
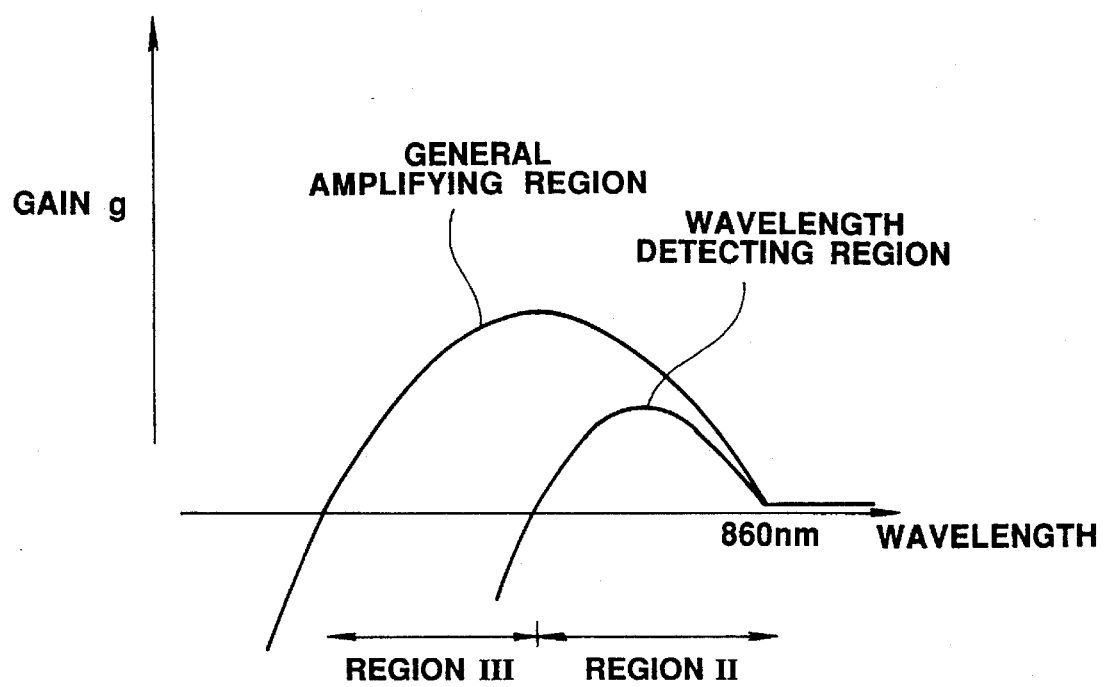
FIG. 10 is a graph showing gain spectra for explaining the operation of a semiconductor optical amplifier device of the modification of the first embodiment.

In the above embodiments, the examples including the bulk active layer and the quantum well active layer are shown except the example of FIG. 10, but the wavelength range in which the detection both-end voltage is decreased or changed can be greatly narrowed if, for example, an active layer of quantum line is used instead of the quantum well active layer.

In the above description, an explanation has been given with regard to the wavelength of the input light. In the case of a digital signal, however, when the digital signal is modulated by a sinusoidal wave signal whose frequency is sufficiently lower than the transmission rate of the digital signal and the both-end voltage change in the wavelength detecting region is detected, a much weaker voltage change can be detected by measuring the voltage change synchronized with this modulation frequency. Such a system has been conventionally utilized in the APC control of optical semiconductor amplifier devices. This APC control will be described in embodiments explained below.

Third Embodiment

Figure 14:
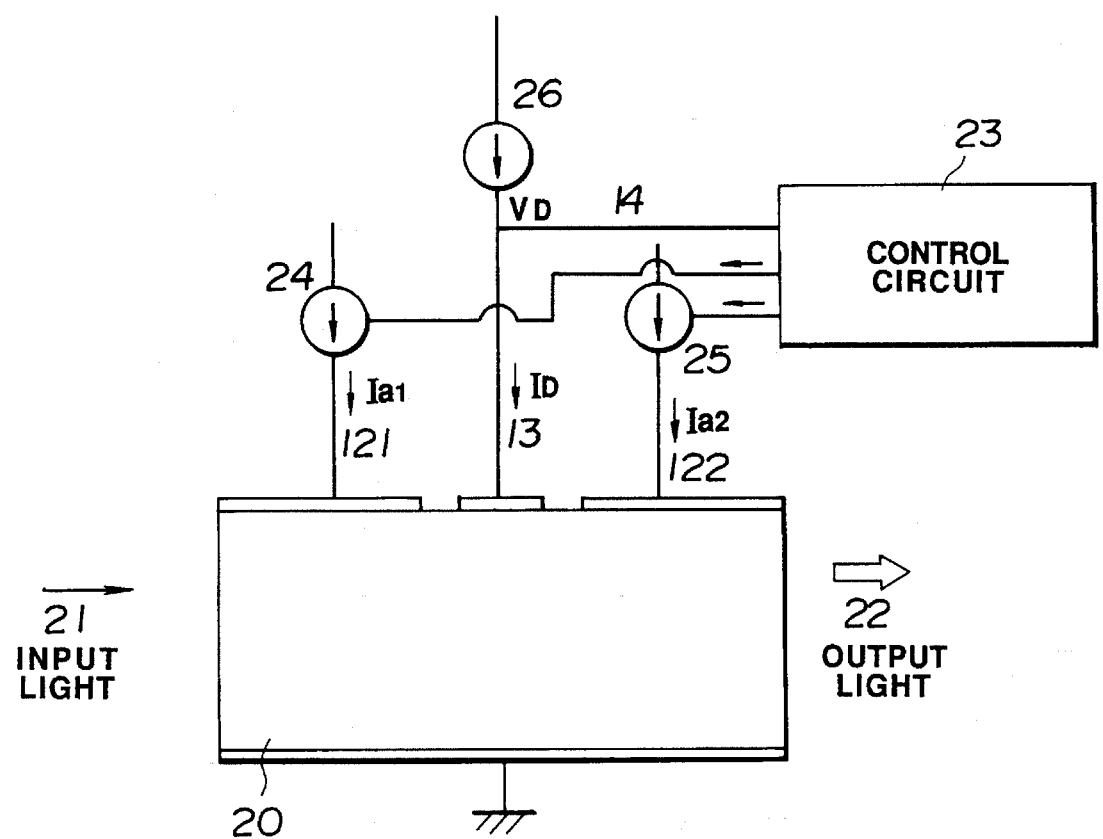
FIG. 14 is a cross-sectional view showing a third embodiment of the present invention.

FIG. 14 shows an apparatus which includes the optical semiconductor amplifier device described as in the first and second embodiments.

In FIG. 14, reference numeral 20 designates an optical semiconductor amplifier device illustrated in, for example, FIG. 9. Reference numeral 21 designates an incoming light, and reference numeral 22 designates an emerging light produced by amplifying the incoming light 21. Reference numeral 23 designates a control circuit, and reference numerals 24, 25 and 26 respectively designate first, second and third current sources. Further, similarly to FIG. 9, reference numeral 14 designates the voltage $V_D$ in the wavelength detecting region, reference numeral 13 designates the injection current $I_D$ injected into the wavelength detecting region, and reference numerals 121 and 122 respectively designate the injection currents $I_{a1}$ and $I_{a2}$ injected into the first and second general amplifying regions.

The control circuit 23 detects the voltage change in the wavelength detecting region, and controls the amounts of the injection currents $I_{a1}$ 121 and $I_{a2}$ 122 by supplying control signals to the first and second sources 24 and 25.

it is possible to construct an optical gate which is switched on and off depending on the input wavelength, by using such a structure. For this purpose, the injection currents $I_{a1}$, $I_{a2}$ and $I_D$ are initially adjusted so that the gain spectral characteristic as illustrated in FIG. 8 is achieved.

For instance, the injection current $I_{a2}$ 122 is reduced to zero when the light in the region II shown in FIG. 8 is input, and the flow of the injection current $I_{a2}$ is caused when the light in the region III is input. Further, the wavelength of light which is actually desired to be amplified is set to a wavelength in the region III. Thus, the optical switch that achieves the switching operation in response to the wavelength of an input light can be constructed. In this optical switch, the light in the region III is off-controlled, while the light in the region III is on-controlled.

The above explanation is only an example, and the wavelengths in the regions I, II and III can be respectively assigned to switched-off, switched-on and signal lights by properly controlling the injection currents. The number of such combination is six (6=3!).

A higher control is possible by using the structure of the second embodiment that can treat a plurality of wavelengths. For example, the device of the second embodiment can be built up to the structure shown in FIG. 14. As explained in the second embodiment, five kinds of states can be distinguished from each other in such a structure.

Figure 15:
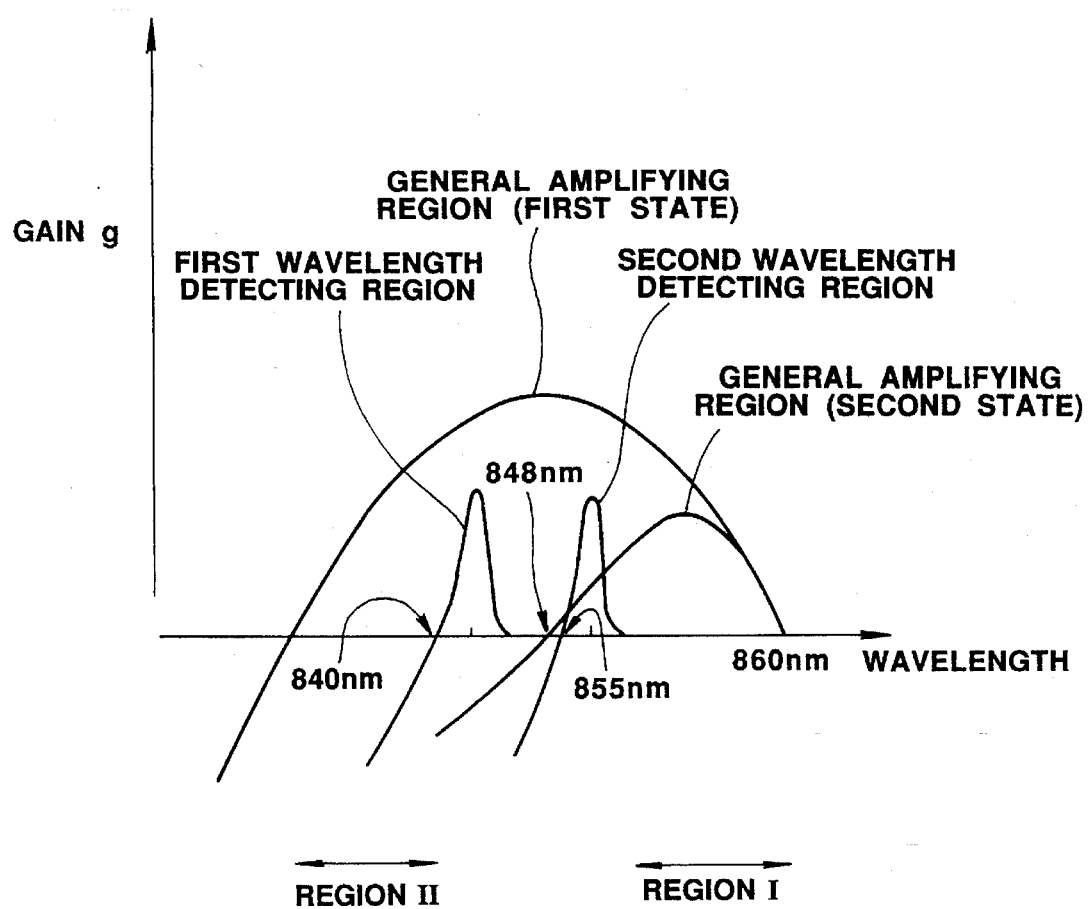
FIG. 15 is a graph showing gain spectra for explaining the operation of a semiconductor optical amplifier device of the third embodiment.

The operation will be described with reference to FIG. 15. Three wavelengths of 840 nm, 855 nm and 848 nm are chosen as wavelengths for switching the device. The injection current into the first general amplifying region at the input side is set so that the gain spectral characteristic of the first state indicated in FIG. 15 can be obtained. In this state, if, for example, a light of 855 nm is input, a current is injected into the second general amplifying region at the output side so that the gain spectral characteristic of the first state is achieved.

Then, if a light of 848 nm is input, the second general amplifying region is changed to the second state by properly controlling the current injected thereinto, and the current injection into the second general amplifying region is terminated if a light of 840 nm is input. The control circuit 23 is set to achieve such a control. For example, if wavelengths used in communications and the like are distributed in the regions I and II indicated in FIG. 15, it is possible to transmit a light in a predetermined wavelength range through the device by using an external light signal.

In the above case, when a light of 855 nm enters the device, signals of wavelengths in the regions I and II are amplified and transmitted through the device. When a light of 848 nm enters the device, only signals of wavelengths in the region I are amplified and transmitted through the device, while those in the region II is stopped therein. Further, when a light of 840 nm enters the device, signals of wavelengths in the regions I and II are absorbed in the device and switched off.

Fourth Embodiment

Figure 16:
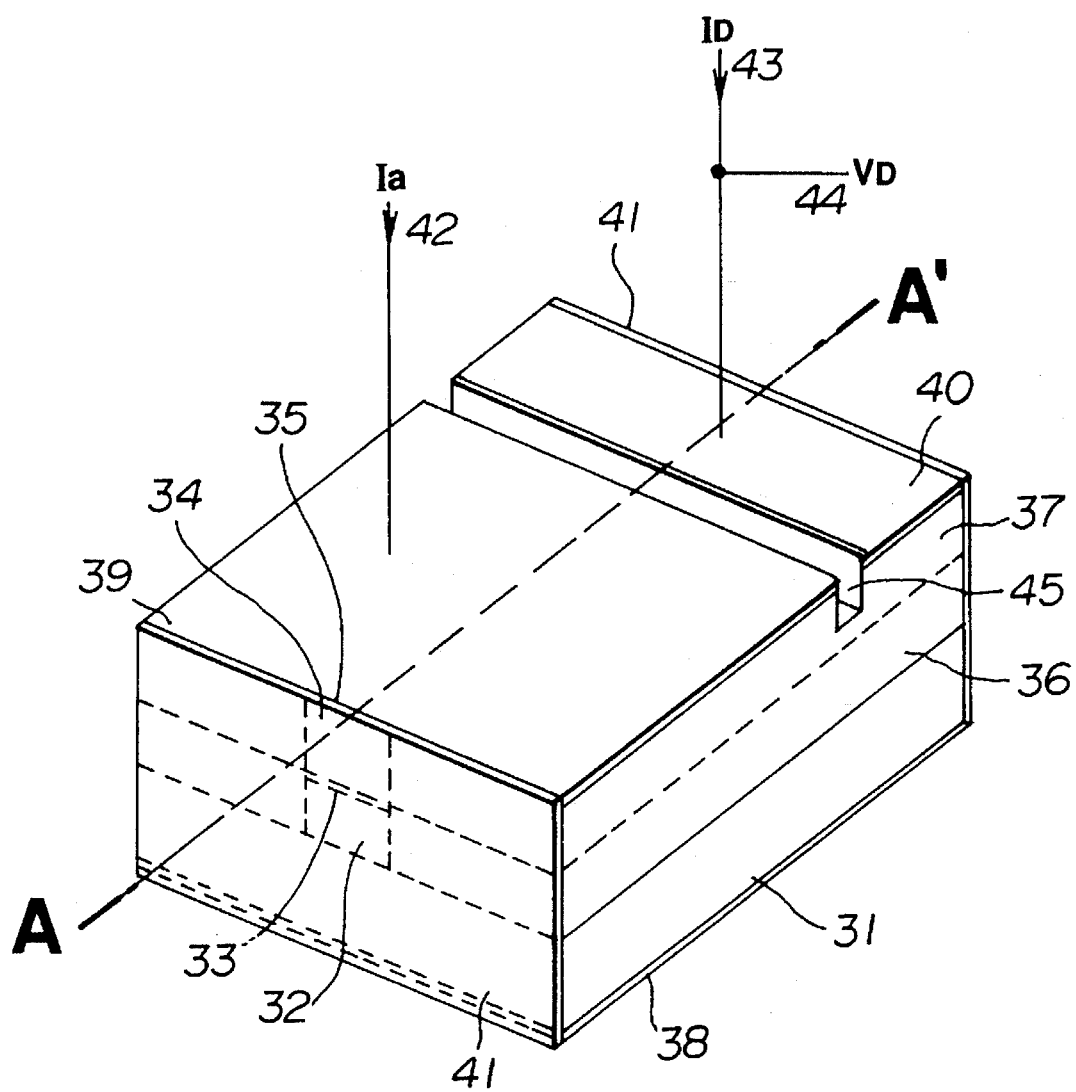
FIG. 16 is a perspective view showing a fourth embodiment of the present invention.
Figure 17:
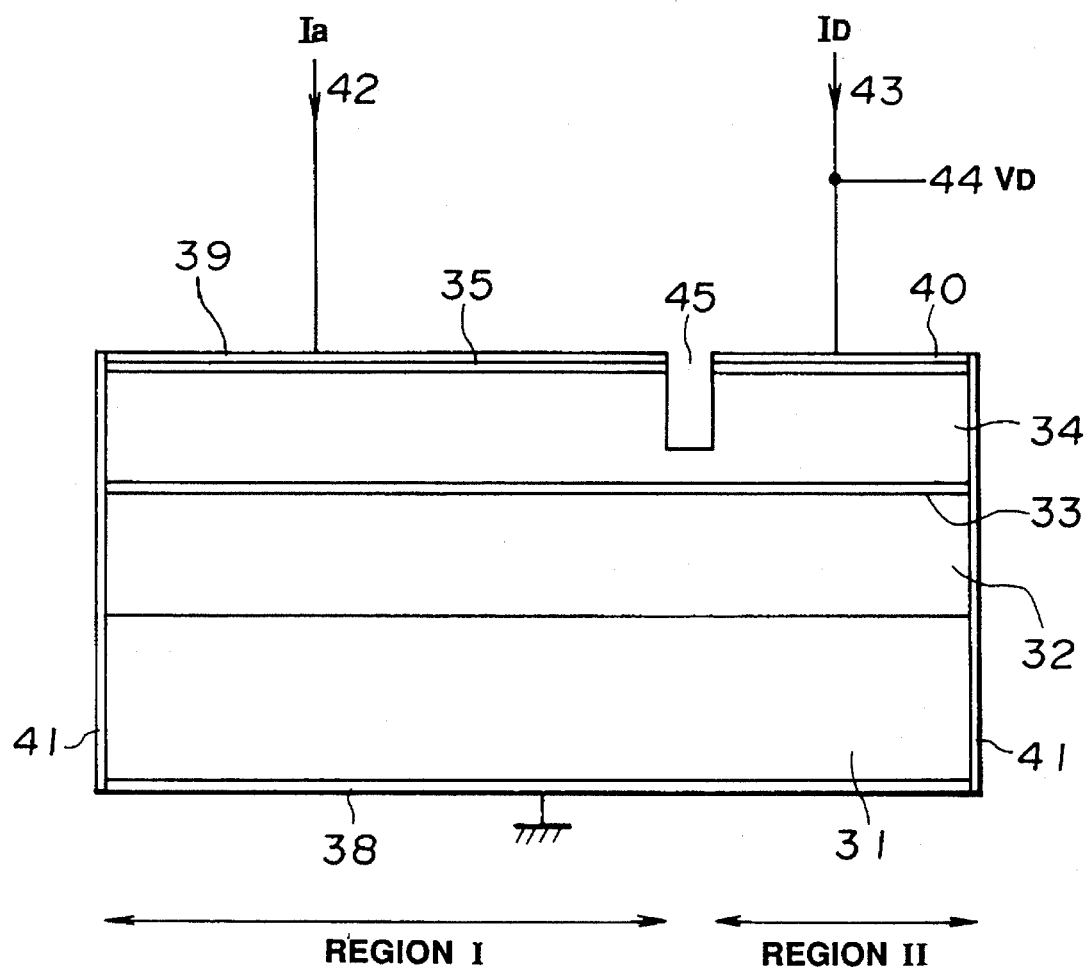
FIG. 17 is an A-A' cross-sectional view of FIG. 16. invention.

FIG. 16 shows a fourth embodiment of the semiconductor optical amplifier device. FIG. 17 is an A-A' cross-sectional view of FIG. 16. The basic structure of the fourth embodiment is the same as the first embodiment of FIG. 6. In FIGS. 16 and 17, reference numeral 31 designates a semiconductor substrate of n-type GaAs. Reference numeral 32 designates a first cladding layer of n-type $Al_{0.3}Ga_{0.7}As$. Reference numeral 33 designates an active layer of undoped GaAs. Reference numeral 34 designates a second cladding layer of p-type $Al_{0.3}Ga_{0.7}As$. Reference numeral 35 designates a cap layer of p-GaAs. Reference numeral 36 designates a first burying layer of p-type $Al_{0.4}Ga_{0.6}As$, and reference numeral 37 designates a second burying layer of n-type $Al_{0.4}Ga_{0.6}As$. Reference numeral 38 designates a first electrode of an alloy of Au and Ge. Reference numerals 39 and 40 designate second and third electrodes of an alloy of Au and Cr. Reference numeral 41 designates an antireflection layer of $ZrO_2$ deposited on the input and output end surfaces of the optical semiconductor amplifier device. Reference numerals 42 and 43 respectively designate injection currents $I_a$ and $I_D$ injected into the second and third electrodes 39 and 40. Reference numeral 44 designates a voltage between the first electrode 38 and the third electrode 40. Reference numeral 45 designates a groove for electrically separating a portion or region I through which a current flows between the first and second electrodes 38 and 39 and a portion or region II through which a current flows between the first and third electrodes 38 and 40.

Typical sizes of the fourth embodiment is as follows: The thickness of the first cladding layer 32 is 1.5 µm, the thickness of the active layer 33 is 0.1 µm, the thickness of the second cladding layer 34 is 1.5 µm, the thickness of the cap layer 35 is 0.5 µm, the width of the active layer 33 is approximately 1.5 µm, the length of the region I is approximately 200 µm, the length of the region II is approximately 50 µm, and the length of the separating groove 45 is approximately 50 µm.

The optical semiconductor amplifier device having such a structure can be readily fabricated by conducting well-known processing methods, such as photolithography, dry etching and deposition, upon an original wafer. The original water is formed by layering-thin layers on a semiconductor substrate, utilizing conventional crystal growth methods such as molecular beam epitaxy (MBE), metal organic-chemical vapor deposition (MO-CVD) and liquid phase epitaxy (LPE).

The operation of this embodiment will be described. Initially, the operation of the optical semiconductor amplifier device shown in FIGS. 16 and 17 will be described. In FIG. 17, when a light signal is input from the left side, through a coupling means such as a lens, into a waveguide composed of the active layer 33, the first cladding layer 32, the second cladding layer 34 and the burying layers 36 and 37, the light advances while being amplified in the amplifying portion or region I into which the injection current $I_a$ 42 is injected. The thus amplified light further advances into the active region of the region II where the population inversion is created by the injection current $I_D$ 43. Then the light is further amplified and output through the end surface at the right side of the region II.

Figure 18:
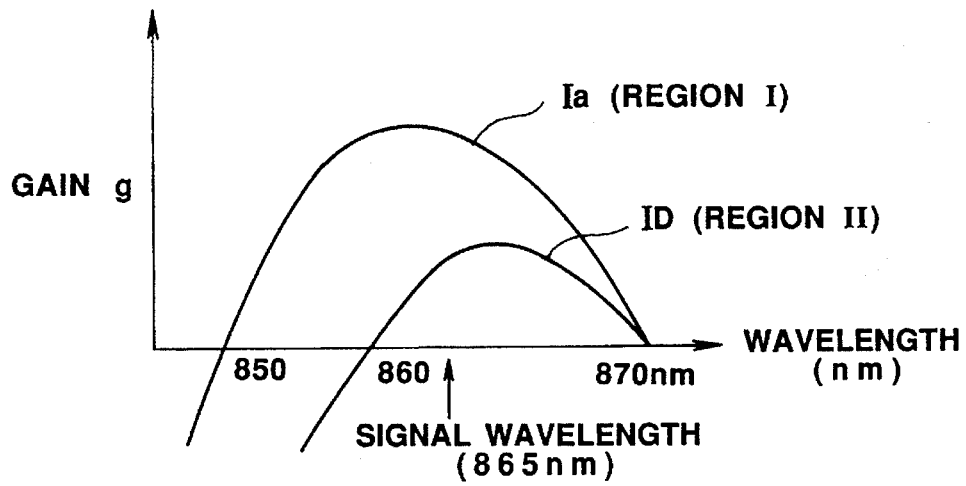
FIG. 18 is a graph showing gain spectra for explaining the operation of a semiconductor optical amplifier device of the fourth embodiment.

The basic operation is as described above. Here, the gain spectral characteristic as illustrated in FIG. 18 can be achieved by controlling the current $I_a$ 42 flowing into the region I and the current $I_D$ 43 flowing into the region II. That is, the gain spectral characteristic of the region II can be set in such a manner that its peak value and full width at half maximum are respectively smaller and narrower than those of the region I. In the case of the fourth embodiment, since the active layer 33 is formed with a bulk crystal, this situation can be attained by making the current density in the region II smaller than that in the region I. Under this condition, when a light signal is input into the semiconductor amplifier device of this embodiment, the light is amplified in the region I and the amplified light input into the region II causes carriers in the active region of the region II to be recombined. At this time, since the injection current density in the region II is small, the recombination of carriers is caused by the amplified light signal and hence the detection both-end voltage $V_D$ 44 is varied. Although the injection current densities into the regions I and II may be equal to each other, the amount of voltage change can be increased by making these current densities different.

Figure 19:
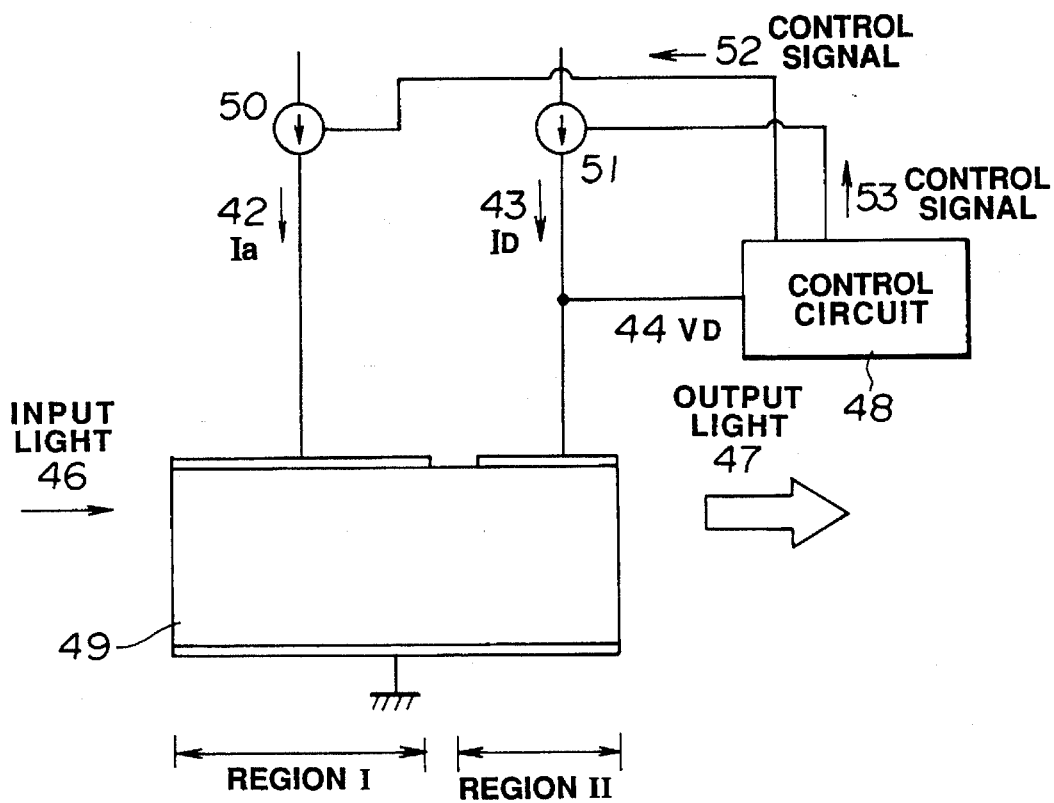
FIG. 19 is a view showing a use example of the semiconductor optical amplifier device of FIG. 16.

FIG. 19 shows the structure for achieving the APC operation (explained in the description of the prior art) in the fourth embodiment. In FIG. 19, reference numeral 46 designates an incoming light, and reference numeral 47 designates an output light. Reference numeral 48 designates a control circuit, and reference numeral 49 designates an optical semiconductor amplifier device of the present invention. Reference numeral 50 designates a source for injecting the injection current $I_a$ 42 into the region I, and reference numeral 51 designates a source for injecting the injection current $I_D$ 43 into the region II. Reference numeral 52 designates a control signal from the control circuit 48 which adjusts the amount of the current $I_a$ 42 from the source 59, and reference numeral 53 designates a control signal for adjusting the amount of the current $I_D$ 43 from the source 51.

The zero level of the input light 46 is modulated by using sinusoidal wave modulation as well as a digital signal for communication. The frequency of the sinusoidal wave is much slower than the frequency of the digital signal. The control circuit 48 separates only this sinusoidal wave component from the detection voltage $V_D$, and the voltage change in the region II can be known. The intensity degree of light incident on the region II can be learned From the amount of the voltage change. Namely, the voltage change becomes great as the intensity of input light is strong. Therefore, the control circuit 48 supplies the control signal 52 to the source 50 to adjust the amount of the current $I_a$ 42 flowing into the region I so that the voltage change in the region II is maintained at a predetermined constant value. Thus, the APC operation can be achieved.

In this embodiment, the structure in which the buried structure and the active layer of a bulk crystal are used is adopted as a basic semiconductor laser structure. The waveguide structure, however, is not limited to this structure, but any structure used in prior art semiconductor lasers, such as ridge, stripe, SCH, GRIN-SCH structures, can be utilized. Further, multiple quantum well (MQW), single quantum well, quantum wire and quantum box structures can also be used in the active region.

In this embodiment, the antireflection layers are deposited on the opposite end surfaces and a so-called traveling wave type optical amplifier device is adopted. However, a structure without antireflection layers can be adopted.

Fifth Embodiment

Figure 20:
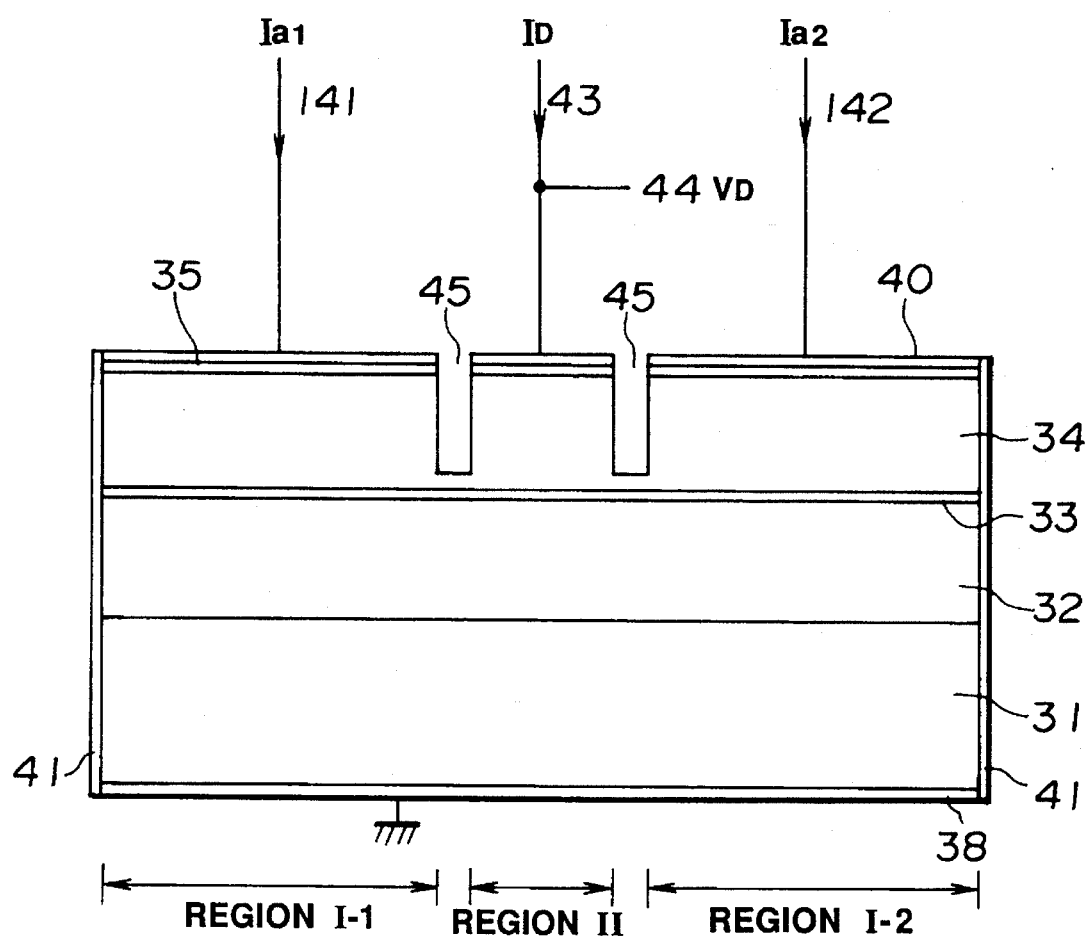
FIG. 20 is a cross-sectional view showing a fifth embodiment of the present invention.

FIG. 20 shows a fifth embodiment of the present invention. FIG. 20 is a view corresponding to FIG. 17 of the fourth embodiment. In FIG. 20, the same portions as those in the fourth embodiment are designated by the same reference numerals.

Typical sizes of the fifth embodiment are as follows: The thickness of the first cladding layer 32 is 1.5 µm, the thickness of the active layer 33 is 0.1 µm, the thickness of the second cladding layer 34 is 1.5 µm, the thickness of the cap layer 35 is 0.5 µm, the width of the active layer 33 is approximately 1.5 µm, the lengths of the regions I-1 and I-2 are respectively approximately 100 µm, the length of the region II is approximately 50 µm, and the length of the separating groove 45 is approximately 50 µm.

The fifth embodiment differs from the fourth embodiment in that the region II is located at a central portion of the semiconductor amplifier device. The region I of the fourth embodiment is thus divided into two portions, and these portions are referred to as regions I-1 and I-2. Currents $I_{a1}$ 141 and $I_{a2}$ 142 are respectively injected into the respective regions I-1 and I-2.

The structure of FIG. 20 facilitates a bi-directional optical amplification operation. The injection currents $I_{a1}$ 141, $I_{a2}$ 142 and $I_D$ 43 are set so that the regions I-1 and I-2 have gain spectral characteristics of the general amplifying region in FIG. 8 and that the region II has the gain spectral characteristic of the wavelength detecting region in FIG. 8. In this state, when a light signal is input from the left side of FIG. 20, the light is amplified in the region I-1 and changes the voltage $V_D$ 44 in the region II. The amplified light signal is further amplified in the region I-2 and output from the right side of the device.

An input light incident from the right side is amplified in the region I-2 and changes the voltage $V_D$ 44 while being amplified. The light signal is further amplified in the region I-1 and output from the left side. Thus, lights traveling in both opposite directions are amplified, and then their light intensities can be detected in the region II as the voltage change. Based on this voltage change, the control circuit 48 as shown in FIG. 19 adjusts the currents $I_{a1}$ and $I_{a2}$ flowing into the regions I-1 and 1-2, and hence the APC operation is achieved.

Sixth Embodiment

Figure 21:
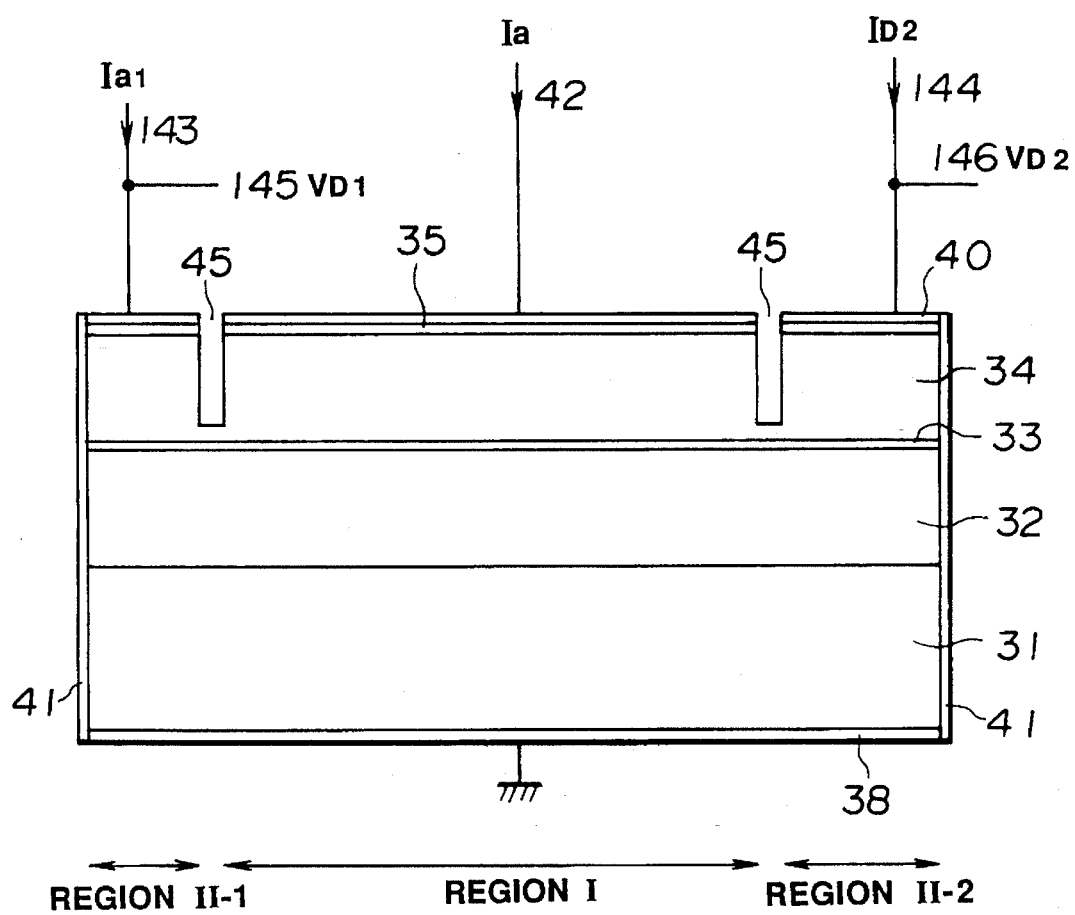
FIG. 21 is a cross-sectional view showing a sixth embodiment of the present invention.

FIG. 21 shows a sixth embodiment of the present invention. FIG. 21 is a view which corresponds to FIG. 17 of the fourth embodiment shown in FIG. 16. In FIG. 21, the same portions as those in the fourth embodiment are designated by the same reference numerals. In the sixth embodiment, regions II-1 and II-2 for detecting the voltage change due to the intensity of light incident thereon are arranged at input and output side portions of the device. The fourth embodiment includes only one region II, but this region is divided into two portions in the sixth embodiment. Therefore, the current $I_D$ 43 and the detection both-end voltage $V_D$ 44 in the fourth embodiment are respectively indicated by injection currents $I_{D1}$ 43 and $I_{D2}$ 144 and detection voltages $V_{D1}$ 145 and $V_{D2}$ 146 in FIG. 21, corresponding to the regions II-1 and II-2.

Typical sizes of the sixth embodiment are as follows: The thickness of the first cladding layer 32 is 1.5 µm, the thickness of the active layer 33 is 0.1 µm, the thickness of the second cladding layer 34 is 1.5 µm, the thickness of the cap layer 35 is 0.5 µm, the width of the active layer 33 is approximately 1.5 µm, the length of the region I is approximately 200 µm, the lengths of the region II-1 and II-2 are respectively approximately 50 µm, and the length of the separating groove 45 is approximately 50 µm.

Figure 22:
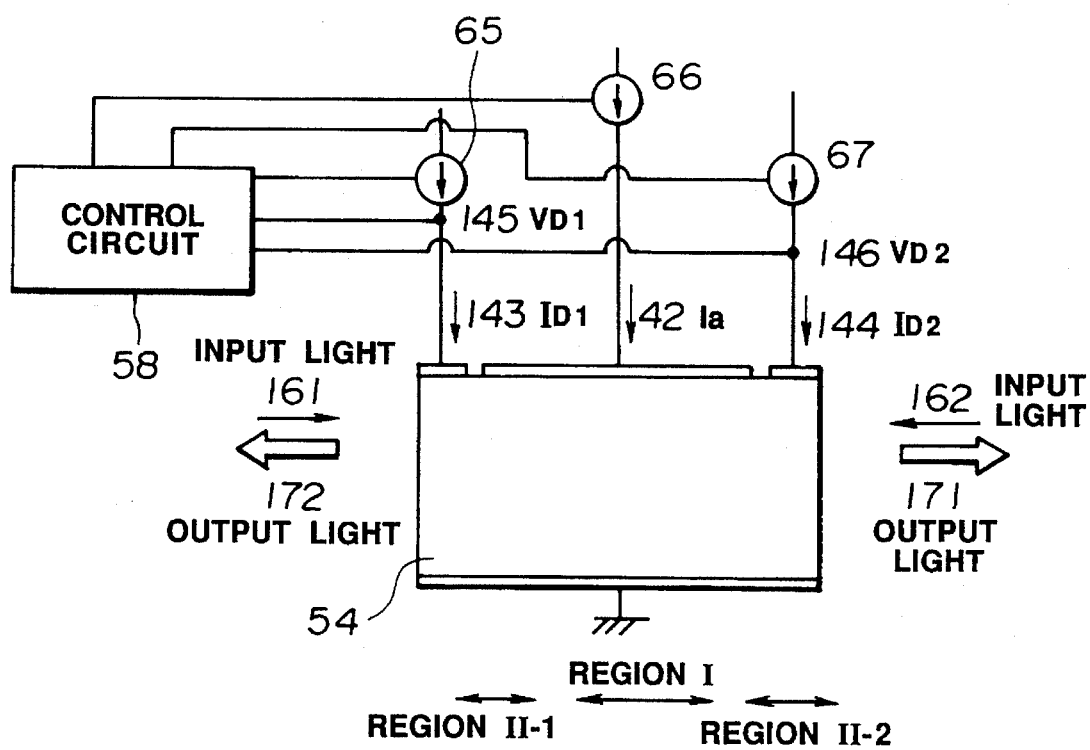
FIG. 22 is a view showing a use example of the semiconductor optical amplifier device of FIG. 21.

FIG. 22 shows a structural example to be used at the time of bi-directional optical amplification. FIG. 22 corresponds to FIG. 19 of the fourth embodiment. In FIG. 22, reference numeral 54 designates an optical semiconductor amplifier device as shown in FIG. 21. Reference numeral 161 designates an input light input into the optical amplifier device 54 from the left side, and reference numeral 162 designates an input light input from the right side. Reference numeral 171 designates an output light originated from the amplified input light 161, and reference numeral 172 designates an output light corresponding to the input light 162. Reference numerals 65, 66 and 67 respectively designate current sources for injecting injection currents $I_{D1}$ 143, $I_a$ 42 and $I_{D2}$ 144 into the regions II-1, I and II-2. Reference numeral 58 designates a control circuit for supplying a control signal to the current source 66 so that the current $I_a$ 42 injected into the region I is regulated based on the detection of both-end voltages $V_{D1}$ 145 and $V_{D2}$ 146 which are input into the control circuit 58.

The operation of the sixth embodiment will be described. First, a uni-directional light input operation will be explained. The modulation manner of the signal is the same as the fourth embodiment. As an example, a case where the input light 161 is amplified and the output light 171 is output from the optical semiconductor amplifier device 54 will be described.

When the input light 161 is input into the optical semiconductor amplifier device 54, the light is amplified in the region II-1, further amplified in the region I and changes detection voltage $V_{D2}$ 146 while still further amplified in the region II-2. When the light emerges as the output light 171. The control circuit 58 monitors the change in the detection voltage $V_{D2}$ 146, and supplies the control signal to the source 66 to adjust the injection current $I_a$ 42 so that a desired voltage change is obtained in the region II-2. When the light is amplified in a reverse direction, the control circuit 58 controls the injection current $I_a$ 42 based on the voltage change appearing in the region II-1.

Under general circumstances of its use, the input lights 161 and 162 rarely have the same intensity, and it is difficult to cause the respective input lights to enter the optical amplifier device 54 with the same coupling efficiency. As a result, at the time of bi-directional amplification, the changes in the detection voltages $V_{D1}$ 145 and $V_{D2}$ 146 are different from each other. At this time, it is difficult to achieve the APC operation with respect to the bi-directional input lights. This situation is the same as with the prior art amplifier, but not the only drawback for the sixth embodiment.

In the sixth embodiment, the AGC (control for maintaining the amplification factor at a constant value) operation is also feasible as well as the APC operation, since the regions for detecting the voltage change are arranged at both input and output portions. For example, in the case where light is input from the left side of FIG. 21 and output from the right, the voltage changes $V_{D1}$ 145 and $V_{D2}$ 146 due to the input light and the amplified light are obtainable. Therefore, the AGC operation can be achieved by controlling the injection current $I_a$ 42 to keep a value of $V_{D1}/V_{D2}$ constant.

Such AGC operation is also effective at the time of the bi-directional operation, as well as the time of the uni-directional operation. The above-mentioned modulation frequencies (the frequency of a sinusoidal wave signal superposed upon the digital signal) are made different between the input signals input in both opposite directions, and the two wavelength detecting regions respectively detect the modulated signals. Thus, the AGC operation can be conducted in the same manner as the uni-directional AGC operation.

Figure 23:
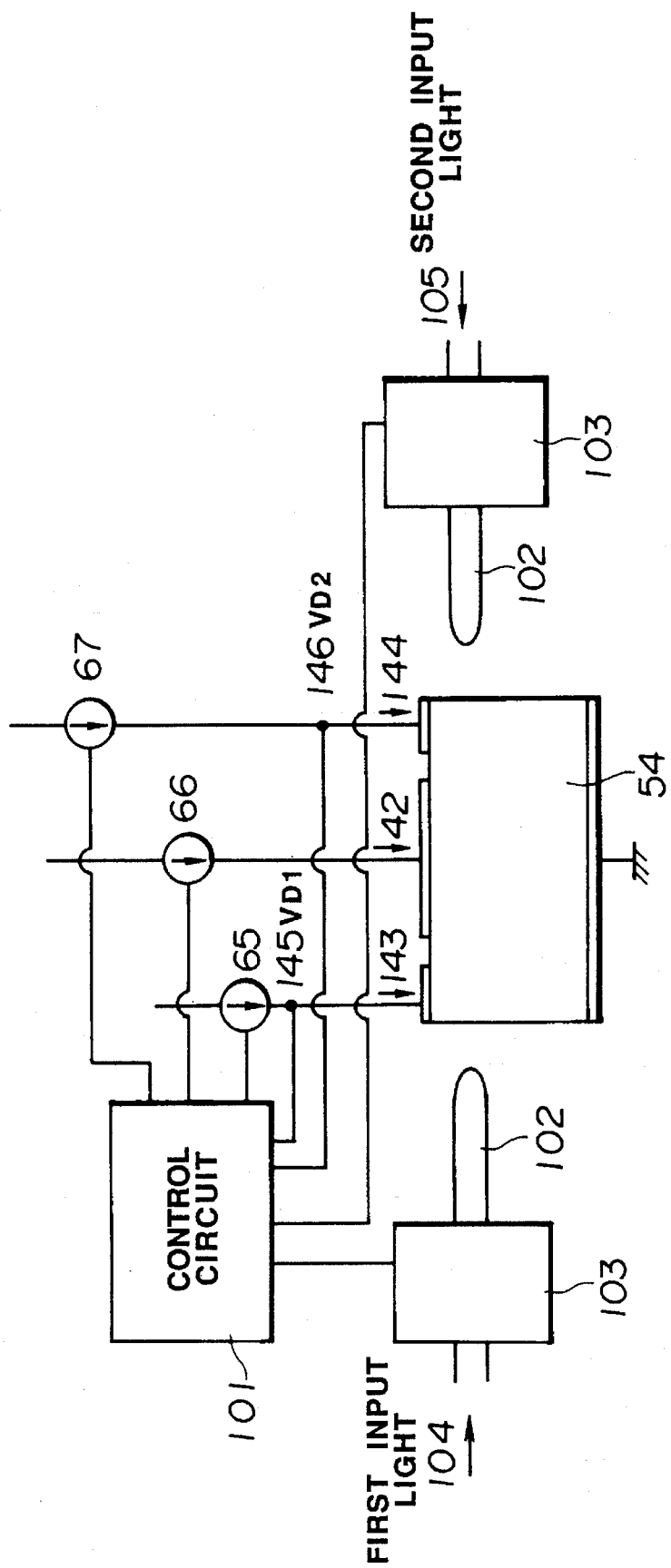
FIG. 23 is a view showing another use example of the semiconductor optical amplifier device of FIG. 21.

As descibed above, the APC operation of the bi-directional operation is difficult in the structure shown in FIGS. 21 and 22, but the APC operation is preferably achieved also for the bi-directional operation, by modifying the structure as shown in FIG. 23.

In FIG. 23, the same members as those in FIG. 22 are designated by the same reference numerals. In FIG. 23, reference numeral 101 designates a control circuit, and reference numeral 102 designates a lensed optical fiber. Reference numeral 103 designates a mechanism for finely adjusting the optical fiber 102 in up and down, right and left and forward and rearward directions. The mechanism 103 is composed of, for example, an XYZ adjusting mechanism which is activated by piezoelectric elements. The adjustment is readily conducted in a manner such that the amounts of the first and second input lights 104 and 105 are equalized with each other.

Under such condition, lights are input from opposite directions, and the voltage changes $V_{D1}$ 145 and $V_{D2}$ 146 due to these lights are detected by the control circuit 101. In the case of $V_{D1} \neq V_{D2}$, this result shows that input coupling efficiencies at both opposite end surfaces are different from each other. Therefore, the control signal is supplied to the XYZ adjusting mechanism 103 for finely adjusting one of the lensed optical fibers 102, so that $V_{D1}=V_{D2}$ is attained. Further, when the intensity of the first input light 104 is different from the intensity of the second input light 105, the XYZ adjusting mechanism 103 is controlled, taking into consideration the amplification factor.

Thus, a still higher control is obtainable by using information obtained from the sixth embodiment of FIG. 21, and a stable optical amplification operation is realized.

Seventh Embodiment

Figure 24:
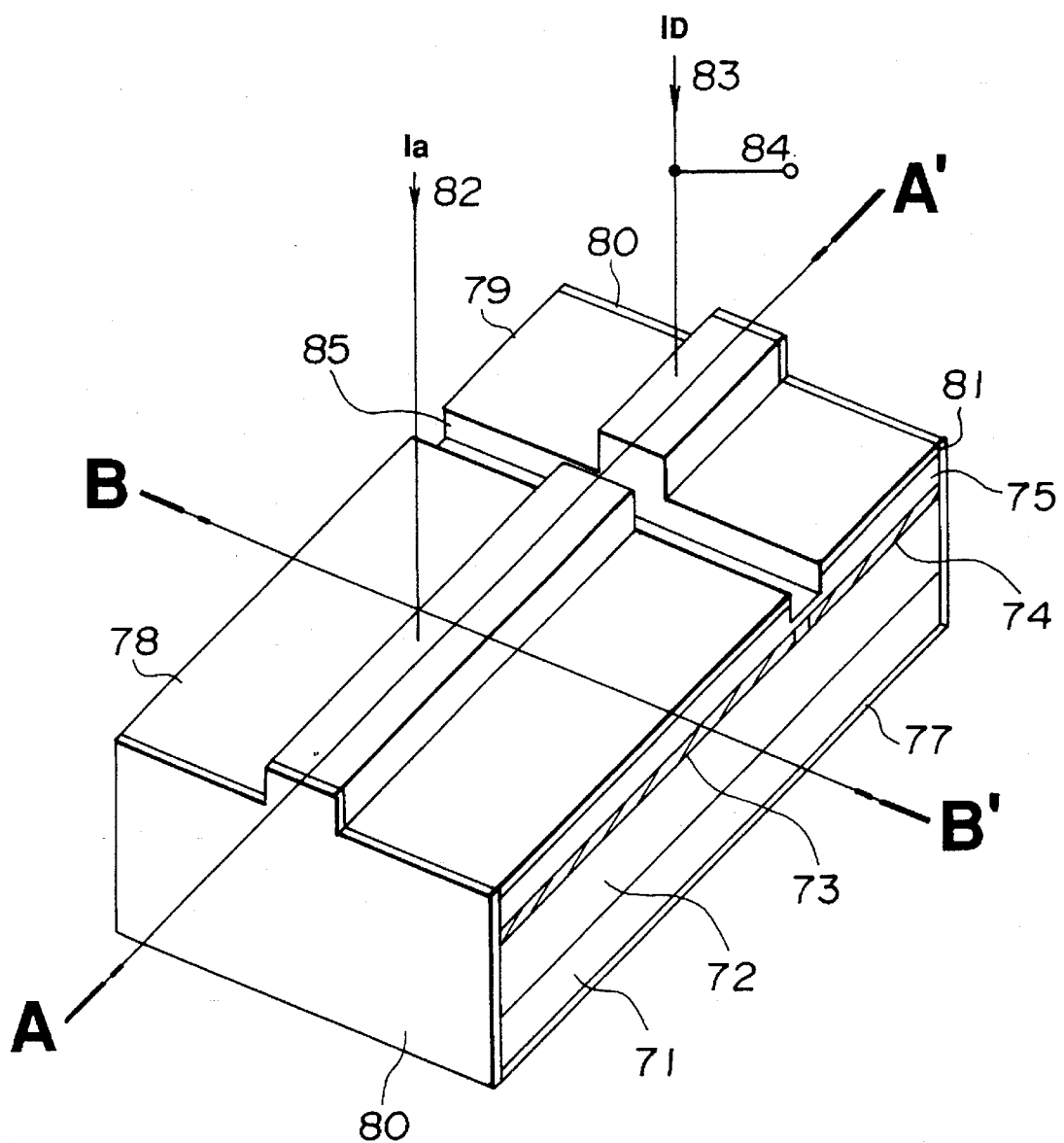
FIG. 24 is a perspective view showing a seventh embodiment of the present invention.
Figure 25:
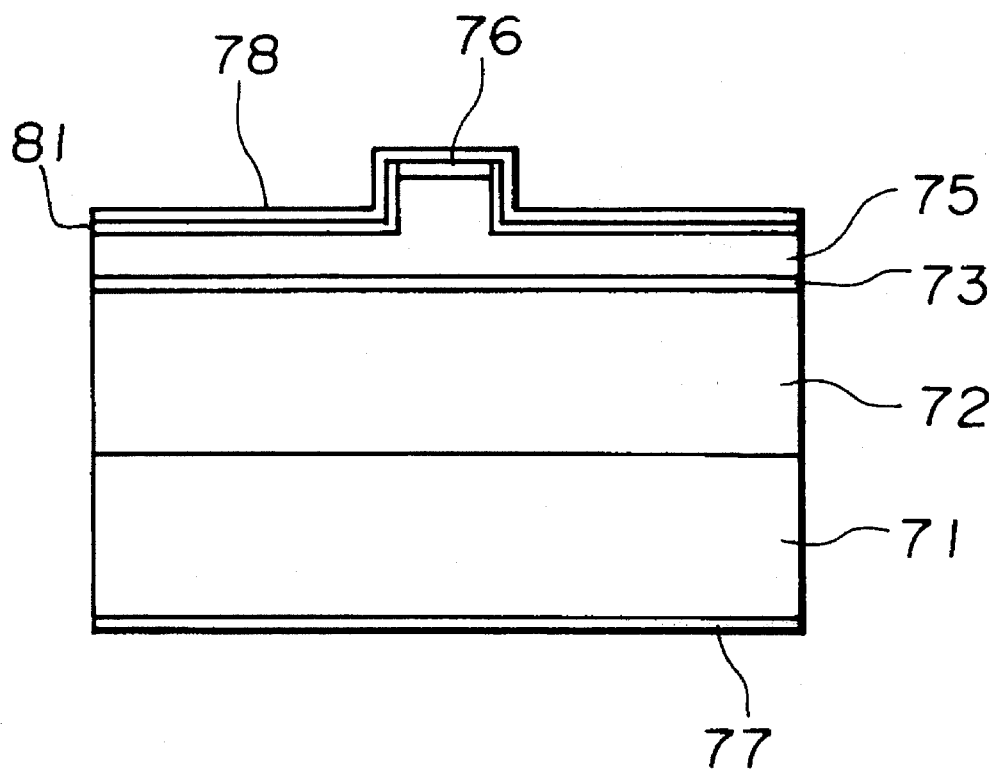
FIG. 25 is an B-B' cross-sectional view of FIG. 24.
Figure 26:
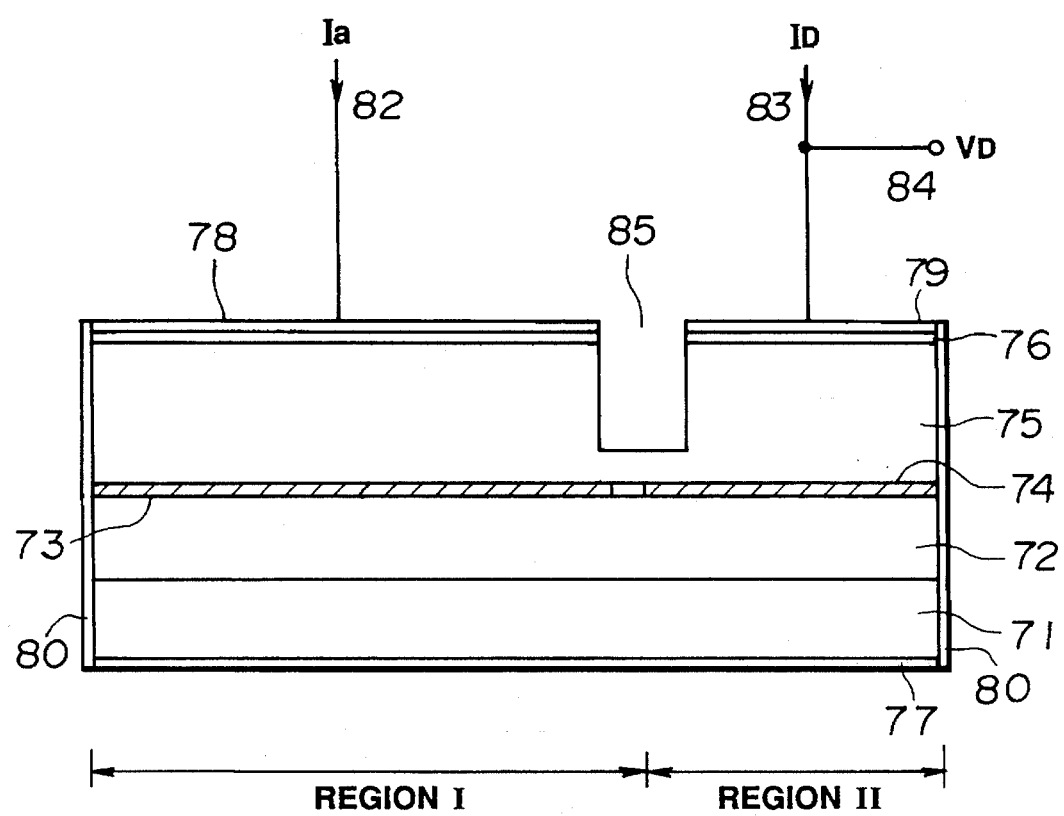
FIG. 26 is an A-A' cross-sectional view of FIG. 24.

FIGS. 24, 25 and 26 show the structure of a seventh embodiment of the present invention. FIG. 25 is a B=B' cross-sectional view of FIG. 24, and FIG. 26 is an A-A' cross-sectional view of FIG. 24. In FIGS. 24, 25 and 26, reference numeral 71 designates a semiconductor substrate of n-type GaAs. Reference numeral 72 designates a first cladding layer of n-type $Al_{0.5}Ga_{0.5}As$. Reference numeral 73 designates a first active layer of undoped GaAs, and reference numeral 74 designates a second active layer of undoped $Al_{0.02}Ga_{0.98}As$. Reference numeral 75 designates a second cladding layer of p-type $Al_{0.5}Ga_{0.5}As$, and reference numeral 76 designates a cap layer of p-type GaAs. Reference numeral 77 designates a first electrode of an alloy of Au and Ge deposited on the bottom of the substrate 71, reference numeral 78 designates a second electrode of an alloy of Au and Cr, and reference numeral 79 designates a third electrode of an alloy of Au and Cr. Reference numeral 80 designates an antireflection film formed on opposite end surfaces (e.g., consisting of $ZrO_2$). Reference numeral 81 designates an insulating layer of $Si_3N_4$. Reference numeral 82 designates an injection current $I_a$ injected into the first active layer 73 interposed between the first and second electrodes 77 and 78, and reference numeral 83 designates an injection current $I_D$ injected into the second active layer 74 interposed between the first and third electrodes 77 and 79. Reference numeral 84 designates a detection both-end voltage $V_D$ produced between the first electrode 77 and the third electrode 79 and reference numeral 85 designates a separating groove for reducing electric interference between a first region I interposed between the first electrode 77 and the second electrode 78 and a second region II interposed between the first electrode 77 and the third electrode 79. The groove 85 vertically extends to halfway of the second cladding layer 75 through the cap layer 76.

Typical sizes of the seventh embodiment are as follows: The thickness of the first cladding layer 72 is 1.5 μm, the thickness of the first active layer 73 is 0.1 μm, the thickness of the second active layer 74 is 0.1 μm, the thickness of the second cladding layer 75 is 1.5 82 m, the thickness of the cap layer 76 is 0.5 μm, the length of the region I is approximately 200 μm, the length of the region II is approximately 50 μm, and the length of the separating groove 85 is approximately 50 μm. As seen from FIGS. 24 and 25, the ridge waveguide structure is used in this embodiment. The width of the ridge structure is 2 μm, and the height of the ridge structure is approximately 1.8 μm. Thus, the ridge structure is formed so that the transverse mode of the waveguide is a single mode.

The operation of this embodiment will be described. The adjustment of injection currents will be explained before explaining the behavior of light. Since band gap energies of crystals forming the active layers 73 and 74 are different between the regions I and II, gain spectral characteristics shown in FIG. 27 can be obtained by appropriately controlling the amounts of injection currents 82 and 83. Namely, the gain peak wavelength of the region I can be positioned at a longer wavelength side than the gain peak wavelength of the region II. This is attained by making the band gap energy of the region II, which is the voltage detecting region, larger than that of the region I which is the general amplifying region.

The basic operation at the time when light is input into the optical amplifier device of this embodiment is the same as that of the fourth embodiment. The light signal input through the end surface at the side of the region I travels while being amplified by the first active layer 73, and then enters the region II. The amplified light causes the change in the detection voltage $V_D$ 84 while being further amplified in the region II, and is output from the end surface at the side of the region II. Therefore, as shown in FIG. 19 of the fourth embodiment, the APC operation is achieved if the control circuit fulfills the function that adjusts the amount of the injection current $I_a$ 82 based on the change in the detection both-end voltage $V_D$ 84. In this case, the change in the detection voltage $V_D$ 84 can be readily and stably detected if, similarly to the fourth embodiment, the light signal (e.g., digital signal) is modulated by a sinusoidal wave signal which varies much more gently than the transmitted light signal.

The effect due to the structure in which the band gap energies of the active layers are made different between the regions I and II as in the seventh embodiment will be described. When the light travels in the active region and is amplified, carriers are recombined to cause the voltage change therein. At this time, carriers consumed by light near to the band edge can be quickly supplemented by carriers at a higher energy side. Therefore, the saturation output for the light having an energy near to the band edge is greater than others. In other words, the light having energy near to the band edge (light at a longer wavelength side) can create a greater voltage change. Namely, a maximum value of the voltage change generated in the active layer of the same composition by the same injection carrier density is dependent on the wavelength of light, and the light at a longer wavelength side can cause a larger voltage change.

Figure 27:
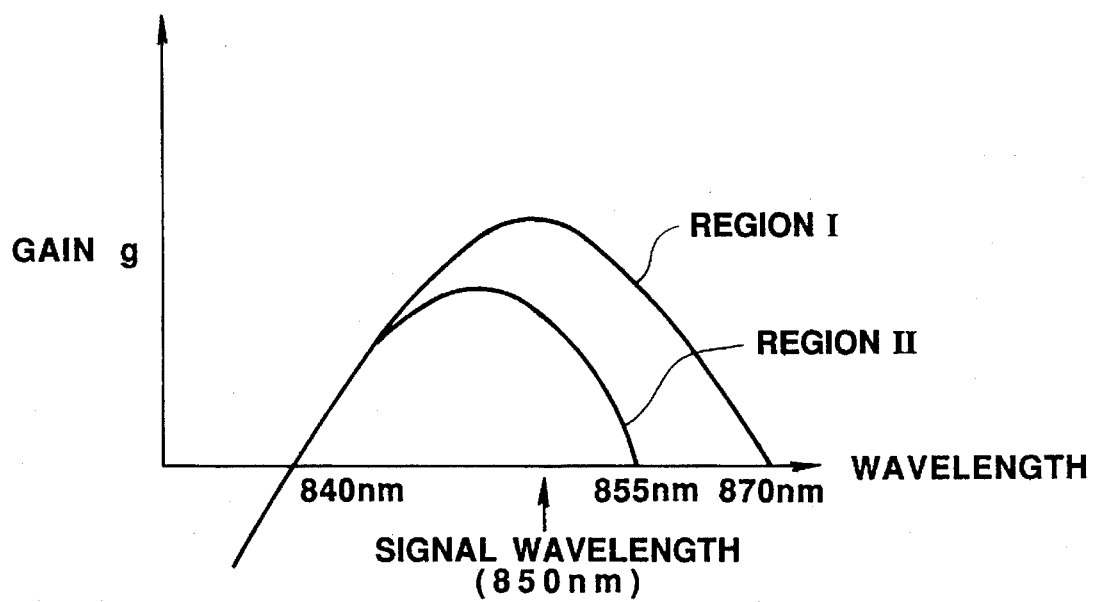
FIG. 27 is a graph showing gain spectra for explaining the operation of a semiconductor optical amplifier device of the seventh embodiment.

As seen from FIG. 27, the wavelength of the signal light lies at a longer wavelength side of the gain spectrum of the wavelength detecting region or region II in the seventh embodiment, while the wavelength of the signal light lies at a shorter wavelength side of the gain spectrum of the wavelength detecting region in the fourth embodiment as illustrated in FIG. 18.

Therefore, as compared with the fourth embodiment, the structure of the seventh embodiment can give a voltage change having a much better linearity at the time of high-amplification operation. Thus, the APC operation can be preferably achieved.

In the seventh embodiment, the ridge waveguide structure is used for confinement, but any waveguide structure, such as a buried-type structure, stripe structure, SCH structure and GRIN-SCH structure, which has been used in the prior art semiconductor lasers, can be employed. Further, a bulk crystal is used in the active layer of this embodiment, but MQW, SQW, quantum box, quantum line or the like can also be used.

Since the fifth and sixth embodiments are modifications of the fourth embodiment, the seventh embodiment can also be used in a structural form of the fifth or sixth embodiment. As a result thereof, an optical semiconductor amplifier device can be realized which has features of the seventh embodiment as well as features of the fifth or sixth embodiment.

In the fourth to seventh embodiments, materials of a GaAs series are used, but the materials are not limited to the GaAs series. Any material that can construct the semiconductor laser, such as InP series, can be used. Further, in the above embodiments, a slit form is adopted as a method for electrically separating a plurality of electrodes, but the separating method is not limited thereto. The separation can be achieved by forming a high-resistance region by an ion-injection method or the like.

Eighth Embodiment

Figure 28:
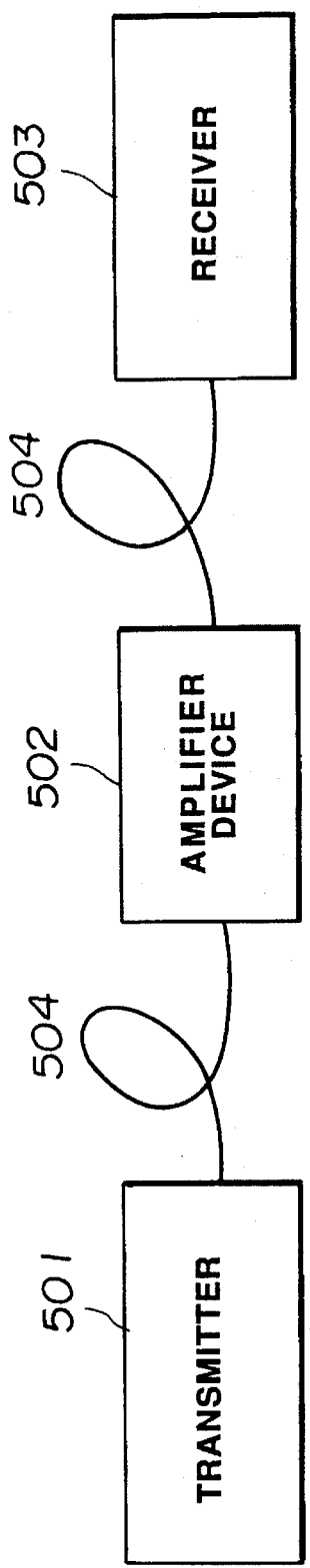
FIG. 28 is a block diagram of an eighth embodiment of an optical communication system including a semiconductor optical amplifier device of the present invention.

FIG. 28 shows an optical transmission system in which the semiconductor optical amplifier device or apparatus of any one of the above embodiments is used.

In FIG. 28, reference numeral 501 designates an optical transmitter, reference numeral 502 designates a semiconductor light amplifying apparatus in which the semiconductor optical amplifier device of the present invention is contained, referrence numeral 503 designates an optical receiver and reference numeral 504 designates an optical fiber.

Figure 35:
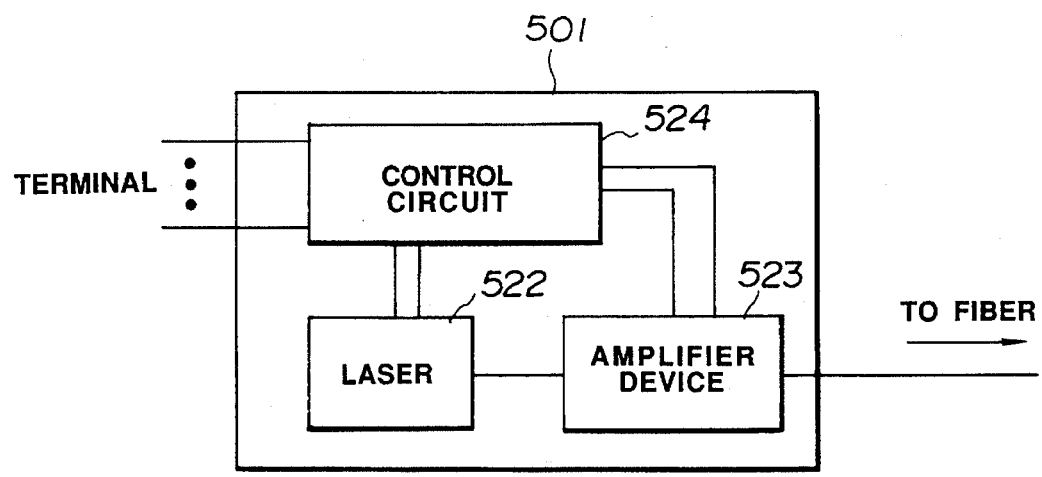
FIG. 35 is a block diagram of an optical receiver used in an optical communication system.

The optical transmitter 501 is constructed as shown in FIG. 35. In FIG. 35, reference numeral 522 designates a semiconductor laser (LD) for transmission, reference numeral 523 designates a semiconductor optical amplifier device of the present invention and reference numeral 524 designates a control circuit. A source for supplying an injection current into both the semiconductor laser 522 and the semiconductor optical amplifier device 523 is needed, but in this case this source is contained in the control circuit 524.

The control circuit 524 supplies a signal from a terminal equipment to the semiconductor laser 522 to generate an optical signal and controls it for achieving the APC operation of the semiconductor optical amplifier device 523. The optical signal from the semiconductor laser 522 is amplified by the semiconductor optical amplifier device 523 and then is input into the optical fiber 504. In this case, the semiconductor optical amplifier device 523 is used as a so-called booster amplifier. This amplifier 523 will suffice if it is adjusted to the entire optical transmission system, and in this case only one amplifier is used as shown in FIG. 35. Two or more amplifiers can be used. Naturally, no booster amplifiers may be used, but only if the optical transmitter 501 functions well.

The optical receiver 503 is constructed as shown in FIG. 35. In FIG. 36, reference numeral 523 designates the semiconductor optical amplifier device of the present invention, reference numeral 525 designates a control circuit and reference numeral 526 designates a photodetector (PD). An optical signal from the optical fiber 504 is APC-amplified by the semiconductor optical amplifier device 523 and is converted to an electric signal by the photodetector 526. The control circuit 525 performs the APC control of the semiconductor optical amplifier device 523 and shapes the electric signal from the photodetector 526 to transmit this shaped signal to desired terminal equipment. In the optical receiver 503 shown in FIG. 36, only one semiconductor optical amplifier device 523 is used as a pre-amplifier. Two or more pre-amplifiers can be used, or no pre-amplifiers may be used, but only if the optical receiver 503 functions as such.

Figure 34:
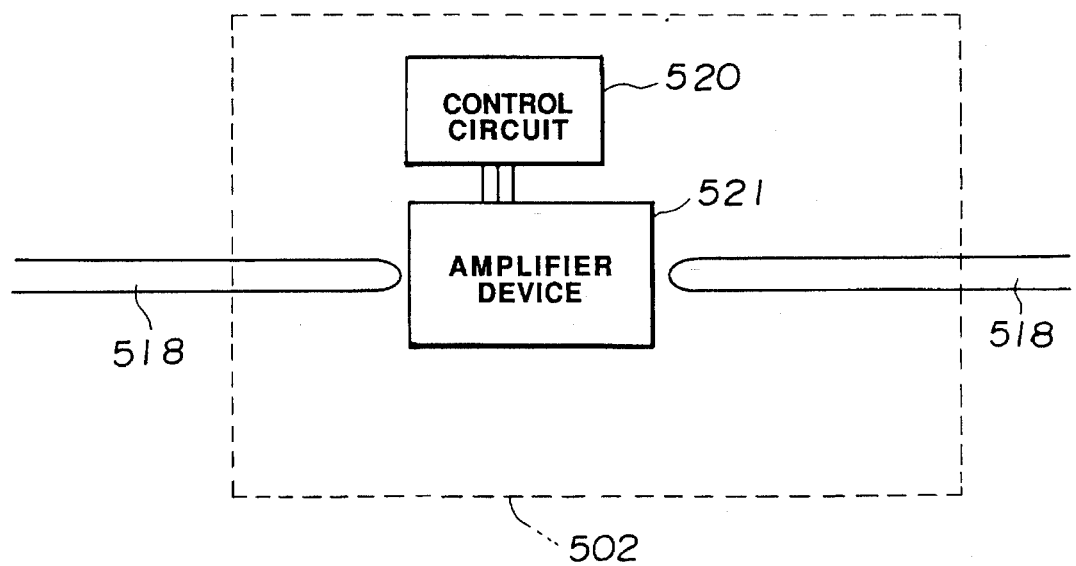
FIG. 34 is a block diagram of a semiconductor optical amplifying apparatus used in an optical communication system.

The semiconductor light amplifying apparatus 502 can be constructed as shown in FIG. 34 by using a semiconductor optical amplifier device of the present invention. In FIG. 34, reference numeral 518 designates a lensed fiber, reference numeral 520 designates a control circuit and reference numeral 521 designates a semiconductor optical amplifier device of the present invention. The control circuit 520 is indicated in a form including the control circuit 23 of the above embodiments, a power source and so forth, and performs the control of APC amplification. The optical signal from the optical fiber 504 is coupled to the waveguide of the semiconductor optical amplifier device 521 through the lensed fiber 518. The optical signal input into the waveguide of the amplifier device 521 is APC-amplified, and its output light is again output into the round-tip fiber 518 to be coupled to the optical fiber 504 of the transmission line. The lensed fiber 518 is used to effectively couple the light from the optical fiber 504 to the waveguide of the semiconductor optical amplifier device 521 and to effectively couple the output light from the waveguide to the optical fiber 504. There are other ways such as a lens for enhancing such coupling. Further, the semiconductor light amplifying apparatus 502 will function as well even if the tip of the fiber is not rounded, though the coupling efficiency is reduced.

The operation of the optical transmission system as shown in FIG. 28 will be described. In a case where one terminal equipment is connected to the optical transmitter 501, that is, in a case of a uni-directional communication between the terminal equipment in a one to one or one to N (N is a given integer) form, any communication access system can be adopted and a signal can be transmitted in accordance with any procedure and interval. In the case of a uni-directional N to N communication, a time division multiple access (TDMA), for example, can be used. This is a communication system in which a signal transmission line is divided with respect to time to provide a plurality of transmission lines. In this case, the control circuit 525 in the optical receiver 503 needs to have a function that judges the address information of the received signal and supplies a desired signal to a desired terminal equipment.

The control circuit 524 in the optical transmitter 501 needs to have a function that attaches an address signal to signals received from the terminal equipments and drives the semiconductor laser 522 in accordance with its signal system.

Ninth Embodiment

Figure 29:
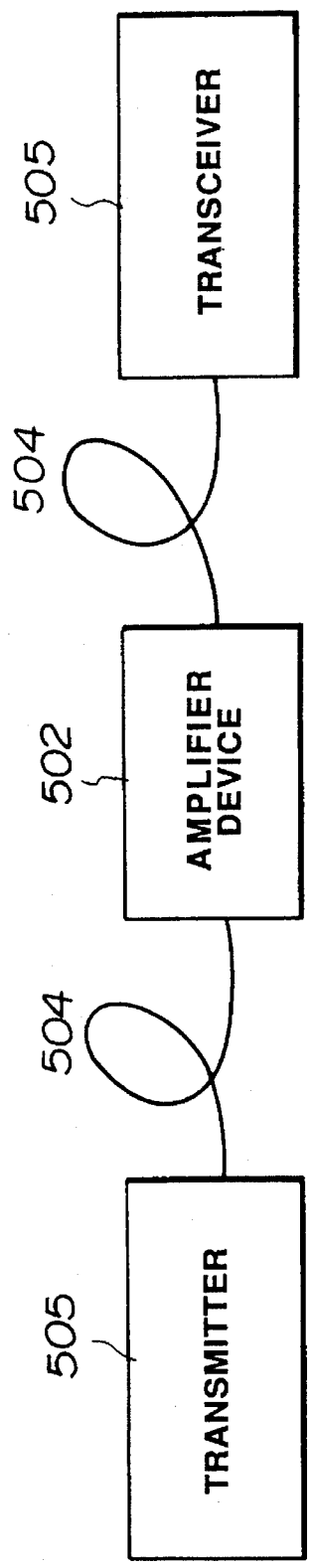
FIG. 29 is a block diagram of a ninth embodiment of a bi-directional optical communication system including a semiconductor optical amplifier device of the present invention.

FIG. 29 shows a bi-directional optical transmission system in which a semiconductor optical amplifier device of the above embodiments is used. In FIG. 29, reference numeral 505 designates an optical transmitter-receiver, reference numeral 502 designates a semiconductor optical amplifier device having the same structure as that shown in FIG. 28 and reference numeral 504 designates an optical fiber. The optical transmitter-receiver 505 has a structure in which the optical transmitter 501 and the receiver 503 of the eighth embodiment, for example, are combined. Namely, the output of the optical transmitter 501 and the input of the optical receiver 503 are combined into one by an optical branching-combining device.

Portions of the optical transmitter and receiver in the optical transmitter-receiver 505 are as described in the eighth embodiment. Further, the semiconductor light amplifying apparatus 502 is identical with that in the eighth embodiment. Therefore, explanations of those portions are omitted in this embodiment. As for the communication access system, that of the eighth embodiment can be applied with respect to respective directions.

Tenth Embodiment

Figure 30:
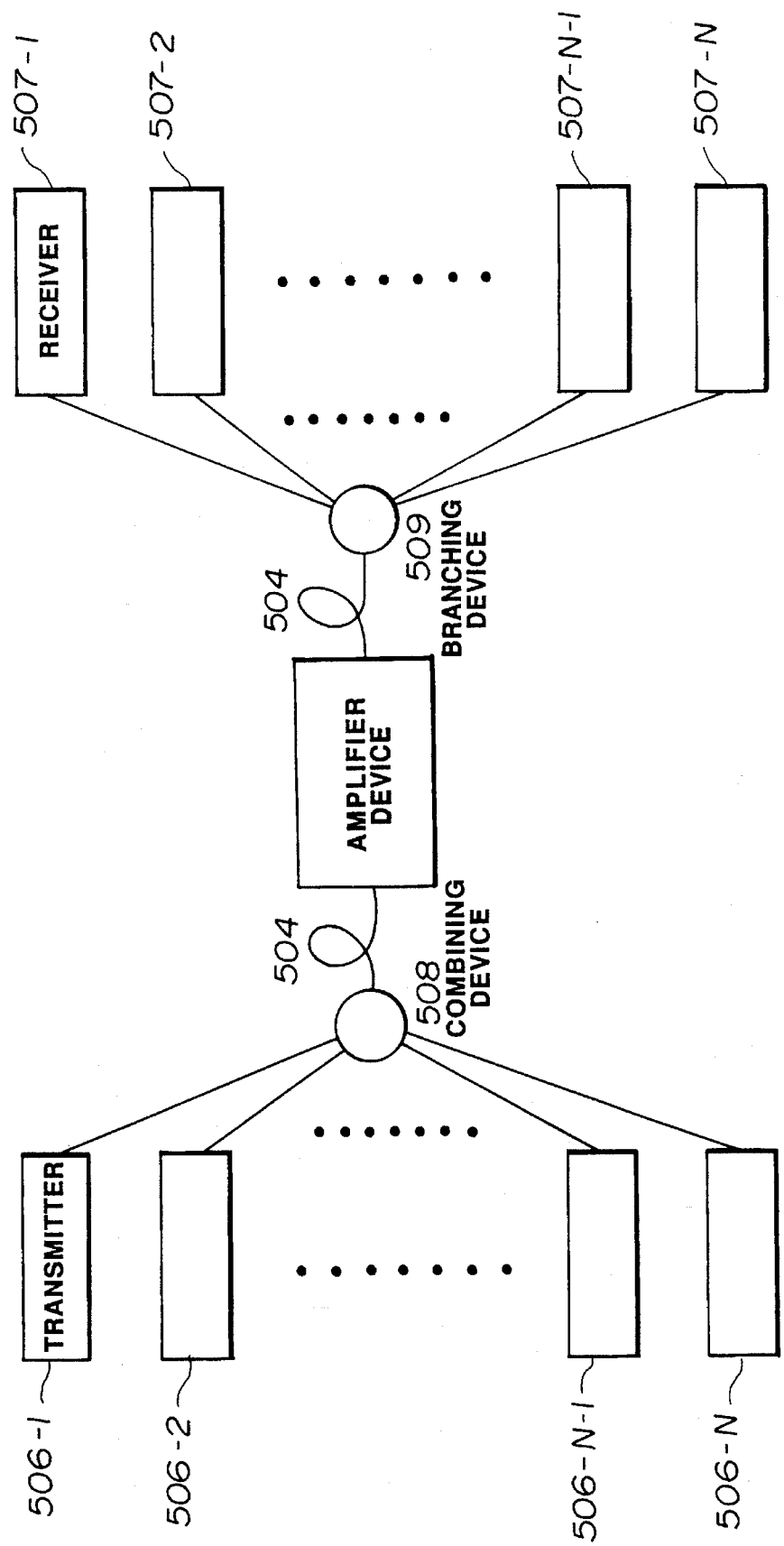
FIG. 30 is a block diagram of a tenth embodiment of a bi-directional N to N wavelength division multiplexing optical communication system including a semiconductor optical amplifier device of the present invention.

FIG. 30 shows a uni-directional N to N wavelength division multiplexing transmission system in which a semiconductor optical amplifier device of the above embodiments is used. In FIG. 30, reference numerals 506-1~506-N repectively designate optical transmitters, reference numeral 508 designates an optical combining device, reference numeral 509 designates an optical branching device and reference numerals 507-1~507-N respectively designate optical receivers. Further, similarly to other embodiments, reference numeral 504 designates an optical fiber and reference numeral 502 designates a semiconductor light amplifying apparatus. The optical transmitters 506-1~506-N respectively have structures as shown in FIG. 35. Semiconductor lasers 522 of the respective transmitters 506-1~506-N respectively oscillate at different wavelengths. The operation is the same as that described in the eighth embodiment.

The optical receivers 507-1~507-N respectively have structures as shown, for example, in FIG. 37. In FIG. 37, reference numeral 526 designates a photodetector, reference numeral 527 designates a control circuit, reference numeral 528 designates an optical band-pass Filter and reference numeral 523 designates a semiconductor optical amplifier device of the present invention (this is used as a pre-amplifier). The optical band-pass fitter 528 is adjusted so that only a wavelength of the optical transmitter 506-k is transmitted therethrough which corresponds to the optical receiver 507-k containing the optical band-pass filter 528. Thus, light signals of a plurality of wavelengths are transmitted through the transmission line from the optical transmitter 506-i to the optical receiver 507-i, and hence a plurality of transmission lines are equivalently formed. This transmission line is constructed by one transmission optical fiber 504 and the semiconductor light amplifying apparatus 502. The transmission access system of a transmission line of one wavelength constructed between the optical transmitter 506-i and the optical receiver 506-i is the same as that in the eighth embodiment. Further, in FIG. 30, the optical band-pass filter 528 in the optical receiver 507 can be omitted by replacing the optical branching device 509 by an optical demultiplexing device.

Eleventh Embodiment

Figure 31:
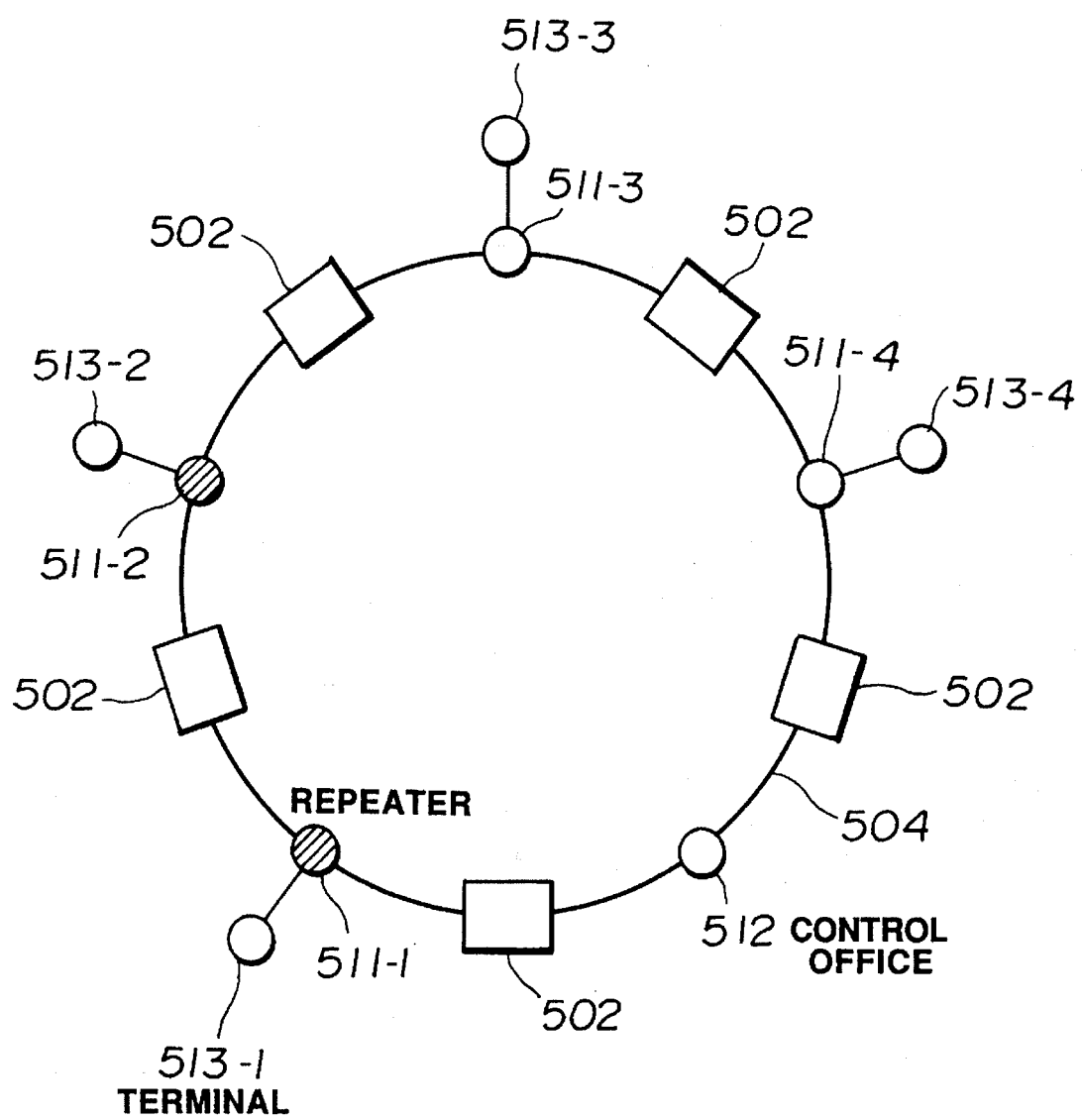
FIG. 31 is a block diagram of a eleventh embodiment of a loop type optical LAN including a semiconductor optical amplifier device of the present invention.

FIG. 31 shows a loop type optical LAN in which a semiconductor optical amplifier device of the above embodiments is used.

In FIG. 31, reference numerals 511-1~511-4 respectively designate reproduction repeaters, and reference numeral 512 designates a control office. Reference numerals 513-1~513-4 respectively designate terminal equipments, reference numeral 504 designates an optical fiber, and reference numeral 502 designates a semiconductor light amplifying apparatus (explained in the eighth embodiment), A conventional access system such as a token ring system can be utilized for the operation of the loop type LAN.

In this embodiment, the semiconductor light amplifying apparatus 502, using the semiconductor optical amplifier device of the present invention, is used between the repeaters 511 as a booster amplifier, so that the reproduction repeater 511-i can always receive the optical signal transmitted from the reproduction repeater 511-(i-1) at a constant power.

The reproduction repeater 511 generally includes a photodetector (O/E converter), semiconductor laser (E/O converter) and an electric reproduction repeater. Also in this reproduction repeater 511, the semiconductor optical amplifier device of the present invention can be used as a pre-amplifier to be disposed before the photodetector or as a booster amplifier for the semiconductor laser. An input power into the photodetector and an output power from the repeater 511 can be made more stable than those obtained when the semiconductor optical amplifier device of the present invention is not used, by using this semiconductor optical amplifier device in its APC operation in the repeater 511.

One semiconductor light amplifying apparatus 502 is used between the reproduction repeaters 511, but two or more

Twelfth Embodiment

Figure 32:
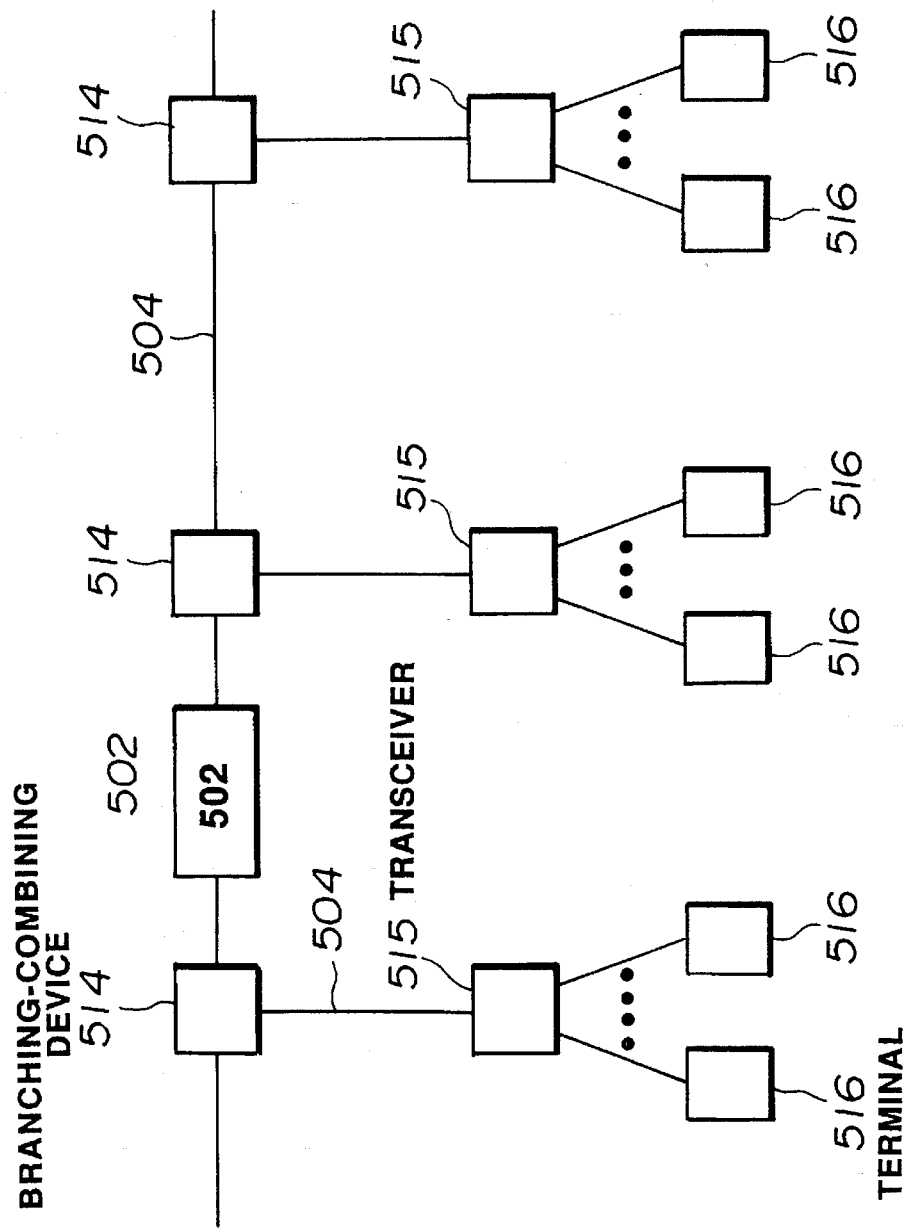
FIG. 32 is a block diagram of a twelfth embodiment of a bus type optical LAN including a semiconductor optical amplifier device of the present invention.

FIG. 32 shows an embodiment of a bus type optical LAN in which a semiconductor optical amplifier device of the above embodiments is used.

In FIG. 32, reference numeral 514 designates a light branching-combining device, reference numeral 515 designates an optical transceiver, reference numeral 516 designates terminal equipment, reference numeral 502 designates a semiconductor light amplifying apparatus (this is explained in the eighth embodiment), and reference numeral 504 designates an optical fiber.

Figure 38:
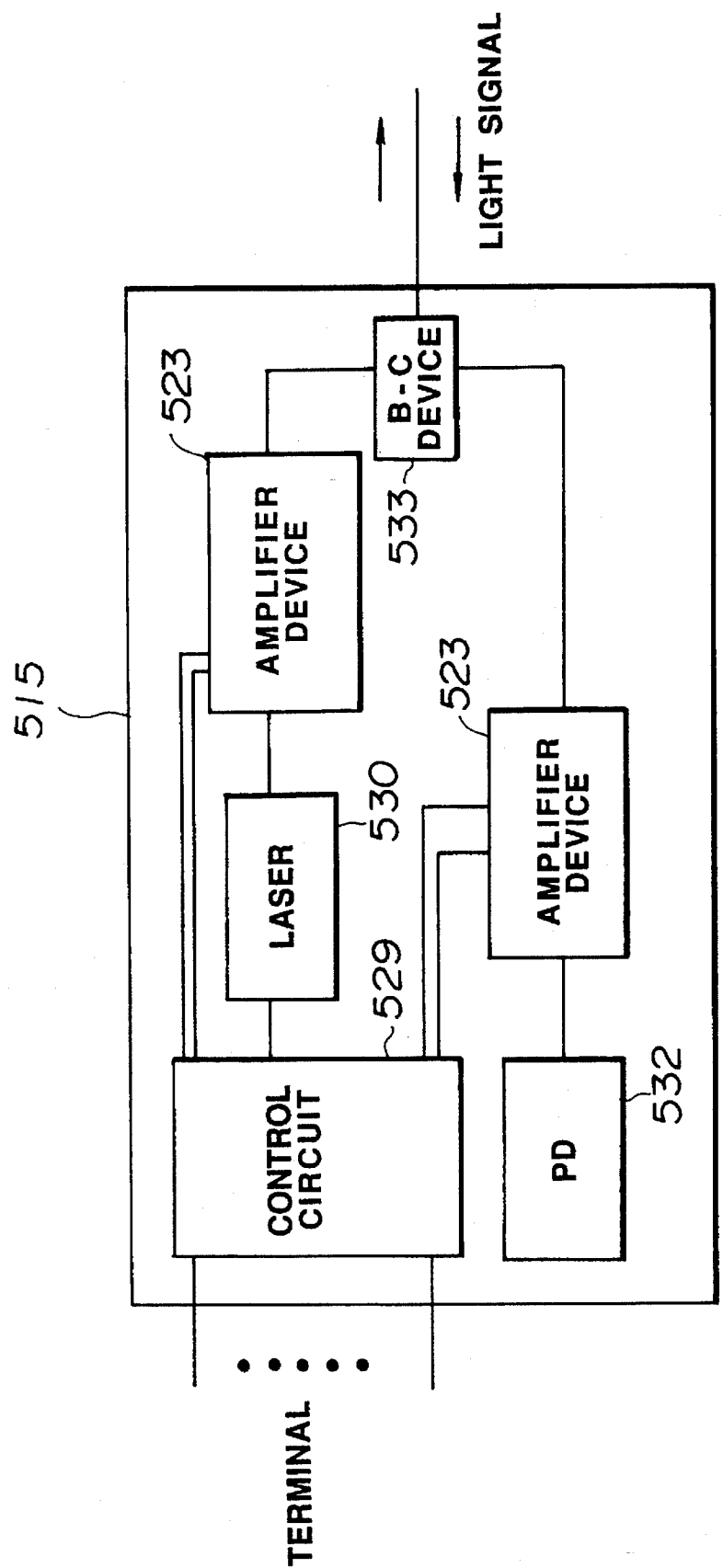
FIG. 38 is a block diagram of an optical transceiver used in a bus type optical LAN.

The optical transceiver 515 has the structure as shown in FIG. 38. In FIG. 38, reference numeral 529 designates a control circuit, reference numeral 530 designates a semiconductor laser, reference numeral 532 designates a photodetector, reference numeral 533 designates a light branching-combining device and reference numeral 523 designates a semiconductor optical amplifier device of the present invention.

In this bus type optical LAN, a CSMA/CD (carrier sense multiple access with collision detection) system, for example, is used as an access system. A token passing, TDMA and so forth can also be used.

A communication demand from the terminal equipment 516 is transmitted to the optical transceiver 515, and the control circuit 529 in the transceiver 515 drives the semiconductor laser 530 in accordance with the communication system of the optical LAN to transmit optical pulses (optical digital signals). The transmitted optical signal is APC-amplified by the semiconductor optical amplifier device 523, transmitted to the light branching-combining device 514 through the light branching-combining device 533 and the signal is transmitted to the optical fiber 504. The semiconductor light amplifying apparatus 502 is arranged in some places on the optical fiber 504, and the optical signal is APC-amplified therein. On the other hand, in a signal receiving procedure, the light signal transmitted through the optical fiber 504 is branched by the light branching-combining device 514 to be input into the optical transceiver 515. The light signal input into the optical transceiver 515 is branched by the light branching-combining device 533, APC-amplified by the semiconductor optical amplifier device 523 and is received by the photodetector 532 to be converted to an electric signal. The shaping and reproduction of the electric signal is controlled in the control circuit 529, and the signal is supplied to the terminal equipment 515.

In this embodiment, the semiconductor optical amplifier device 523 of the present invention in the optical transceiver 515 is used as a booster amplifier and pre-amplifier. A plurality of the amplifier devices can be used, or no amplifier devices can be used as well. Further, at least one semiconductor light amplifying apparatus 502 on the optical fiber 504 can be disposed in any place between the light branching-combining devices 514, or the amplifying apparatus 502 can be disposed in any manner.

Thirteenth Embodiment

Figure 33:
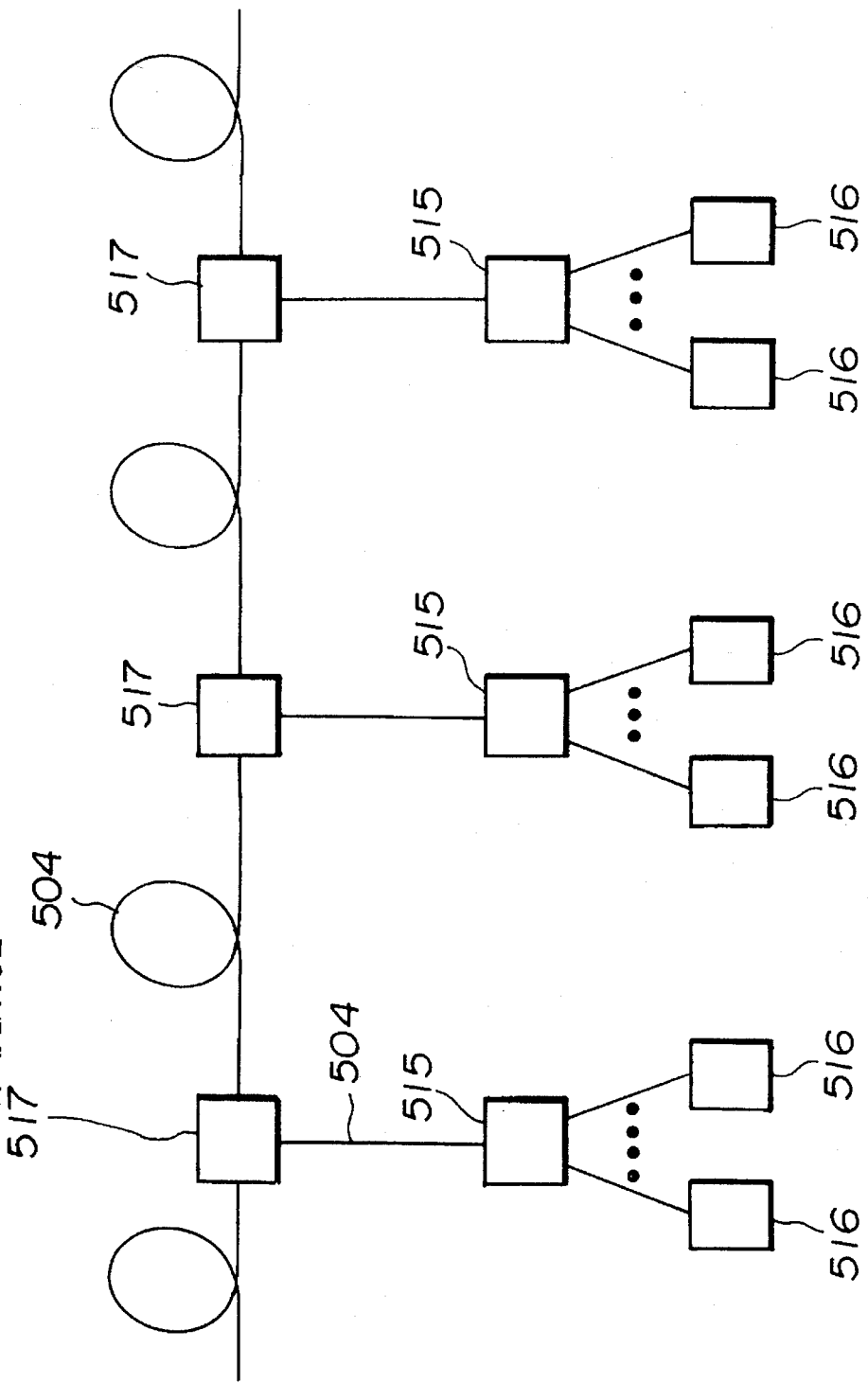
FIG. 33 is a block diagram of a thirteenth embodiment of another bus type optical LAN including a semiconductor optical amplifier device of the present invention.

FIG. 33 shows an embodiment of a communication system in which a light branching-combining device 517, containing an optical amplifier device for attaining an amplification function is used in place of the light branching-combining device 514 on the optical fiber 504 of the twelfth embodiment.

Figure 39:
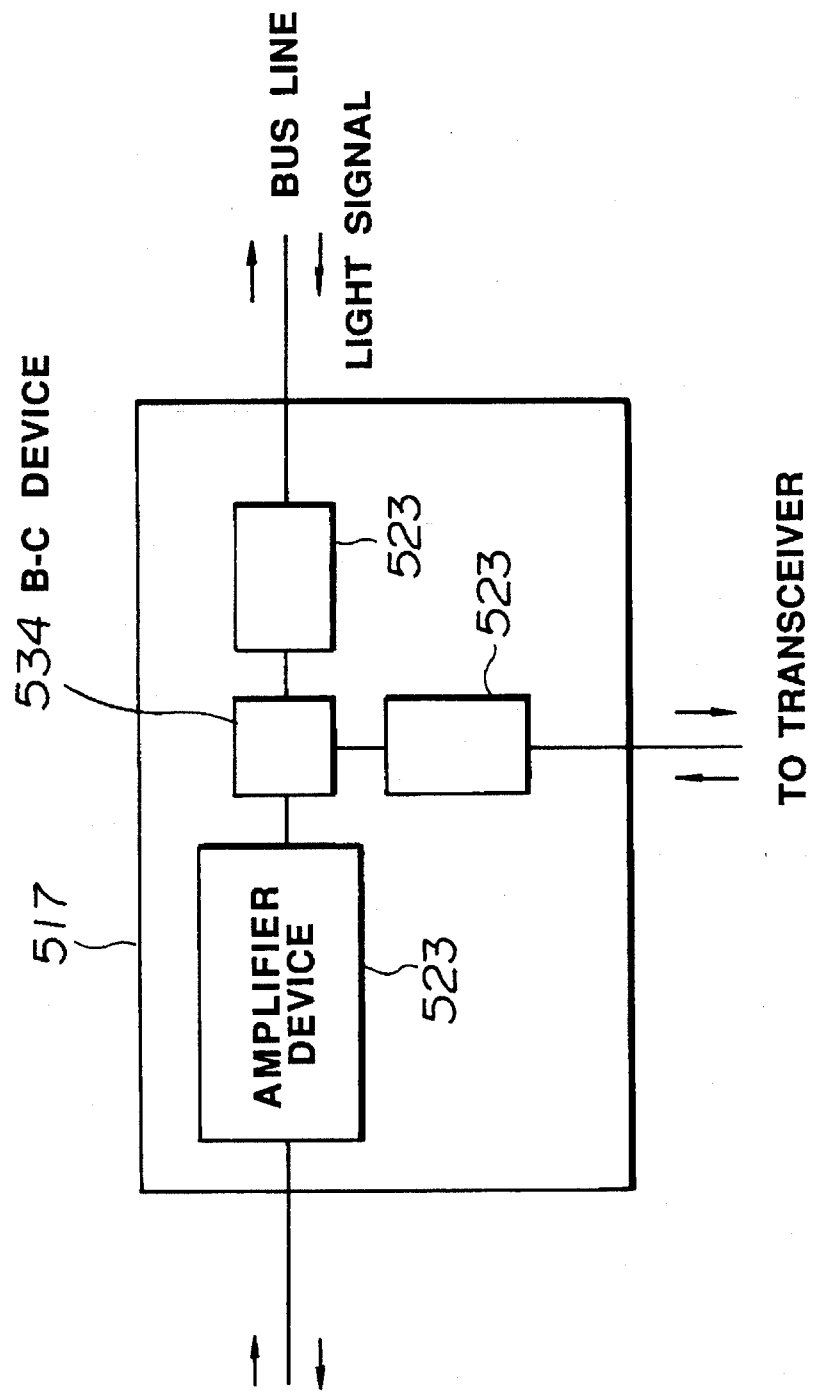
FIG. 39 is a block diagram of an optical branching-combining device with a built-in semiconductor optical amplifier device used in a bus type optical LAN.

The light branching-combining device 517 with the optical amplifier device built in can be constructed in a manner as shown in FIG. 39. As shown in FIG. 39, the semiconductor optical amplifier devices 523 of the present invention are disposed in respective input portions (three places) of a light branching-combining device 534. The communication or access system is the same as that of the twelfth embodiment. In this embodiment, the semiconductor light amplifying apparatus 502 can be disposed on the optical fiber 504 between the light branching-combining devices 517 containing the semiconductor optical amplifier device when necessary.

In the eighth to thirteenth embodiments, the semiconductor optical amplifier device of the fourth to seventh embodiments is used in the optical communication system. However, this amplifier device can be used in any optical communication system in which light is used as an information transmitting medium.

As described in the semiconductor optical amplifier devices of the foregoing embodiments, a portion in which a great both-end voltage change occurs at the time of optical amplification is separated from other portions, so that the voltage change can be detected with a greater value than the prior art devices. As a result, the APC operation, for example, can be more readily controlled than the prior art devices.

Further, there are arranged, in the above-discussed semiconductor optical amplifier devices, an active region that has a gain over a relatively narrow wavelength range and an active region that has a gain over a relatively wide wavelength range. The both-end voltage change in the former active region at the time of optical amplification is detected to judge whether wavelengths of the amplified light contain a predetermined wavelength. Therefore, the wavelength range of the amplified light can be known by the same optical system as the prior art, without causing any loss to a light signal and increasing the number of optical components.

The detection result obtained from the both-end voltage change due to the amplified light can be used for various controls.

Fourteenth Embodiment

Figure 1:
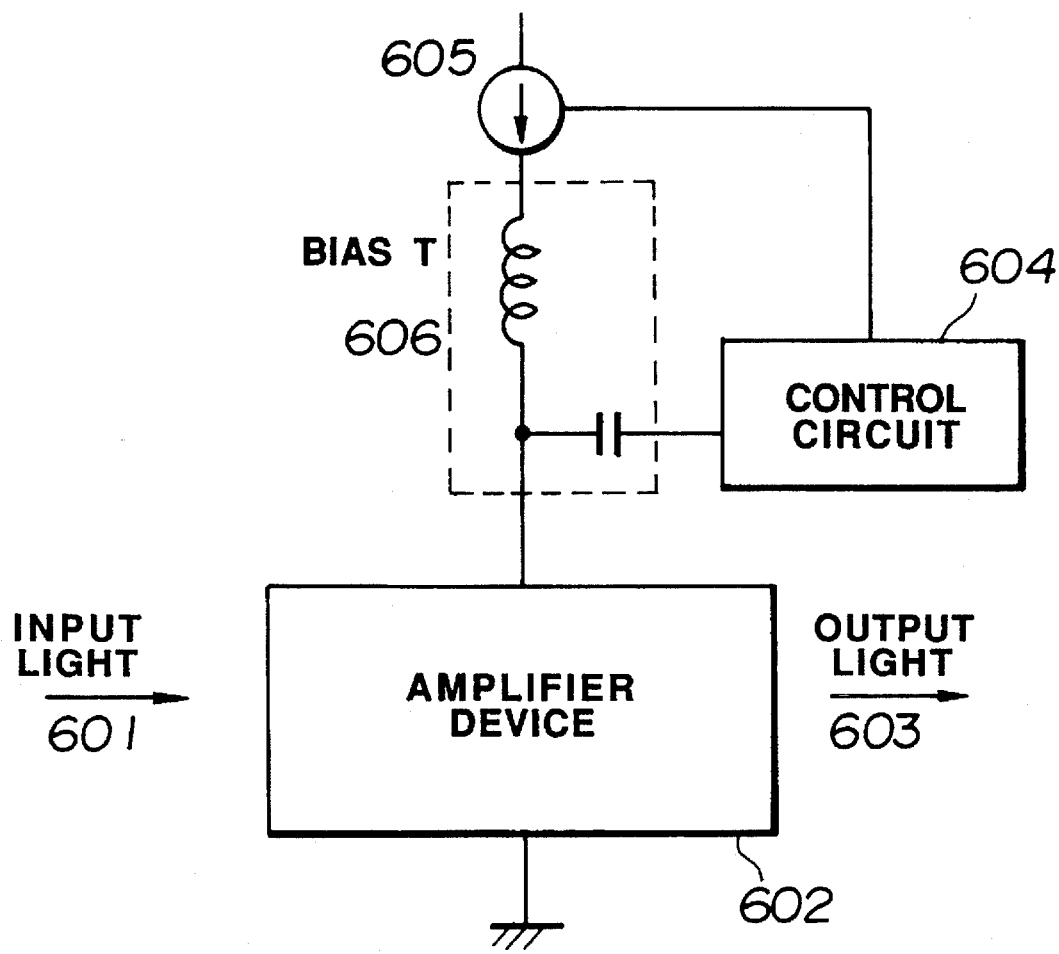
FIG. 1 is a schematic view showing the APC operation of a prior art optical amplifier device.
Figure 2:
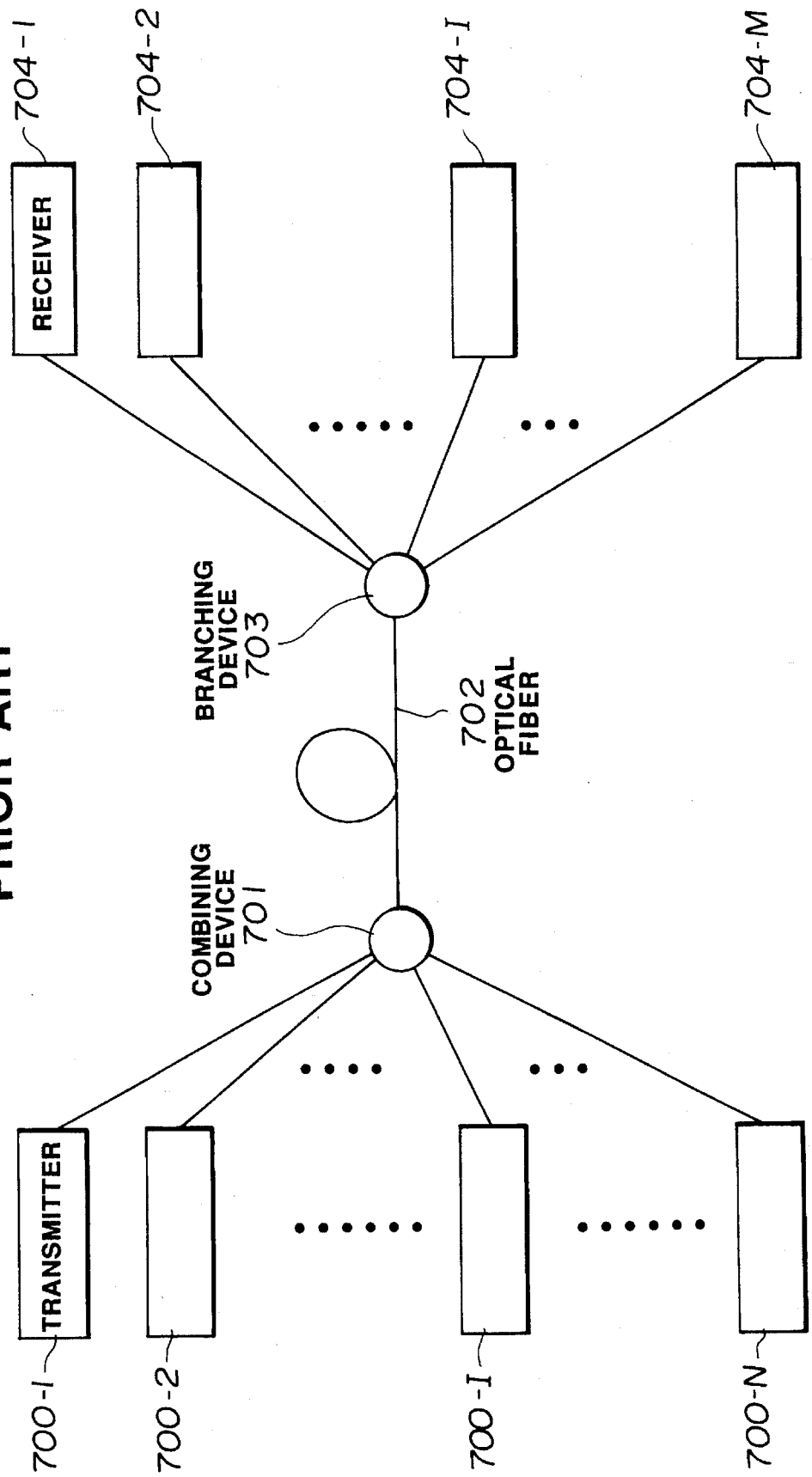
FIG. 2 is a view showing an example of prior art wavelength division multiplexing optical communication systems.
Figure 3:
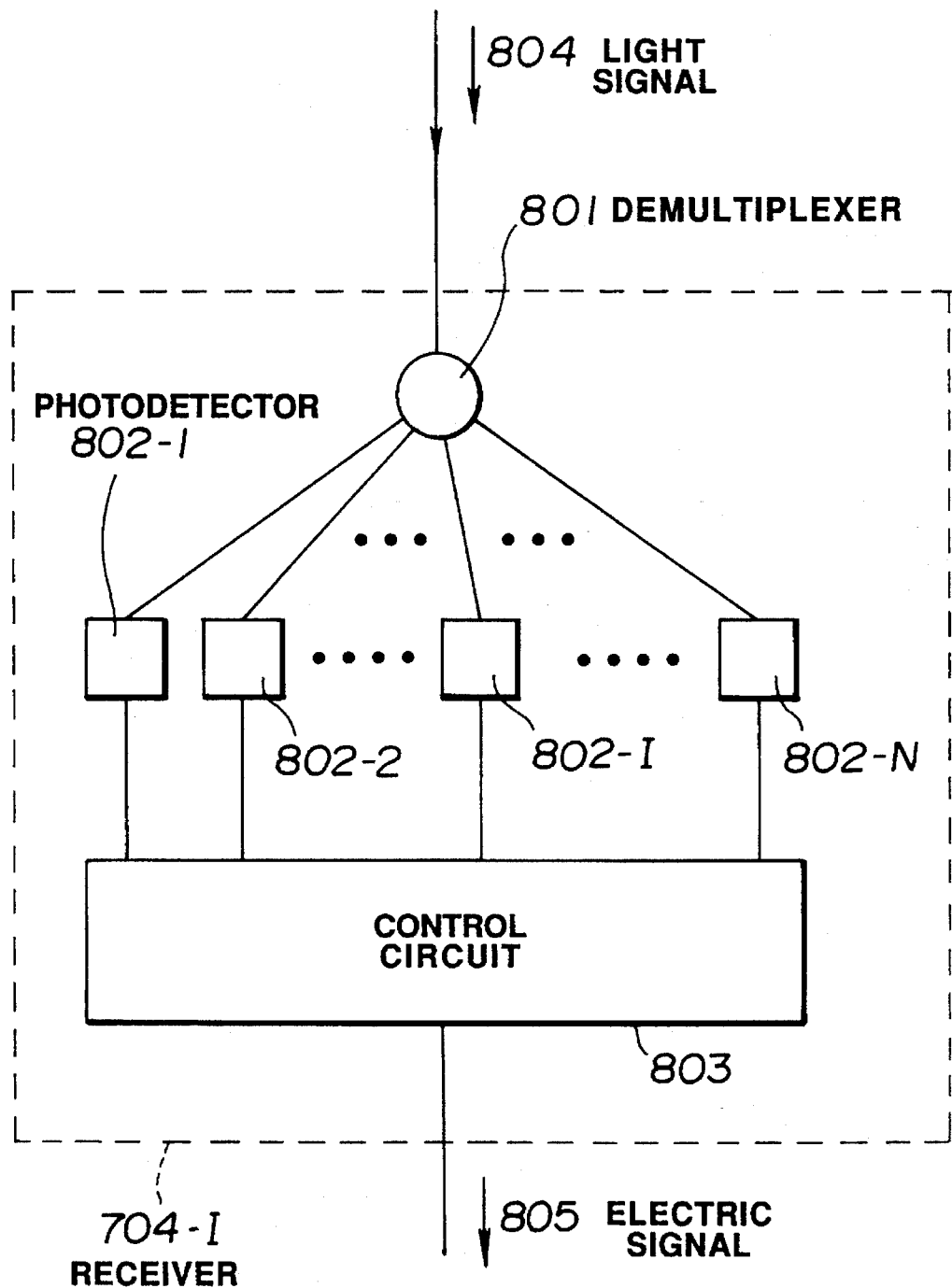
FIG. 3 is a view showing an example of a prior art optical receiver which includes a demultiplexer.
Figure 4:
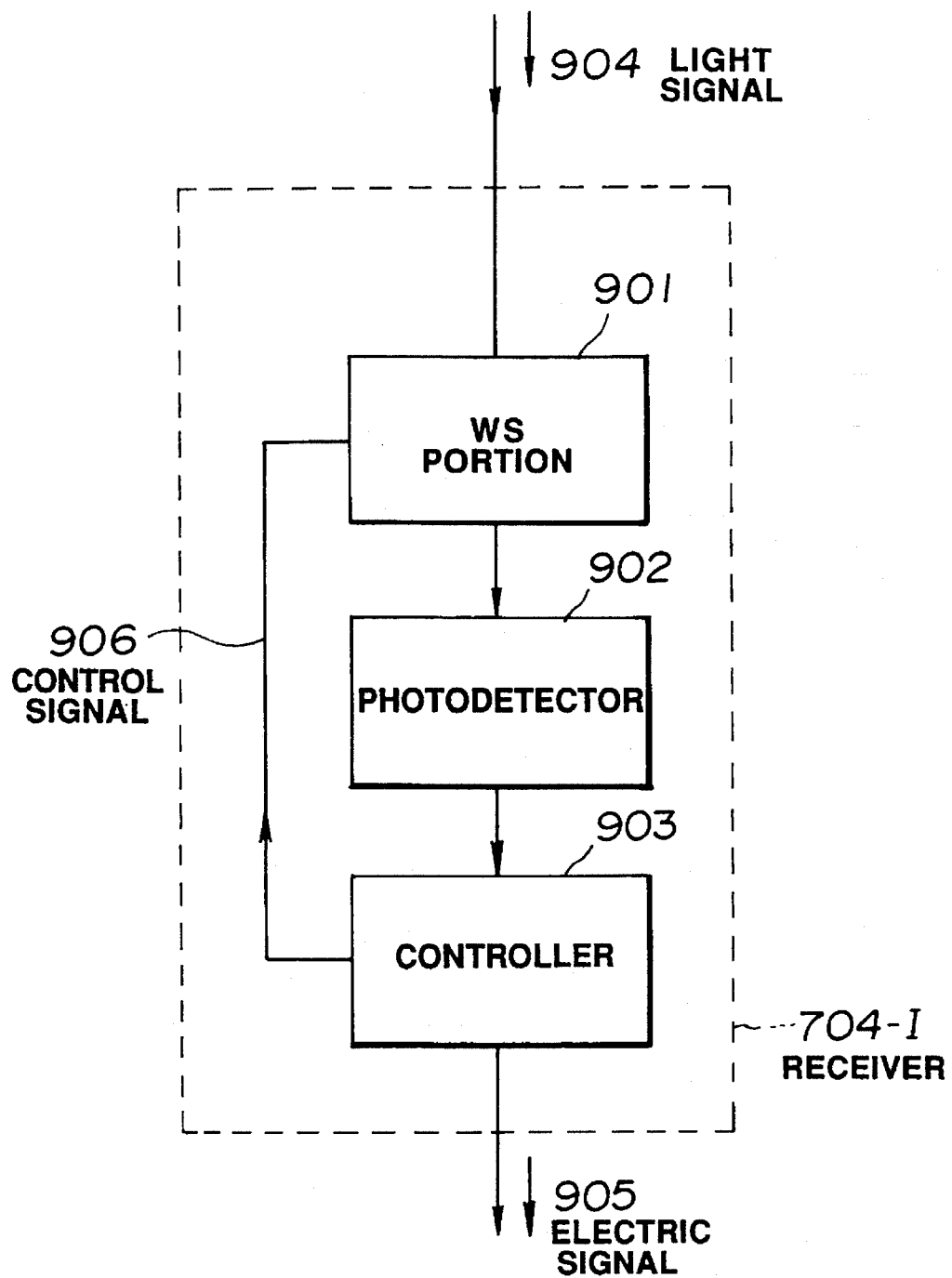
FIG. 4 is a view showing an example of a prior art optical receiver which includes a wavelength selection portion.
Figure 40:
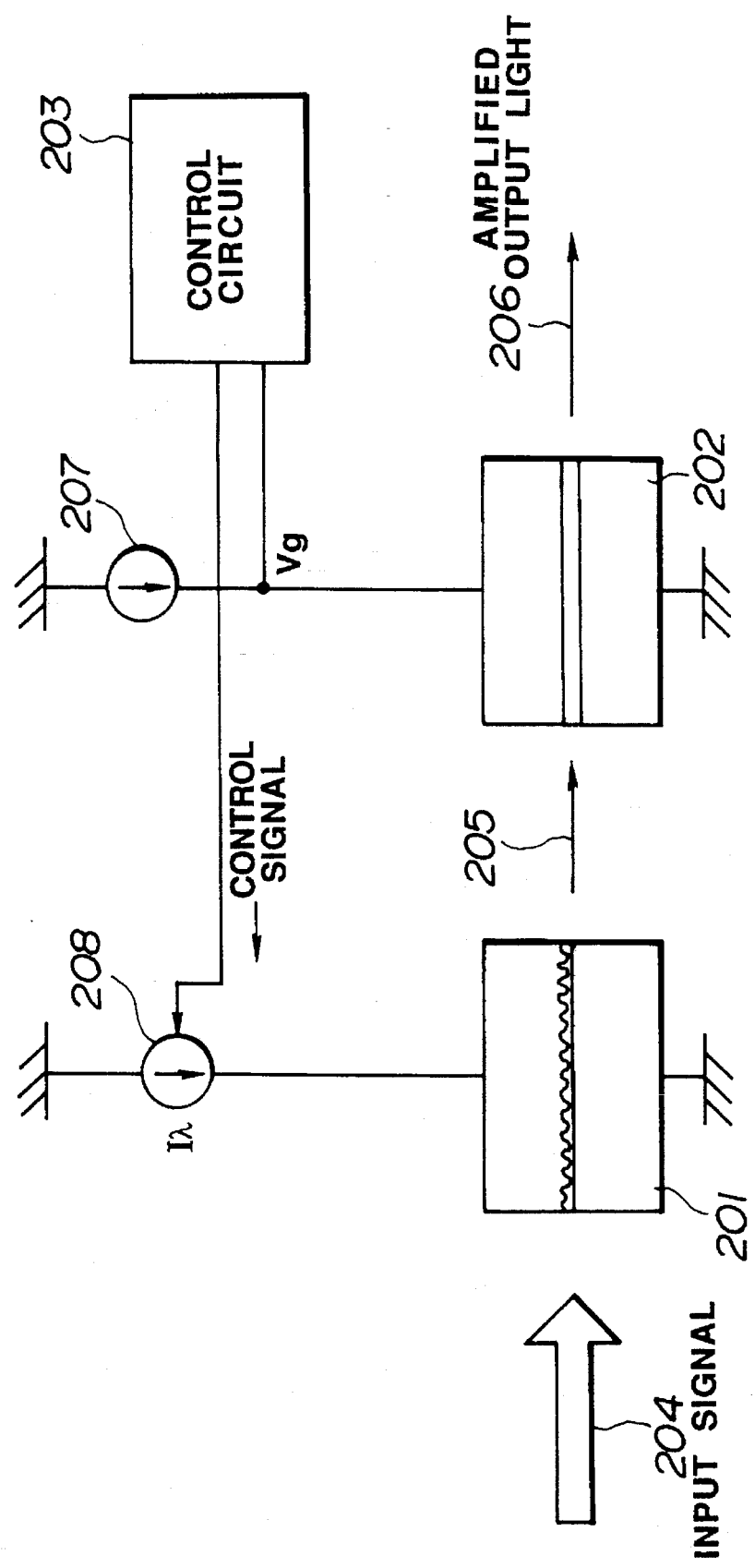
FIG. 40 is a schematic view showing a fourteenth embodiment of the present invention.

FIG. 40 shows a fourteenth embodiment of the present invention which is directed to a tunable filter device. In FIG. 40, reference numeral 201 designates a tunable band pass filter, and reference numeral 202 designates a semiconductor optical amplifier device. Reference numeral 203 designates a control circuit, and reference numeral 204 designates a wavelength-multiplexed input light signal. Reference numeral 205 designates an output light from the tunable bandpass filter 201, and reference numeral 206 designates an amplified output light from the semiconductor optical amplifier device 202. Reference numeral 207 designates a source for driving the semiconductor optical amplifier device 202, and reference numeral 208 designates a source for controlling a transmission wavelength of the tunable band pass filter 201. The structure shown in FIG. 40 corresponds to the prior art wavelength selecting portion (WS portion) 901 shown in FIG. 4.

Structures and operations of the respective components will be described before explaining the operation of the fourteenth embodiment. A so-called phase-shift type (its grating includes a phase transient area for improving a dynamic single mode characteristic) DFB-LD (distributed feedback-laser diode) filter can be used as the tunable band pass filter 201. The phase shift type DFB-LD filter may be what is shown in FIG. 8 of "Progress in Semiconductor Tunable Wavelength Filters" disclosed in Electronics Information Communication Academy Journal C-1, Vol. J 73-C-I, No. 5 (pp. 347–353, May, 1990) by T. Numai. The phase-shift-controlled DFB LD filter shown in FIG. 8 of this article includes two active regions respectively having active layers and a phase control region interposed therebetween. Those regions are arranged in a resonance direction. A grating is formed in the filter. A light at a predetermined wavelength of a light incident on one end surface of the filter is diffracted by the grating and causes a laser resonance to be output through the other end surface of the filter. When the amount of an injected current into the phase control region is changed, the refractive index of the phase control region varies and the phase of the light diffracted by the grating is shifted. The resonance mode is changed in accordance with this phase shift, so that the wavelength of the tight emerging from the filter alters. In such a tunable bandpass filter, the transmission peak wavelength can be changed within a range of 9.5 Å by property attaining the combination of a current injected into the active region and a current injected into the phase control or adjusting region.

As the semiconductor optical amplifier device 202, a travelling wave type semiconductor optical amplifier device (TWA) in which antireflection films are deposited on end surfaces of an ordinary semiconductor laser structure can be used. In this embodiment, a semiconductor laser of 1.5 μm wavelength band is a basic laser structure. The semiconductor optical amplifier device 202 has the feature that a voltage between both ends of its junction (both-end voltage) varies when an input light enters the device 202 in a constant-current operative state and the amplification operation is performed. The change in the both-end voltage can be measured more effectively as the amplification factor increases. This embodiment also utilizes this phenomenon.

Figure 41:
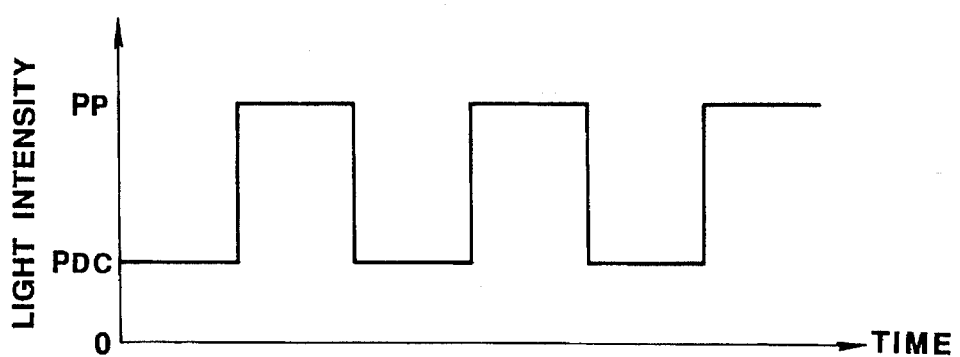
FIG. 41 is a view illustrating a shape of an input light signal varying with time.
Figure 42:
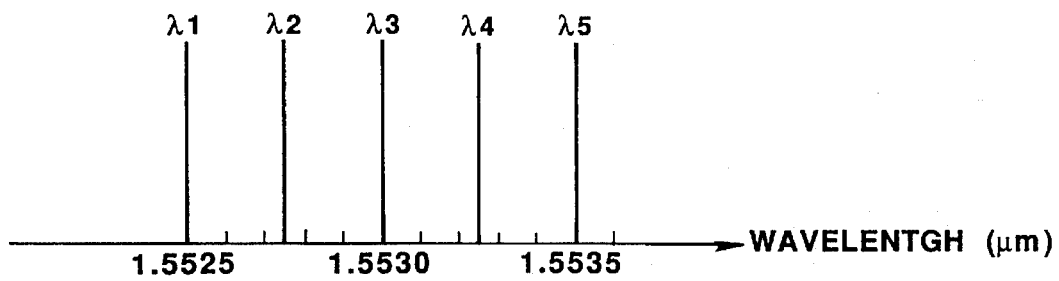
FIG. 42 is a view illustrating wavelengths constituting the input light signal.

The operation of the fourteenth embodiment will be described. First, details of a wavelength-multiplexed input signal carrying information will be described. The details of the wavelength-multiplexed signal are set in accordance with the communication system and so forth, but for readily explaining the operation of this embodiment, the wavelength-multiplexed signal consists of optical digital signals ($P_P$) having respective DC biases ($P_{DC}$) depending on respective wavelengths, as shown in FIG. 41. Five wavelengths $\lambda_1, \lambda_2, \lambda_3, \lambda_4$ and $\lambda_5$ are multiplexed with an interval of 0.00025 μm from $\lambda_1$=1.5525 μm, as shown in FIG. 42. When the DFB filter 201 is used, all the wavelengths used for optical communication are initially in a range of the stop band of the DFB filter 201. The input signal 204 is input into the tunable band pass filter 201, and the output light 205 is obtained in accordance with the transmission characteristic of the tunable band pass filter 201 which is determined by the operative condition at that time. The output light 205 is input into the optical amplifier device 202, and is amplified to be an amplified output light 206. At this time, a current Iλ from the source 208 that controls the transmission range of the tunable band pass filter 201 is set, for example, so that the transmission range is gradually scanned from a shorter wavelength side to a longer wavelength side. Thereby, as the output light 205, the input light signals 204 of plural wavelengths shown in FIG. 42 serially appear from the shorter wavelength side.

Figure 43:
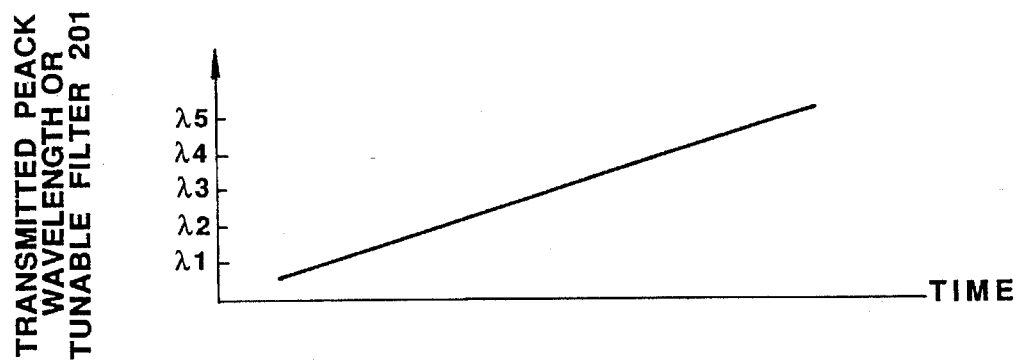
FIG. 43 is a view illustrating a transmission peak wavelength, which varies with time, of a tunable band pass filter of the fourteenth embodiment.
Figure 44:
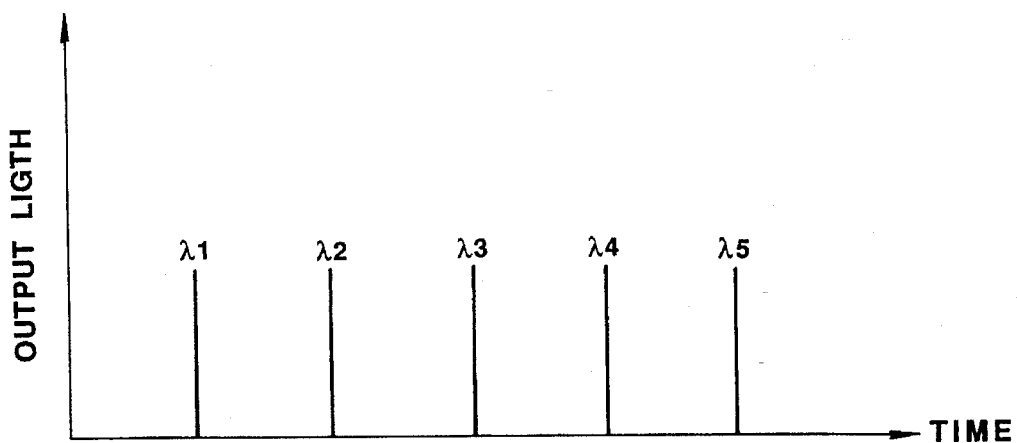
FIG. 44 is a view illustrating a wavelength, which varies with time, of an amplified output light of the fourteenth embodiment.
Figure 45:
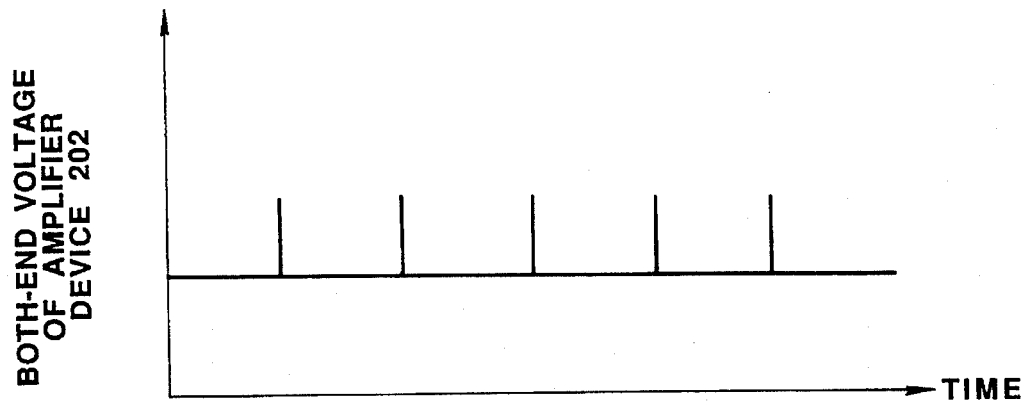
FIG. 45 is a view illustrating a both-end voltage, which varies with time, of an optical amplifier device of the fourteenth embodiment.

The above operation will be explained with reference to FIGS. 43, 44 and 45. FIG. 43 shows that the transmission wavelength of the tunable band pass filter 201 is changed with time from the shorter wavelength side to the longer wavelength side by adjusting the current Iλ. According to the operation illustrated in FIG. 43, the output light 205 from the tunable band pass filter 201 varies with a predetermined interval as shown in FIG. 44. The respective output light signals 205 have wavelengths that are coincident with the transmission wavelengths of the tunable band pass filter 201 at respective times. FIG. 45 shows the change in the both-end voltage of the optical amplifier 202 when the output light 205 illustrated in FIG. 44 is input into the optical amplifier 202. The optical amplifier 202 is driven in a constant current operative state, so that carriers are consumed for amplification operation when there exists an input light into the optical amplifier device 202 or the output light 205. As a result, the voltage applied to the optical amplifier device 202 increases as shown in FIG. 45.

Next, the operation will be described, including the control circuit 203. The optical amplifier device 202 is driven by the source 207 in the constant current state, and the voltage $V_g$ applied to the optical amplifier device 202 is monitored by the control circuit 203. The source 208 supplies a control current to the tunable band pass filter 201 for controlling its transmission wavelength, and the amount of the control current is controlled by the control circuit 203.

Information indicating which channel should be selected is given to the control circuit 203 from the exterior. As described above, the control circuit 203 supplies the control signal to the source 208, so that the transmission center wavelength of the tunable band pass filter 201 varies from the shorter wavelength side to the longer wavelength side. While supplying the control signal to the source 208, the control circuit 203 monitors the change in the both-end voltage $V_g$ of the optical amplifier device 202 and recognizes which channel is being transmitted. The control circuit 203 supplies the control signal to the source 208 when the number of transmitted channels is coincident with the order of selected channel given to the control circuit 203. Thus, the scanning of the transmission center wavelength of the tunable band pass filter 201 is stopped and fixed there. In this manner, the wavelength selection is performed, and the signal of the selected wavelength is detected by a photodetector in a receiver.

Fifteenth Embodiment

FIG. 46 shows a fifteenth embodiment of the tunable filter device of the present invention. In FIG. 46, the same members as those of the fourteenth embodiment are designated by the same reference numerals. Namely, there are provided a tunable band pass filter 201, an optical amplifier device 202, a control circuit 203 and sources 207 and 208. Further, reference numeral 204 designates an input signal, reference numeral 206 designates an amplified output signal, reference numeral 209 designates an amplified light from the optical amplifier device 202 and reference numeral 210 designates a reflected amplified light that is a reflected light of the amplified light 209 from the tunable band pass filter 201.

Similarly to the fourteenth embodiment, the coupling means for coupling the signal light 204 to the tunable band pass filter 201 and the amplifier device 202 are omitted in FIG. 46, but the signal light 204 can be effectively coupled thereto by using a lens or the like.

The operation of the fifteenth embodiment will be described. The amplifier device 202 is operated in a constant-current operative state by the source 207. The transmission center wavelength of the tunable band pass filter 201 is controlled by the amount of a current Iλ from the source 208. The input signal light 204 is amplified by the amplifier device 202 to be the amplified light 209, and input into the tunable band pass filter 201. Light of wavelengths other than the transmission wavelength of the tunable band pass filter 201 is reflected thereby to be the reflected amplified light 210, and the light of the transmission wavelength is transmitted therethrough to be the amplified output light 266. The reflected amplified light 210 is again input into the optical amplifier device 202. Here, the DFB filter 201 is initially set so that all the wavelengths used for the wavelength division multiplexed transmission fall within the stop band of the DFB filter 201.

Figure 47A:
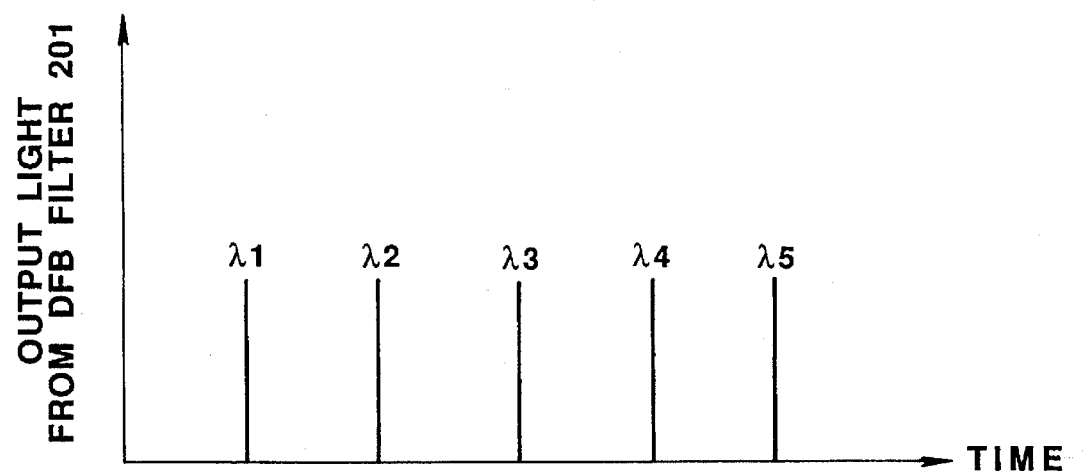
FIG. 47A is a view illustrating a wavelength, which varies with time, of ouput light from a DFB filter of the fifteenth embodiment
Figure 47B:
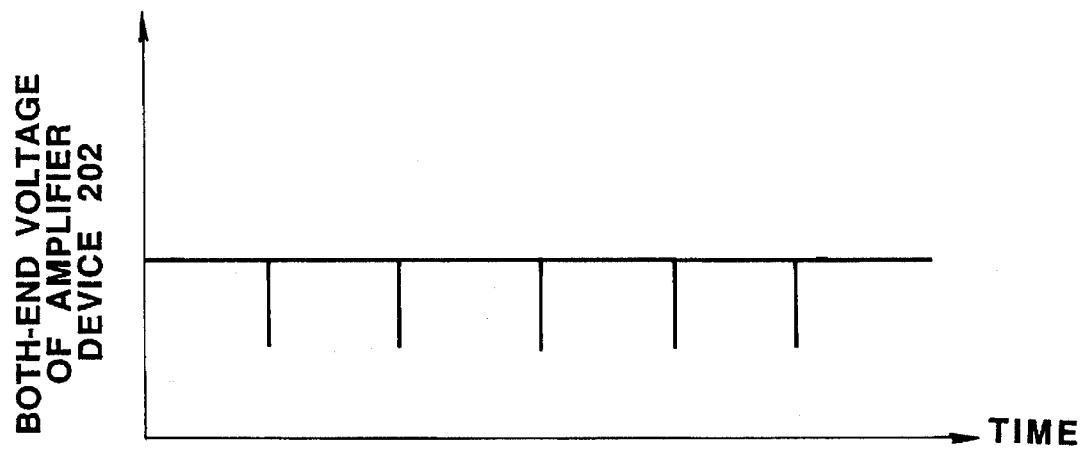
FIG. 47B is a view illustrating a both-end voltage, which varies with time, of an optical amplifier device of the fifteenth embodiment.

At this time, the voltage applied to the amplifier device 202 differs between times when the numbers of light signals at different wavelengths constituting the input light 204 and the reflected amplified light 210 are the same and when these numbers are different (i.e., when light at one wavelength is transmitted through the tunable filter 201, and not reflected thereby). In this embodiment, the wavelength number of the input light 204 is five. The voltage becomes lower when those numbers are different from each other. The output from the DFB filter 201 at this time is illustrated in FIG. 47A (this figure corresponds to FIG. 44), and the both-end voltage change of the optical amplifier device 202 is illustrated in FIG. 47B (this figure corresponds to FIG. 45). The control circuit 203 detects the voltage change, and thereby learns whether the signal light is transmitted through the tunable band pass filter 201 at that time. In contrast to the fourteenth embodiment, the voltage of the amplifier device 202 decreases when light of one wavelength of the multiplexed input signal light 204 is transmitted through the band pass filter 201 to be the amplified output light 206. In the fourteenth embodiment, this voltage increases at this time. Therefore, the tunable band pass filter 201 can be adjusted so that light at a predetermined wavelength is transmitted therethrough, by controlling in approximately the same manner as the fourteenth embodiment. For the rest, this embodiment is the same as the fourteenth embodiment.

Sixteenth Embodiment

Figure 48:
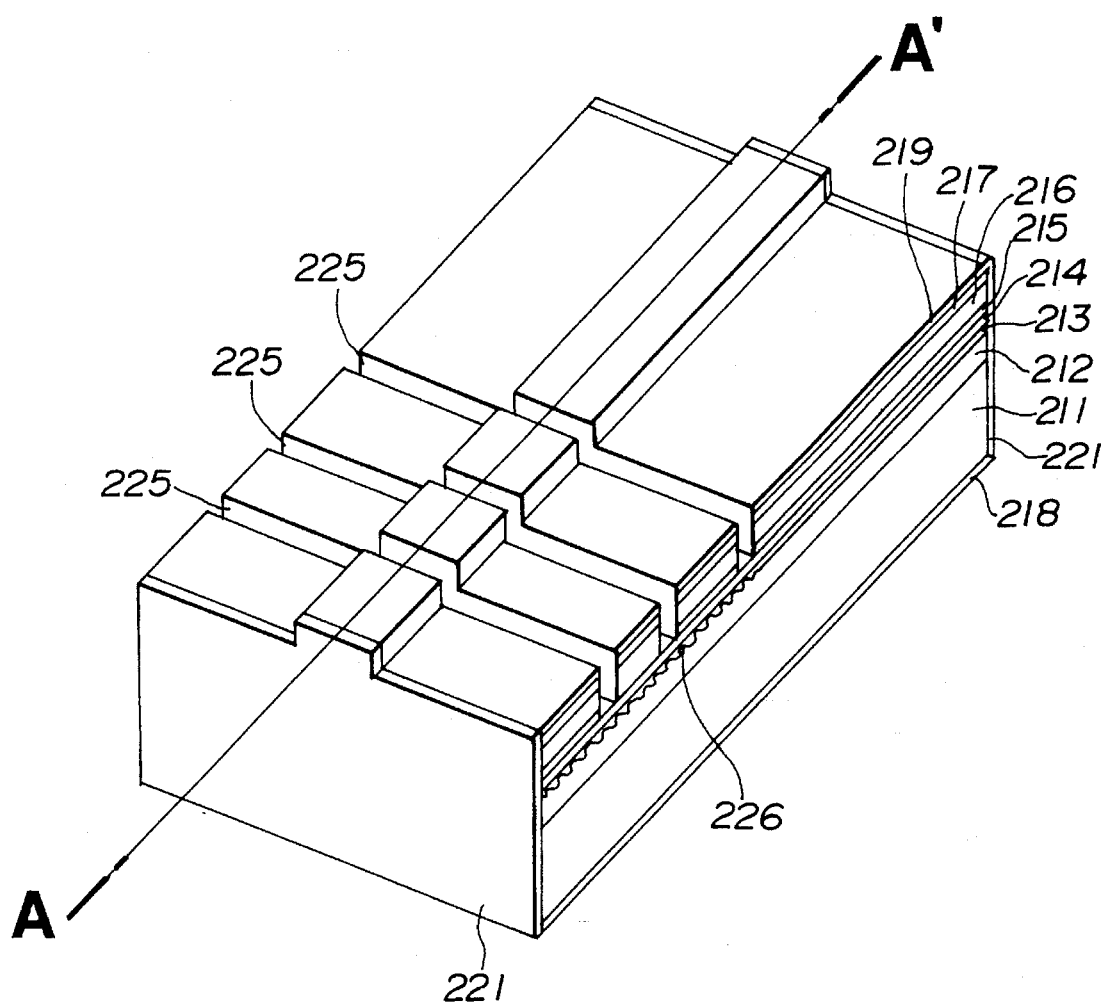
FIG. 48 is a perspective view showing a sixteenth embodiment of an integrated device of the present invention.
Figure 49:
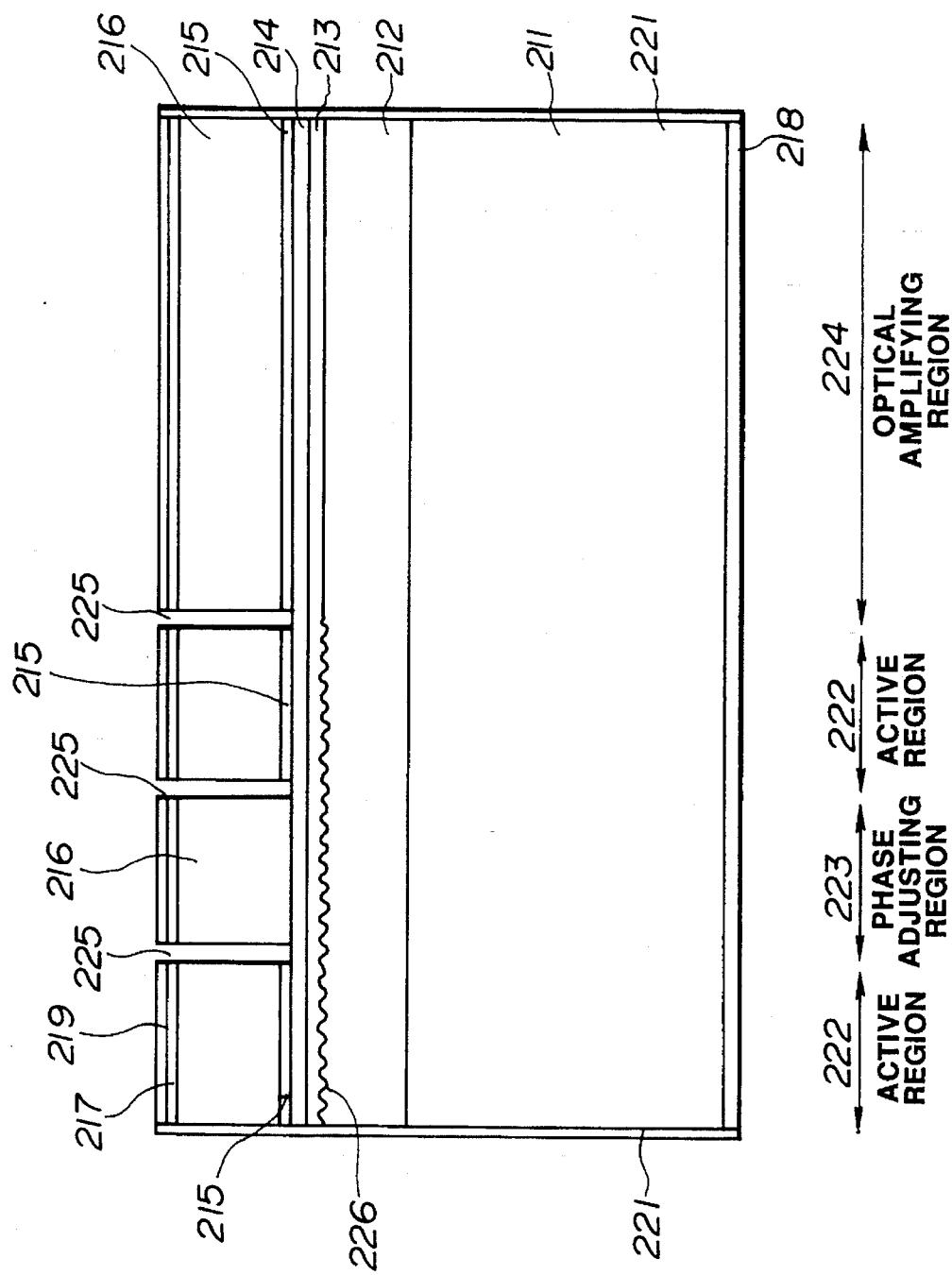
FIG. 49 is an A-A' cross-sectional view of FIG. 48.
Figure 50:
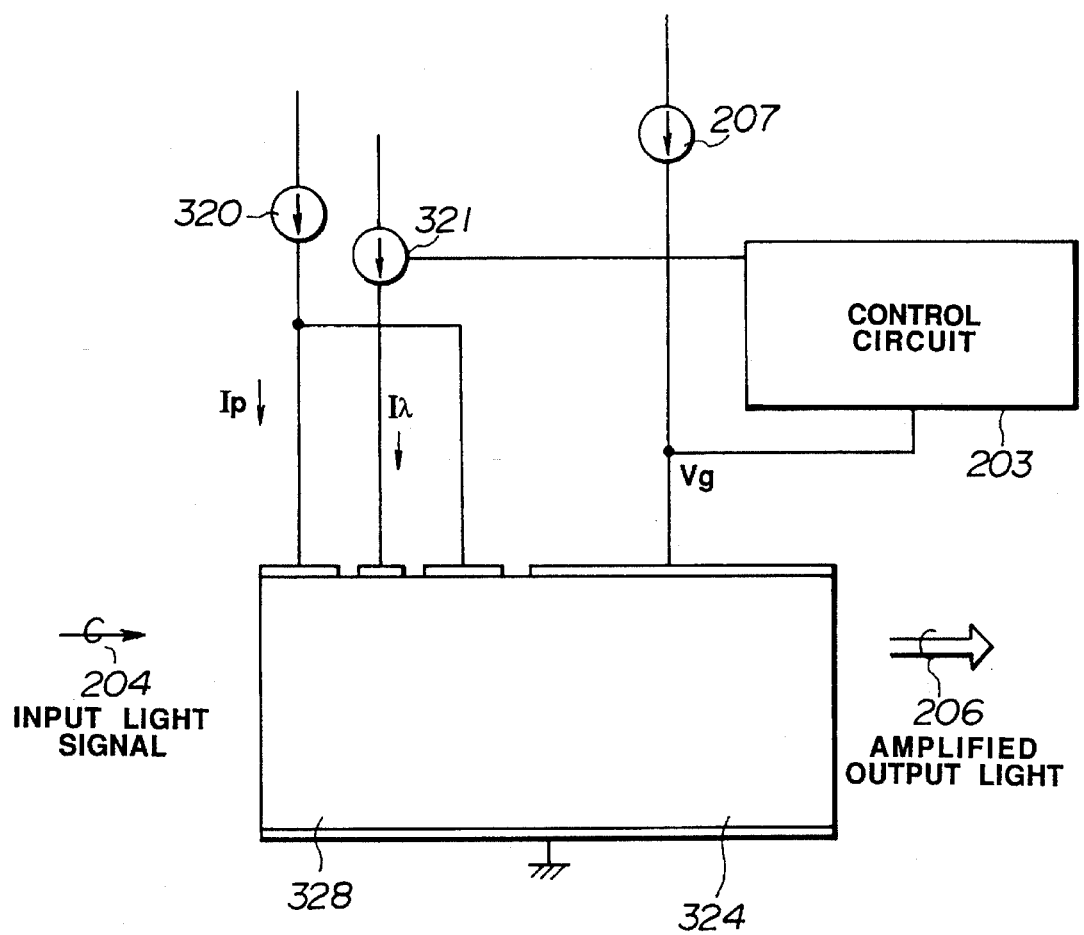
FIG. 50 is a view showing a use example of the device of FIG. 48.

FIGS. 48, 49 and 50 show an integrated device which achieves the function of the fourteenth or fifteenth embodiment. FIGS. 48 and 49 show a tunable band pass filter and an optical amplifier device that achieve the function of this embodiment. FIG. 50 shows a structural example at the time of use of this embodiment. In FIGS. 48 and 49 (FIG. 49 is an A'-A cross-sectional view of FIG. 48), reference numeral 211 designates a substrate of n-type InP, and reference numeral 212 designates a first cladding layer of n-type Inp which also functions as a buffer layer. Reference numeral 213 designates a light guide layer of undoped InGaAsP (its band-gap equivalent wavelength $\lambda_g=1.3$ μm and its thickness is 0.3 μm), and reference numeral 214 designates a carrier blocking layer of n-type InP. Reference numeral 215 designates an undoped active layer ($\lambda_g=1.55$ μm and its thickness is 0.1 μm), and reference numeral 216 designates a second cladding layer of p-type InP. Reference numeral 217 designates a cap layer of $p^+$-InP, reference numeral 218 designates an electrode formed on the substrate 211, and reference numeral 219 designates an electrode formed at the side of the cap layer 217. Reference numeral 221 designates an antireflection layer of $SiO_x$, reference numeral 225 designates a separating groove for achieving a lateral electric separation and reference numeral 226 designates a grating formed partly on the boundary between the light guide layer 213 and the first cladding layer 212 as shown in FIG. 49.

The device is divided into four portions by the separating grooves 225, and they are active regions 222, a phase adjusting region 223 and an optical amplifying region 224, as shown in FIG. 49. In this embodiment, a ridge type structure is used, but any structure such as a buried-type structure can be adopted only if such waveguide structure is able to be employed in the semiconductor laser structure.

FIG. 58 shows a case where the control system of the fourteenth embodiment is applied to the device of the sixteenth embodiment. In FIG. 50, the same members as those in FIG. 40 are designated by the same reference numerals. In FIG. 50, the source 208 portion in FIG. 40 is separated into two sources 320 and 321 which respectively inject currents $I_p$ and Iλ into the active regions 222 and the phase adjusting region 223.

The basic operation of this embodiment is the same as the fourteenth embodiment. Currents injected into the active regions 222 by the source 320 are set so that a DEB-LD portion or tunable filter portion 328 constituted by the two active regions 222 and the phase adjusting region 223 may not oscillate and that those currents $I_p$ are as much as possible. Further, an optical amplifying region 324 is driven in a constant current operative state by the source 207.

In this state, the input signal 204 is input into the waveguide of the tunable filter portion 328, using an appropriate coupling means such as a lens and a lensed optical fiber. If the wavelength of a portion of the input signal light 204 is coincident with the transmission wavelength band of the DFB filter portion 328, only light at such a coincident wavelength enters the optical amplifying portion 324 and is amplified therein to be the amplified output light 206. At this amplification time, carriers are consumed and the both-end voltage of the amplifier portion 324 is changed. The control circuit 203 supplies the control signal to the source 321 based on the detection result of the change in the both-end voltage, and thus the current Iλ injected into the phase adjusting region 223 is controlled so that the transmission wavelength is adjusted.

In FIG. 50, a case where the control system of the fourteenth embodiment is applied to the sixteenth embodiment is shown, but the control system of the fifteenth embodiment can also be applied to this embodiment by reversing the input and output shown in FIG. 50.

Material of InP series is used in the sixteenth embodiment, but other materials such as a GaAs series that can be used for forming the semiconductor laser structure can be used to achieve the function of this embodiment.

Further, optical amplifier device portions in the fourteenth to sixteenth embodiments have gain spectral characteristics which are approximately the same as those of the general amplifying regions of the first embodiment and the like, but their gain spectral characteristics may be those of the wavelength detecting regions. In this case, the scanning of the transmission wavelength of the tunable filter portion is stopped when the transmission wavelength reaches a wavelength that falls within a narrow range of the gain spectrum in the amplifier device portion.

In the fourteenth to sixteenth embodiments, the transmission center wavelength of the band pass filter can be accorded with that of a desired signal light without branching the output light for monitoring.

Such filter devices can naturally be used in the receiver of wavelength-division multiplexing communication systems as described with reference to FIGS. 28 and onward. The amount of light input into the photodetector of the receiver is not reduced, and therefore, the structure of the system can be simplified even if the wavelength multiplicity is increased.

Except as otherwise disclosed herein, the various components shown in outline or in block form in the figure are individually well-known in their internal construction and operation and are not critical either to the making or using of this invention or to a description of the best mode of the invention.

While the present invention has been described with respect to what is presently considered to be the preferred embodiments, it is to be understood that the invention is not limited to the disclosed embodiments. The present invention is intended to cover various modifications and equivalent arrangements included within the sprit and scope of the appended claims.

What is claimed is:

1. A semiconductor optical amplifier device comprising:

a semiconductor laser structure; and a plurality of amplifying regions formed in said semiconductor laser structure and arranged in a light propagation direction, said amplifying regions being electrically separated from each other, wherein at least one of said amplifying regions comprises a first active layer, which has a first gain spectrum over a first wavelength range, and wherein another of said amplifying regions comprises a second active layer having a second gain spectrum over a second wavelength range containing the first wavelength range.

2. A semiconductor optical amplifier device according to claim 1, wherein the second gain spectrum of said second active layer is caused by a predetermined current injection into said second active layer.

3. A semiconductor optical amplifier device according to claim 1, wherein said first active layer comprises an active layer having a quantum well structure.

4. A semiconductor optical amplifier device according to claim 1, wherein said second active layer comprises a bulk crystal, and wherein the second gain spectrum is caused by a predetermined current injection into said second active layer.

5. A semiconductor optical amplifier device according to claim 1, further comprising opposite end surfaces with respect to the light propagation direction and antireflection films deposited on said opposite end surfaces.

6. A semiconductor optical amplifier device according to claim 1, wherein there are arranged two amplifying regions, one of said amplifying regions including said second active layer being disposed at a light input side of said amplifier device and the other of said amplifying regions including said first active layer being disposed at a light output side of said amplifier device.

7. A semiconductor optical amplifier device according to claim 1, wherein there are arranged three amplifying regions, one of said amplifying regions including said first active layer and the other two of said amplifying regions respectively including said second active layers.

8. A semiconductor optical amplifier device according to claim 7, wherein said amplifying region including said first active layer is disposed at a central portion of said amplifier device.

9. A semiconductor optical amplifier device according to claim 1, wherein there are arranged three amplifying regions, two of said amplifying regions respectively including said first active layers, said two first active layers respectively having different band gap energies and the other one of said amplifying regions including said second active layer.

10. A semiconductor optical amplifier device according to claim 9, wherein one of said two amplifying regions that include said first active layer is disposed at a central portion of said amplifier device.

11. A semiconductor optical amplifier device according to claim 1, wherein there are arranged three amplifying regions, one of said amplifying regions including said second active layer and the other two of said amplifying regions respectively including said first active layers.

12. A semiconductor optical amplifier device according to claim 11, wherein said amplifying region that includes said second active layer is disposed at a central portion of said amplifier device.

13. A semiconductor optical amplifier device according to claim 1, wherein there are arranged four amplifying regions, two of said amplifying regions respectively including said first active layers having different energy band gaps and the other two of said amplifying regions respectively including said second active layers.

14. A semiconductor optical amplifier device according to claim 13, wherein said amplifying regions that respectively include said first active layers are disposed at a central portion of said amplifier device.

15. An optical switch device comprising:

a semiconductor optical amplifier device comprising a semiconductor laser structure and three amplifying regions formed in said semiconductor laser structure, which are arranged in a light propagation direction, said amplifying regions being electrically separated from each other, wherein one of said amplifying regions comprises a first active layer, which has a first gain spectrum over a first wavelength range, and the other two amplifying regions respectively comprises second active layers, which are respectively capable of having second gain spectra over second wavelength ranges, which contain the first wavelength range, and wherein said amplifying region that comprises said first active layer is disposed at a central portion of said amplifier device; and control means for controlling a current injected into said amplifying region that comprises said second active layer and that is disposed at a light output side of said amplifier device, wherein the amount of injected current is based on a both-end voltage change which is dependent on wavelength of an input light incident on said amplifier device and occurs in said amplifying region that comprises said first active layer.

16. An optical switch device comprising:

a semiconductor optical amplifier device comprising a semiconductor laser structure and four amplifying regions formed in said semiconductor laser structure, which are arranged in a light propagation direction, said amplifying regions being electrically separated from each other, wherein two of said amplifying regions respectively comprise first active layers, which have different energy band gaps and first gain spectra over first wavelength ranges, and the other two amplifying regions respectively comprise second active layers, which are capable of having second gain spectra over second wavelength ranges containing the first wavelength ranges, and wherein one of said amplifying regions including said second active layers is disposed at a light output side of said amplifier device; and control means for controlling a current injected into said amplifying region that comprises said second active layer and that is disposed at the light output side of said amplifier device, wherein the amount of injected current is based on both-end voltage changes which are dependent on wavelength of an input light incident on said amplifier device and occur in said amplifying regions that comprise said first active layers.

17. A semiconductor optical amplifier device comprising:

a semiconductor laser structure;

a plurality of amplifying regions formed in said semiconductor laser structure and arranged in a light propagation direction, said amplifying regions being electrically separated from each other;

detecting means for detecting a both-end voltage change which occurs in at least one of said amplifying regions at an optical amplification time; and control means for controlling a current injected into at least one other amplifying region so as to control a gain of said at least one other amplifying region, based on the both-end voltage change detected by said detecting means.

18. A semiconductor optical amplifier device according to claim 17, further comprising opposite end surfaces with respect to the light propagation direction and antireflection films deposited on said opposite end surfaces of said amplifier device.

19. A semiconductor optical amplifier device according to claim 17, wherein a gain of said amplifying region whose both-end voltage change is detected is set smaller than a gain of said at least one other amplifying region.

20. A semiconductor optical amplifier device according to claim 19, wherein an injection current density of said amplifying region whose both-end voltage change is detected is made smaller than an injection current density of said at least one other amplifying region so that the gain of said amplifying region whose both-end voltage change is detected is set smaller than the gain of said the other amplifying region.

21. A semiconductor optical amplifier device according to claim 19, wherein said amplifying region whose both-end voltage change is detected and said at least one other amplifying region respectively have active regions which have different band gap energies and the band gap energy of said amplifying region whose both-end voltage change is detected is made larger than the band gap energy of said at least one other amplifying region so that the gain of said amplifying region whose both-end voltage change is detected is made smaller than the gain of said the other amplifying region.

22. A semiconductor optical amplifier device according to claim 17, wherein said amplifying regions are arranged so that an input light enters said amplifying region whose both-end voltage change is detected, after being propagated and amplified in said at least one other amplifying region.

23. A semiconductor optical amplifier device according to claim 22, wherein there are arranged two amplifying regions, wherein said at least one other amplifying region is disposed at a light input side of said amplifier device and said amplifying region whose both-end voltage change is detected is disposed at a light output side of said amplifier device.

24. A semiconductor optical amplifier device according to claim 22, wherein there are arranged three amplifying regions, and said amplifying region whose both-end voltage change is detected is disposed at a central portion of said amplifier device.

25. A semiconductor optical amplifier device according to claim 17, wherein there are arranged three amplifying regions, and two of said amplifying regions respectively comprise amplifying regions whose both-end voltage changes are detected and are disposed at opposite end portions of said amplifier device.

26. A semiconductor optical amplifier device according to claim 17, wherein said semiconductor optical amplifier device is adapted for use in an optical transmitter comprising:

light emitting means for converting an electric signal to an optical signal;

control means for driving said light emitting means based on a signal from terminal equipment to cause said light emitting means to output the optical signal; and said semiconductor optical amplifier device.

27. A semiconductor optical amplifier device according to claim 17, wherein said semiconductor optical amplifier device is adapted for use in an optical receiver comprising:

said semiconductor optical amplifier device;

light detecting means for converting the amplified optical signal to an electric signal; and control means for reproducing the electric signal from said light detecting means to supply a reproduced signal to terminal equipment.

28. An optical amplifying apparatus comprising:

a semiconductor optical amplifier device for amplifying an optical signal, said amplifier device comprising a semiconductor laser structure, a plurality of amplifying regions formed in said semiconductor laser structure and arranged in a light propagation direction, said amplifying regions being electrically separated from each other, detecting means for detecting a both-end voltage change, which occurs in at least one of said amplifying regions at an optical amplification time and control means for controlling a current injected into at least one other amplifying region so as to control a gain of said at least one other amplifying region, based on the both-end voltage change detected by said detecting means; and a lensed fiber for performing input and output coupling to said amplifier device.

29. A semiconductor optical amplifier device according to claim 17, wherein said semiconductor optical amplifier device is adapted for use in a uni-directional optical communication system comprising:

(a) a transmission line; and (b) an optical transmitter comprising:

light emitting means for converting an electric signal to an optical signal for transmission to said transmission line;

control means for driving said light emitting means based on a signal from terminal equipment to cause said light emitting means to output the optical signal; and said semiconductor optical amplifier device.

30. A semiconductor optical amplifier device according to claim 17, wherein said semiconductor optical amplifier device is adapted for use in a uni-directional optical communication system comprising:

(a) a transmission line; and (b) an optical receiver comprising:

said semiconductor optical amplifier device;

light detecting means for converting the amplified optical signal to an electric signal; and control means for reproducing the electric signal from said light detecting means to supply a reproduced signal to terminal equipment.

31. A semiconductor optical amplifier device according to claim 17, wherein said semiconductor optical amplifier device is adapted for use in a uni-directional optical communication system comprising:
(a) a transmission line; and
(b) an optical amplifying apparatus comprising:
said semiconductor optical amplifier device; and
a lensed fiber for performing input and output coupling between said transmission line and said amplifier device.

32. A semiconductor optical amplifier device according to claim 17, wherein said semiconductor optical amplifier device is adapted for use in an optical transceiver comprising:
(a) light emitting means for emitting an optical signal based on an electric signal;
(b) a first of said semiconductor optical amplifier device for amplifying the optical signal from said light emitting means;
(c) light detecting means for converting an optical signal to an electric signal;
(d) a second of said semiconductor optical amplifier device for amplifying the optical signal for inputting into said light detecting means;
(e) light branching-combining means disposed between said first and second optical amplifier devices; and
(f) driving control means for driving said light emitting means based on a signal from terminal equipment to cause said light emitting means to output the optical signal and for reproducing the electric signal from said light detecting means to supply a reproduced signal to the terminal equipment.

33. A semiconductor optical amplifier device according to claim 17, wherein said semiconductor optical amplifier device is adapted for use in a bi-directional optical communication system comprising:
(a) a transmission line; and
(b) an optical amplifying apparatus comprising:
said semiconductor amplifier device; and
a lensed fiber for performing input and output coupling between said transmission line and said amplifier device.

34. A semiconductor optical amplifier device according to claim 17, wherein said semiconductor optical amplifier device is adapted for use in a bi-directional optical communication system comprising:
(1) a transmission line; and
(2) an optical transceiver for transmitting and receiving an optical signal to and from said transmission line, said transceiver comprising:
(a) light emitting means for emitting an optical signal based on an electric signal;
(b) a first of said semiconductor optical amplifier device for amplifying the optical signal from said light emitting means;
(c) light detecting means for converting an optical signal to an electric signal;
(d) a second of said semiconductor optical amplifier device for amplifying the optical signal for inputting into said light detecting means;
(e) light branching-combining means disposed between said first and second optical amplifier devices; and
(f) driving control means for driving said light emitting means based on a signal from terminal equipment to cause said light emitting means to output the optical signal and for reproducing the electric signal from said light detecting means to supply a reproduced signal to the terminal equipment.

35. A semiconductor optical amplifier device according to claim 17, wherein said semiconductor optical amplifier device is adapted for use in a uni-directional wavelength division multiplexing optical communication system comprising:
(a) a transmission line; and
(b) a plurality of optical transmitters, each comprising:
light emitting means for converting an electric signal to an optical signal for transmission to said transmission line;
control means for driving said light emitting means based on a signal from terminal equipment to cause said light emitting means to output the optical signal; and
said semiconductor optical amplifier device.

36. A semiconductor optical amplifier device according to claim 17, wherein said semiconductor optical amplifier device is adapted for use in a uni-directional wavelength division multiplexing optical communication system comprising:
(a) a transmission line; and
(b) an optical receiver comprising:
said semiconductor optical amplifier device;
light detecting means for converting the amplified optical signal to an electric signal; and
control means for reproducing the electric signal from said light detecting means to supply a reproduced signal to terminal equipment.

37. A semiconductor optical amplifier device according to claim 17, wherein said semiconductor optical amplifier device is adapted for use in a uni-directional wavelength division multiplexing optical communication system comprising:
(a) a transmission line; and
(b) an optical amplifying apparatus comprising:
said semiconductor optical amplifier device; and
a lensed fiber for performing input and output coupling between said transmission line and said amplifier device.

38. A semiconductor optical amplifier device according to claim 17, wherein said semiconductor optical amplifier device is adapted for use in a loop type optical local area network comprising:
(a) a transmission line; and
(b) an optical amplifying apparatus comprising:
said semiconductor optical amplifier device; and
a lensed fiber for performing input and output coupling between said transmission line and said amplifier device.

39. A semiconductor optical amplifier device according to claim 17, wherein said semiconductor optical amplifier device is adapted for use in a passive bus type optical local area network comprising:
(a) a transmission line; and
(b) an optical amplifying apparatus comprising:
said semiconductor optical amplifier device; and
a lensed fiber for performing input and output coupling between said transmission line and said amplifier device.

40. A semiconductor optical amplifier device according to claim 17, wherein said semiconductor optical amplifier device is adapted for use in a passive bus type optical local area network comprising:

(1) a transmission line; and (2) an optical transceiver for transmitting and receiving an optical signal to and from said transmission line, said transceiver comprising:

(a) light emitting means for emitting an optical signal based on an electric signal;

(b) a first of said semiconductor optical amplifier device for amplifying the optical signal from said light emitting means;

(c) light detecting means for converting an optical signal to an electric signal;

(d) a second of said semiconductor optical amplifier device for amplifying the optical signal to be input into said light detecting means;

(e) light branching-combining means disposed between said first and second optical amplifier devices; and (f) driving control means for driving said light emitting means based on a signal from terminal equipment to cause said light emitting means to output the optical signal and for reproducing the electric signal from said light detecting means to supply a reproduced signal to the terminal equipment.

41. A semiconductor optical amplifier device according to claim 17, wherein said semiconductor optical amplifier device is adapted for use in a loss-compensation type light branching-combining apparatus comprising:

a light branching-combining device having a plurality of input-output ports; and said semiconductor optical amplifier device connected to at least one of said input-output ports of said branching-combining device.

42. An optical amplifying apparatus comprising:

(a) a semiconductor optical amplifier device comprising:
a semiconductor laser structure; and three amplifying regions formed in said semiconductor laser structure and arranged in a light propagation direction, said amplifying regions being electrically separated from each other;

detecting means for detecting both-end voltage changes, which occur in two of said amplifying regions respectively disposed at both opposite end portions of said amplifier device at an optical amplification time; and control means for controlling a current injected into the other amplifying region so as to control a gain of said other amplifying region, based on the both-end voltage changes detected by said detecting means;

(b) light transmission means for carrying an optical signal;

(c) coupling means for coupling said light transmission means to said amplifier device; and (d) controlling means for supplying a signal for changing a coupling efficiency of said coupling means to said optical amplifier, based on the both-end voltage changes input from said amplifier device.

43. An optical amplifying apparatus according to claim 42, wherein said coupling means comprises a lensed optical fiber.

44. An optical amplifying apparatus according to claim 43, further comprising three-axis adjusting means for supporting said lensed optical fiber adjustably with respect to three directions and wherein said three-axis adjusting means changes the coupling efficiency based on the signal from said controlling means.

45. A semiconductor optical amplifier device comprising:

a semiconductor laser structure;

a plurality of amplifying regions formed in said semiconductor laser structure and arranged in a light propagation direction, said amplifying regions being electrically separated from each other, wherein at least one of said amplifying regions comprises a first active layer, which has a first gain spectrum over a first wavelength range, and wherein another of said amplifying regions comprises a second active layer having a second gain spectrum over a second wavelength range containing the first wavelength range; and detecting means for detecting change of both-end voltage in said at least one of amplifying regions including said first active layer.

46. A semiconductor optical amplifier device according to claim 45, wherein the second gain spectrum of said second active layer is caused by a predetermined current injection into said second active layer.

47. A semiconductor optical amplifier device according to claim 45, wherein said first active layer comprises an active layer having a quantum well structure.

48. A semiconductor optical amplifier device according to claim 45, wherein said second active layer comprises a bulk crystal, and wherein the second gain spectrum is caused by a predetermined current injection into said second active layer.

49. A semiconductor optical amplifier device according to claim 45, further comprising opposite end surfaces with respect to the light propagation direction and antireflection films deposited on said opposite end surfaces.

50. A semiconductor optical amplifier device according to claim 45, wherein there are arranged two amplifying regions, one of said amplifying regions including said second active layer being disposed at a light input side of said amplifier device and the other of said amplifying regions including said first active layer being disposed at a light output side of said amplifier device.

51. A semiconductor optical amplifier device according to claim 45, wherein there are arranged three amplifying regions, one of said amplifying regions including said first active layer and the other two of said amplifying regions respectively including said second active layer.

52. A semiconductor optical amplifier device according to claim 51, wherein said amplifying region including said first active layer is disposed at a central portion of said amplifier device.

53. A semiconductor optical amplifier device according to claim 45, wherein there are arranged three amplifying regions, two of said amplifying regions respectively including said first active layer, said two first active layers respectively having different band gap energies and the other one of said amplifying regions including said second active layer.

54. A semiconductor optical amplifier device according to claim 53, wherein one of said two amplifying regions that include said first active layer is disposed at a central portion of said amplifier device.

55. A semiconductor optical amplifier device according to claim 45, wherein there are arranged three amplifying regions, one of said amplifying regions including said second active layer and the other two of said amplifying regions respectively including said first active layer.

56. A semiconductor optical amplifier device according to claim 55, wherein said amplifying region that includes said second active layer is disposed at a central portion of said amplifier device.

57. A semiconductor optical amplifier device according to claim 45, wherein there are arranged four amplifying regions, two of said amplifying regions respectively including said first active layers having different energy band gaps and the other two of said amplifying regions respectively including said second active layer.

58. A semiconductor optical amplifier device according to claim 57, wherein said amplifying regions that respectively include said first active layers are disposed at a central portion of said amplifier device.

59. A method of controlling gain in a semiconductor optical amplifier comprising, a semiconductor laser structure, and a plurality of amplifying regions formed in said semiconductor laser structure and arranged in a light propagation direction, said amplifying regions being electrically separated from each other, said method comprising the steps of:

a step for detecting a both-end voltage change which occurs in at least one of said amplifying regions at an optical amplification time; and a step for controlling a gain of said at least one other amplifying region by controlling a current injected into at least one other amplifying region, based on the both-end voltage change detected by said detecting step.

* * * * *

UNITED STATES PATENT AND TRADEMARK OFFICE
CERTIFICATE OF CORRECTION

PATENT NO. : 5,521,754
DATED : May 28, 1996
INVENTOR(S) : Nitta et al.

It is certified that error appears in the above-indentified patent and that said Letters Patent is hereby corrected as shown below:

TITLE PAGE
[56] References Cited:

OTHER PUBLICATIONS

In "Katsuaki Magari, ... etc.", "Hitshi Kawaguchi," should read --Hitoshi Kawaguchi,--.

COLUMN 1:

Line 53, "light" should read --light,--.
Line 56, "circuit." should read --circuit,--; and
Line 57, "source" should read --source,--.

COLUMN 5:

Line 6, "direction" should read --direction,--.

COLUMN 6:

Line 14, "round-tip" should read --lensed--;
Line 36, "signal" (second occurrence) should read --signal,--; and
Line 40, "light," should read --light--.

COLUMN 7:

Line 15, "loop type" should read --loop-type--.

UNITED STATES PATENT AND TRADEMARK OFFICE
CERTIFICATE OF CORRECTION

PATENT NO. : 5,521,754

DATED : May 28, 1996

INVENTOR(S) : Nitta et al.

It is certified that error appears in the above-indentified patent and that said Letters Patent is hereby corrected as shown below:

COLUMN 13:

Line 60, "For" should read --for--.

COLUMN 14:

Line 43, "it" should read --It--; and
Line 56, "region III" should read --region II--.

COLUMN 16:

Line 10, "layering-thin" should read --layering thin--; and
Line 63, "source 59," should read --source 50,--.

COLUMN 17:

Line 6, "From" should read --from--.

COLUMN 18:

Line 21, "$I_{D1}43$" should read --$I_{D1}143$--; and
Line 64, "When" should read --Then--.

COLUMN 20:

Line 40, "1.5 82m" should read --1.5 $\mu$m,--.

COLUMN 24:

Line 9, "Filter" should read --filter--; and
Line 33, "loop type" should read --loop-type--;

UNITED STATES PATENT AND TRADEMARK OFFICE
CERTIFICATE OF CORRECTION

PATENT NO. : 5,521,754
DATED : May 28, 1996
INVENTOR(S) : Nitta et al.

It is certified that error appears in the above-indentified patent and that said Letters Patent is hereby corrected as shown below:

COLUMN 24:

Line 42, "embodiment)," should read --embodiment).--; and
Line 44, "loop type" should read --loop-type--.

COLUMN 27:

Line 23, "property" should read --properly--.

COLUMN 29:

Line 10, "266." should read --206.--.

COLUMN 30:

Line 20, "DEB-LD" should read --DFB-LD--.

Signed and Sealed this

First Day of October, 1996

Attest:

BRUCE LEHMAN

*Attesting Officer*  *Commissioner of Patents and Trademarks*